United States Patent
Aoki et al.

(10) Patent No.: US 9,431,491 B2
(45) Date of Patent: Aug. 30, 2016

(54) SEMICONDUCTOR DEVICE AND METHOD OF MANUFACTURING THE SAME

(71) Applicant: Renesas Electronics Corporation, Kawasaki-shi (JP)

(72) Inventors: Takashi Aoki, Kawasaki (JP); Takahiro Korenari, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/282,863

(22) Filed: May 20, 2014

(65) Prior Publication Data

US 2014/0367770 A1 Dec. 18, 2014

(30) Foreign Application Priority Data

Jun. 13, 2013 (JP) .................................. 2013-124656

(51) Int. Cl.

| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/417 | (2006.01) |
| H01L 29/66 | (2006.01) |
| H01L 29/78 | (2006.01) |
| H01L 23/482 | (2006.01) |
| H01L 29/423 | (2006.01) |
| H01L 29/06 | (2006.01) |
| H01L 29/10 | (2006.01) |

(52) U.S. Cl.
CPC ..... *H01L 29/41741* (2013.01); *H01L 23/4824* (2013.01); *H01L 29/66727* (2013.01); *H01L 29/66734* (2013.01); *H01L 29/7809* (2013.01); *H01L 29/7811* (2013.01); *H01L 29/7813* (2013.01); *H01L 29/0638* (2013.01); *H01L 29/1095* (2013.01); *H01L 29/41766* (2013.01); *H01L 29/42372* (2013.01); *H01L 2224/0401* (2013.01); *H01L 2224/11* (2013.01); *H01L 2224/1134* (2013.01); *H01L 2224/131* (2013.01); *H01L 2924/13055* (2013.01)

(58) Field of Classification Search
CPC ............ H01L 29/66666; H01L 29/7827; H01L 29/41741; H01L 29/41766; H01L 29/42372; H01L 29/66727; H01L 29/66734; H01L 29/7809; H01L 29/7811; H01L 29/7813; H01L 29/0638; H01L 29/1095; H01L 23/4824; H01L 2224/131; H01L 2224/1134; H01L 2224/0401; H01L 2224/11
USPC ................ 257/329, 302, 330, 328, 135, 60, 257/E29.262, E21.41, E27.096, E29.274
See application file for complete search history.

(56) References Cited

U.S. PATENT DOCUMENTS

| | | | |
|---|---|---|---|
| 6,653,740 B2 | 11/2003 | Kinzer et al. | |
| 7,893,489 B2 | 2/2011 | Kobayashi | |
| 2010/0163988 A1* | 7/2010 | Chow ............... | H01L 29/41766 257/342 |

FOREIGN PATENT DOCUMENTS

| | | |
|---|---|---|
| JP | 2002-353452 A | 12/2002 |
| JP | 4646284 B2 | 3/2011 |
| JP | 5132977 B2 | 1/2013 |

*Primary Examiner* — Thien F Tran
(74) *Attorney, Agent, or Firm* — McGinn IP Law Group, PLLC

(57) ABSTRACT

A semiconductor device including an active cell region formed over the surface of a silicon substrate and including a vertical MOSFET, a drain electrode formed over the surface of the silicon substrate and leading out the drain of the vertical MOSFET from the back surface of the silicon substrate, an external drain terminal formed over the drain electrode, and a source electrode formed over the active cell region so as to be opposed to the drain electrode at least along three sides at the periphery of the external drain terminal over the active cell region and connected to the source of the vertical MOSFET.

15 Claims, 39 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2013-124656 filed on Jun. 13, 2013 including the specification, drawings, and abstract is incorporated herein by reference in its entirety.

BACKGROUND

The present invention relates to a semiconductor device and a method of manufacturing the same and it can be utilized suitably to a semiconductor device having a vertical transistor and a method of manufacturing the same.

For power devices, for example, a power MOSFET (Metal Oxide Semiconductor Field Effect Transistor) used as a power switch for large current and high voltage, a vertical MOSFET is generally used. In the vertical MOSFET, a source electrode and a gate electrode are formed on one side (surface) and a drain electrode is formed on the other side (back surface) of a semiconductor substrate in which a drain current flows in the vertical direction of the semiconductor substrate.

In the power MOSFET, resistance during operation (on-resistance) should be as low as possible in order to suppress power consumption. Therefore, a vertical MOSFET in which the on-resistance per unit area is reduced has been developed by forming a gate electrode in a trench and forming a channel region in the vertical direction, thereby narrowing the distance between the gate electrodes to each other and increasing the density.

Further, in recent years, there have been appeared chip size packages of a surface drain terminal type in which respective terminals of a source, a gate, and a drain of a vertical MOSFET are formed on one side (surface) of a semiconductor substrate. Semiconductor devices of such CSP structure are disclosed, for example, in Japanese Unexamined Patent Application Publication No. 2002-353452, and Japanese Patent Nos. 5132977 and 4646284.

SUMMARY

As described above, since the drain terminal is formed on the side of the surface of the semiconductor substrate in the semiconductor device of the CSP structure, it has a structure of drawing a drain potential on the back surface of the semiconductor substrate to the surface. Accordingly, the on-resistance Rds (on) between the drain and the source includes a resistance of an active cell region forming the MOSFET (source region resistance), with addition of a resistance of a drain lead-out region for lead out the drain (drain region resistance) and, further, a resistance component in the lateral direction of the semiconductor substrate from the active cell region to the drain leading out region.

Accordingly, existent semiconductor devices involve a problem that the on-resistance is increased due to the structure of lead out the drain to the surface of the semiconductor substrate.

Other subjects and novel features will become apparent by reading the description of the present specification in conjunction with the accompanying drawings.

According to an aspect of the present invention, the semiconductor device comprises an active cell region, a drain electrode, an external drain terminal, and a source electrode. The active cell region is formed over the surface of the semiconductor substrate and includes a vertical transistor. The drain region is formed over the surface of the semiconductor substrate and leads out the drain from the back surface of the semiconductor substrate. An external drain terminal is formed over the drain electrode. The source electrode is formed so as to oppose the drain electrode at least along three sides of the periphery of the external drain terminal over the active cell region and connected to the source of the vertical transistor.

According to the aspect of the present invention, increase of the on-resistance in the semiconductor device may be suppressed.

DETAILED DESCRIPTION

First Embodiment

This embodiment is to be described with reference to the drawings. This embodiment is an example of a semiconductor device having a pad layout of two rows×three columns (layout of external terminals).

Figure 1:
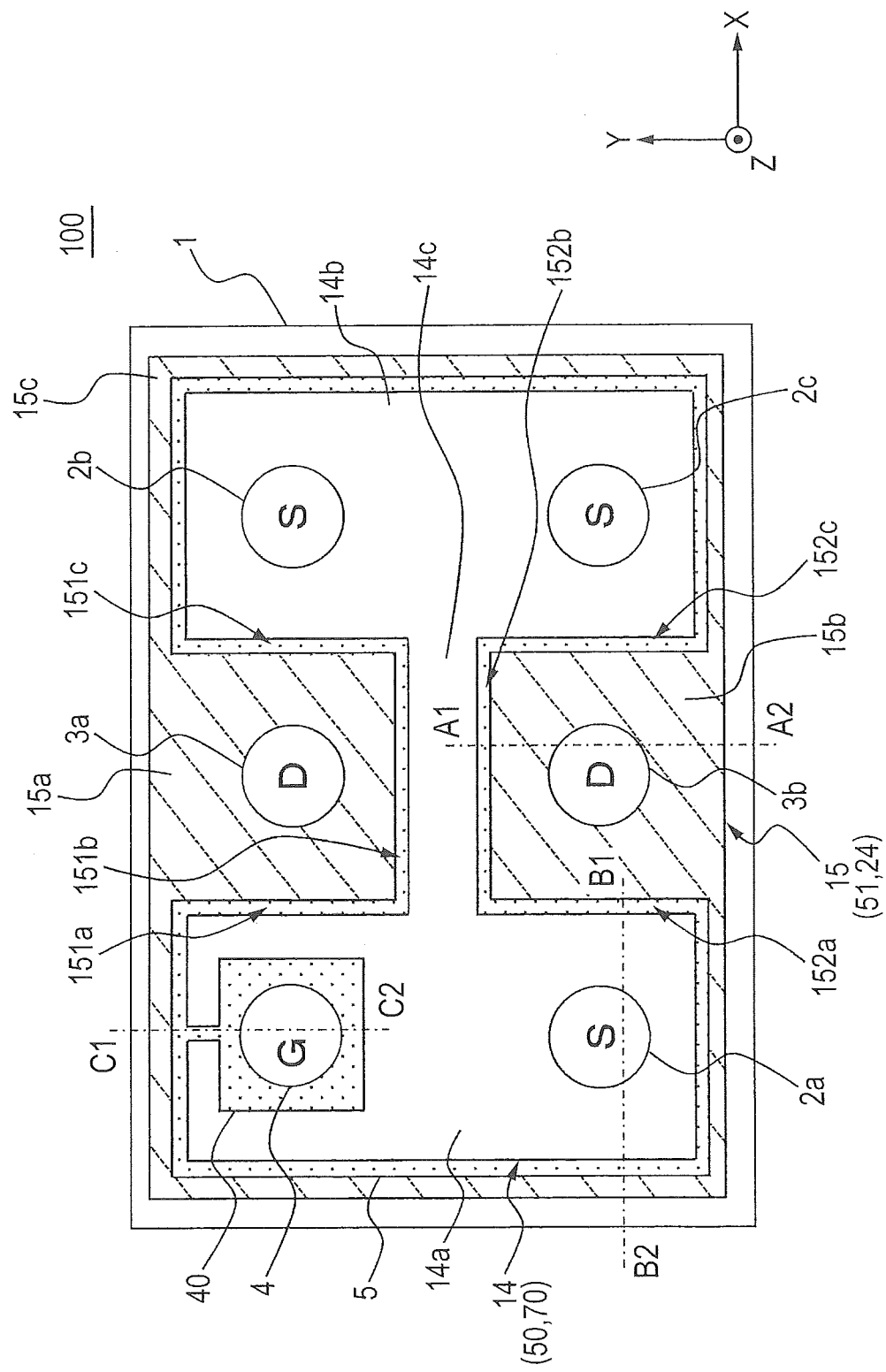
FIG. 1 is a plan view illustrating a configurational example of a semiconductor device according to a first embodiment.

FIG. 1 is a plan view of a semiconductor device 100 according to this embodiment. The semiconductor device 100 has a CSP structure comprising one chip of a rectangular shape in a plan view, which is a vertical MOSFET.

As illustrated in FIG. 1, six external terminals are formed over the surface (main surface) of a silicon substrate (semiconductor substrate) 1. The external terminals are disposed as a pad layout in a matrix of row direction (direction X)×column direction (direction Y). FIG. 1 shows an example of a pad layout of n rows×m columns=two rows× three columns. FIG. 1 is drawn so as to visualize electrodes below the external terminal.

In this example, the semiconductor device 100 has three external source terminals (source pads) 2a to 2c (each of them is also referred to as an external source terminal 2), two external drain terminals (drain pads) 3a and 3b (each of them is also referred to as an external drain terminal 3), and one external gate electrode terminal (gate pad) 4. The external terminal including the external source terminal 2, the external drain terminal 3, and the external gate terminal 4 is, for example, a substantially circular terminal in an upper plan view formed of a solder ball or the like and may be of any other optional shape such as a rectangular shape.

External source terminals 2a to 2c and an external gate terminal 4 are disposed at four corners over the surface of the silicon substrate 1, and external drain terminals 3a and 3b are disposed in the central area over the surface of the silicon substrate. Specifically, in the pad layout as viewed in the direction X (direction of row, right to left direction in FIG. 1), the external gate terminal 4, the external drain terminal 3a, and the external source terminal 2b are disposed in this order along the first row, and the external source terminal 2a, the external drain terminal 3b, and the external source terminal 2c are disposed in this order along the second row.

Further, in the pad layout as viewed in the direction Y (direction of column, vertical direction in FIG. 1), the external gate terminal 4 and the external source terminal 2a are disposed in this order along the first column, the external drain terminals 3a and 3b are disposed in this order along the second column, and the external source terminals 2b and 2c are disposed in this order along the third column.

That is, they are disposed such that the column for the external source terminals 2 and the column for the external drain terminals 3 are disposed alternately, so as to be adjacent to each other, and the column for the external drain terminals 3a and 3b is disposed being interposed between the column of the external gate terminal 4 and the external source terminal 2a and the column of the external source terminals 2b and 2c.

Figure 2:
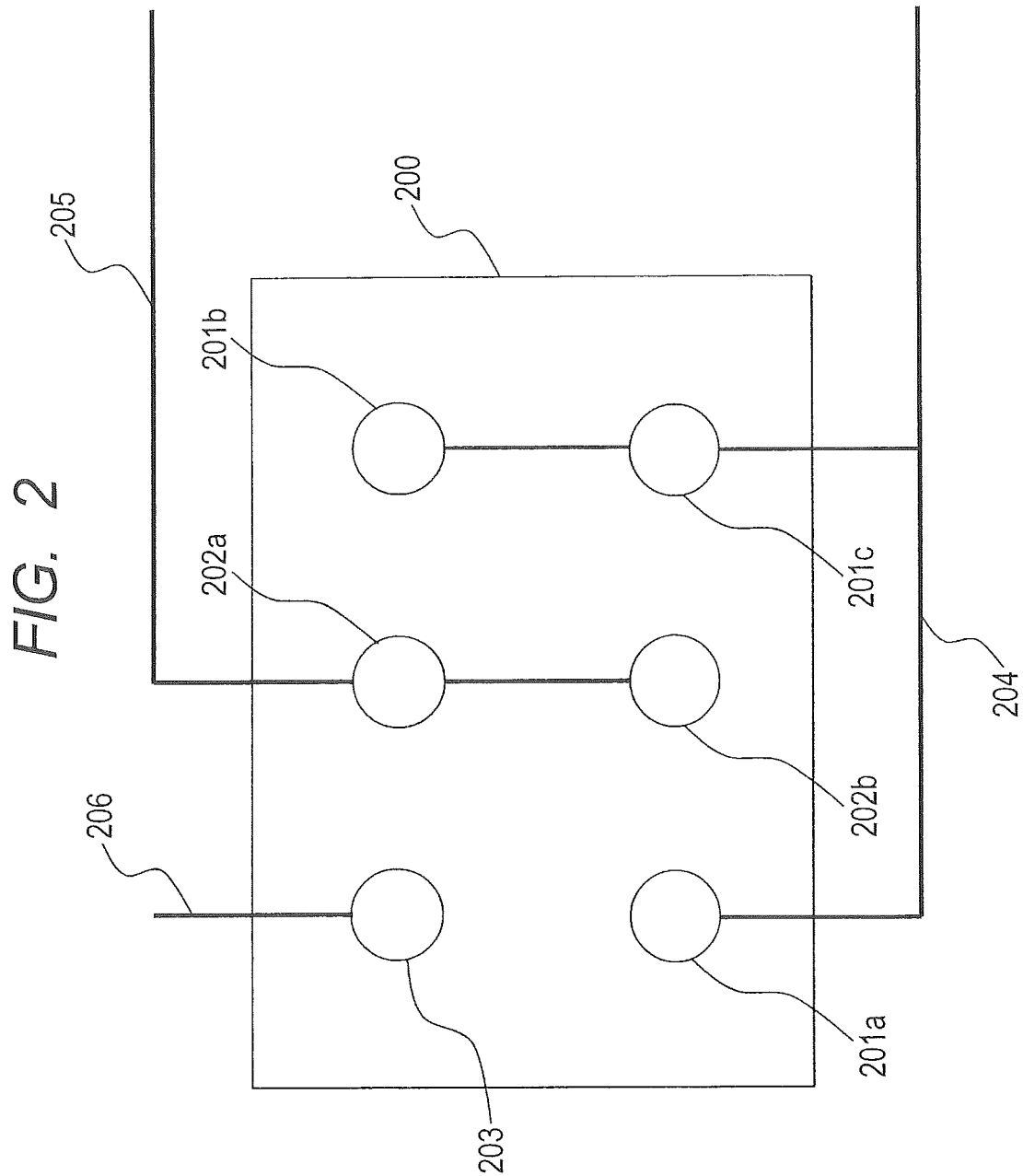
FIG. 2 is a view illustrating an example of interconnects in a mounting substrate for mounting the semiconductor device according to the first embodiment.

When the semiconductor device 100 described above is mounted to a mounting substrate, an interconnection example is formed on the side of the mounting substrate as shown in FIG. 2. As shown in FIG. 2, mounting terminals are formed to the mounting substrate 200 conforming to the positions for the external source terminal 2, the external drain terminal 3, and the external gate terminal 4 of the semiconductor device 100 and an interconnect is connected to each of the mounting terminals.

Mounting terminals 201a to 201c are formed respectively at the positions corresponding to the external source terminals 2a to 2c, and a source interconnect 204 is connected in common with the mounting terminals 201a to 201c. For example, the external source terminals 2a to 2c and mounting terminals 201a to 201c are solder-bonded upon mounting, and the external source terminals 2a to 2c and the mounting terminals 201a to 201c are electrically connected respectively. Then, a source potential is supplied from the source interconnect 204 by way of the mounting terminals 201a to 201c to all of the external source terminals in 2a to 2c.

Mounting terminals 202a and 202b are formed at positions corresponding to the external drain terminals 3a and 3b, respectively, and a drain interconnect 205 is connected in common with the mounting terminals 202a and 202b. For example, the external drain terminals 3a and 3b and the mounting terminals 202a and 202b are solder-bonded and the external drain terminals 3a and 3b and the mounting terminals 202a and 202b are electrically connected respectively upon mounting. Then, a drain potential is applied from the drain interconnect 205 by way of the mounting terminals 202a and 202b to both of the external drain terminals 3a and 3b.

A mounting terminal 203 is formed at a position corresponding to the external gate terminal 4, and a gate interconnect 206 is connected to the mounting terminal 203. For example, the external gate terminal 4 and the mounting terminal 203 are solder-bonded and the external gate terminal 4 and the mounting terminal 203 are connected electrically upon mounting. A gate potential is supplied from the gate interconnect 206 by way of the mounting terminal 203 to the external gate terminal 4. A MOSFET of the semiconductor device 100 turns on in accordance with the gate potential supplied from the interconnect 206 to the external gate terminal 4, and a current flows between the interconnect 204 connected in common with the external source terminals 2a to 2c and the interconnect 205 connected in common with the external drain terminals 3a and 3b.

As described above in this embodiment, since a column of the external drain terminals is disposed between the columns of the external source terminals, and the column of the external source terminals and the column of the external drain terminal are disposed alternately, interconnects of the mounting substrate can also be simplified in the configuration.

Further, the configuration of the semiconductor device 100 in FIG. 1 is to be described. A source electrode (source aluminum) 14, a drain electrode (drain aluminum) 15, and a gate interconnect 5 and a gate pad 40 (gate aluminum) are formed below the external source terminals 2a and 2c, the external drain terminals 3a and 3b, and the external gate terminal 4.

The source electrode 14 is formed below each of the external source terminals 2 and connected electrically with each of the external source terminals 2. An active cell region (device region) 70 is formed below the source electrode substantially over the entire region as will be described later. A region including one or both of the source electrode 14 and the active cell region is referred to as a source cell region 50. The source cell region 50 is a region that supplies a source potential from the source electrode 14 and forms a MOSFET by the active cell region 70. That is, the entire source electrode 14 over the silicon substrate 1 is the source cell region 50 and the entire of the active cell region 70 inside the silicon substrate 1 is also the source cell region 50.

Plural active cells (transistor cells) such as MOSFET are formed in the active cell region 70. The active cell may comprise also MISFET (Metal Insulator Semiconductor Field Effect Transistor) or IGBT (Insulated Gate Bipolar Transistor) in addition to MOSFET.

The source electrode 14 is electrically connected with a source diffusion region of the active cell region 70. A source potential is supplied from the external source terminal 2 by way of the source electrode 14 to the source diffusion region of the active cell region 70.

In this example, the source electrode 14 comprises a rectangular source electrode portion 14a that extends from four peripheral sides of the external gate terminal 4 (pad position in first row, first column) to the periphery of the external source terminal 2a (pad position in second row, second column), a rectangular source electrode portion 14b that extends from the periphery of the external source terminal 2b (pad position in first row, third column) to the periphery of the external source terminal 2c (pad position in second row, third column), and a rectangular source electrode portion 14c between the external drain terminal 3a (pad position in first row, second column) and the external drain terminal 3b (pad position in second row, second column).

The source electrode portion 14c is formed from the central portion of the source electrode portion 14a to the central portion of the source electrode portion 14b. The source electrode portions 14a to 14c are formed integrally and connected electrically. The region for the source electrode portions 14a to 14c is an active cell region 70 and also a source cell region 50. In this embodiment, the source electrode 14, the source cell region 50, and the active cell region 70 are substantially identical with each other in an upper plan view, that is, substantially identical for the position, the shape, and the area. The relation is identical also in other examples of the semiconductor device to be described later.

The gate pad 40 is formed below the external gate terminal 4 and electrically connected with the external gate terminal 4. In this example, the gate pad 40 is formed substantially in a square shape at the periphery of the external gate electrode 4 (pad position in first row, first column). The gate pad 40 is surrounded at the periphery of the external gate terminal 4 by the source electrode 14 (source cell region 50 or active cell region 70).

The gate interconnect (gate finger) 5 is formed in a peripheral region so as to surround the source electrode 14. That is, the gate interconnect 5 is formed in a linear configuration along the entire outer periphery of the source electrode portions 14a to 14c. It can also be said that the gate interconnect 5 is formed so as to surround the active cell region 70 or the source cell region 50.

The gate interconnect 5 is electrically connected with the gate pad 40 near the gate pad 40. For example, in the active cell region 70, plural gate electrodes (gate trenches) are formed and extended in a stripe configuration in the direction X, and the gate interconnect 5 is electrically connected with the gate electrode. A gate potential is supplied from the external gate terminal 4 by way of the gate pad 40 and the gate connect 5 to the gate electrode of the active cell.

It can also be said that the gate interconnect 5 is formed along the boundary between the source electrode 14 and the drain electrode 15. When the gate interconnect 5 is formed along the outer periphery of the source electrode 14 (active cell region 70), the gate electrode can be supplied from one external gate terminal 4 to all of MOSFETs in the active cell region 70.

The drain electrode 15 is formed below each of the external drain terminals 3 and electrically connected with each of the external drain terminals 3. A drain contact region 24 is formed substantially over the entire region below the drain electrode 15 as will be described later. A region including one or both of the drain electrode 15 and the drain contact region is referred to as a drain lead-out region 51.

The drain lead-out region 51 is a region that supplies a drain potential by the drain electrode 15 and leads out the drain from the back surface to the surface of the silicon substrate 1 by the drain contact region 24. That is, the entirety of the drain electrode 15 over the silicon substrate 1 is a drain lead-out region 51 and also the entirety of the drain contact region 24 inside the silicon substrate 1 is the drain lead-out region 51.

The drain electrode 15 is electrically connected with the drain contact region. A drain potential is supplied from the external drain terminal 3 by way of the drain electrode 15 and the drain contact region to the drain of the active cell.

The drain electrode 15 is formed from the outside of the gate interconnect 5 as far as the outer peripheral end of the silicon substrate 1 (semiconductor device). In this example, the drain electrode 15 comprises a substantially square drain electrode portion 15a at the periphery of the external drain terminal 3a (pad position in first row, second column), a substantially square drain electrode portion 15b at the periphery of the external drain terminal 3b (pad position in second row, second column), and an annular EQR (Equipotential ring) electrode 15c at the outer peripheral end of the silicon substrate 1.

The EQR electrode is an electrode for keeping the drain potential at an equal level. The drain electrode portion 15a and the drain electrode portion 15b are isolated (separated) by way of a source electrode portion 14c. The drain electrode portion 15a and the drain electrode portion 15b are formed integrally by way of the EQR electrode 15c at the outer terminal end and connected electrically.

The drain electrode portions 15a and 15b excluding the EQR electrode 15c are sometimes referred to also as the drain electrode 15. For example, the drain electrode 15 comprises the drain electrode portion 15a and the drain electrode portion 15b, and it can be said that the drain electrodes 15 are connected by way of the EQR electrode 15c. Particularly, the region for the drain electrode portions 15a and 15b excluding the EQR electrode 15c is a drain contact region 24 and is also s drain lead-out region 51. In this embodiment, the drain electrode 15 (excluding the EQR electrode 15c), the drain lead-out region 51 and the drain contact region 24 are substantially identical in an upper plan view, that is, they are substantially identical in terms of the position, the shape, and the area and the relation is applicable also to other examples of the semiconductor device to be described later.

Figure 3:
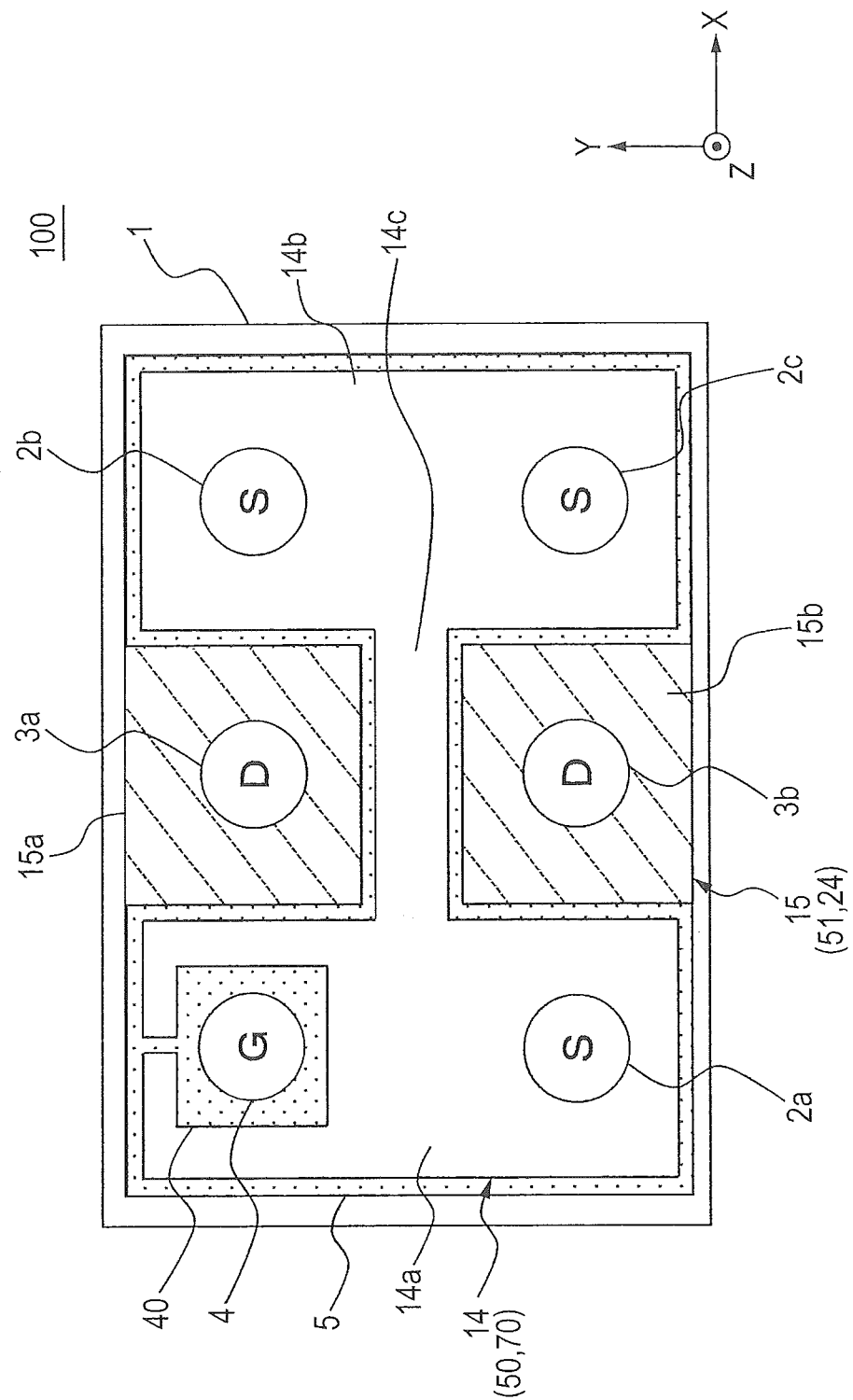
FIG. 3 is a plan view illustrating a planar configurational example of the semiconductor device according to the first embodiment.

In the example of FIG. 1, the EQR electrode is formed for keeping the drain potential constant but the EQR electrode may not be formed as illustrated in FIG. 3. In this case, the drain electrode 15 comprises the drain electrode portion 15a and the drain electrode portion 15b, and the drain electrode portion 15a and the drain electrode portion 15b are not connected. Also in other examples of the semiconductor device to be described later, the EQR electrode may not be formed in the same manner.

In this embodiment, as illustrated in FIG. 1, the drain electrode 15 below the external drain terminal 3 (drain lead-out region 51 or drain contact region 24) is formed being opposed to the source electrode 14 (source cell region 50 or active cell region 70) at least by way of three sides in an upper plan view.

The drain electrode portion 15a is surrounded by opposing sides 151a and 151c that extend from the end of the semiconductor device to the central portion of the semiconductor device in the direction Y, and an opposing side 151b that extends from the end of the opposing side 151a to the end of the opposing side 151c in the direction X on the central portion of the semiconductor device. The drain electrode portion 15a and the source electrode 14 (14a, 14b, 14c) are opposed each other by way of the opposing sides 151a to 151c at the periphery of the external drain terminal 3a. It can also be said that the source electrodes 14 (14a, 14b, 14c) surround the drain electrode portion 15a at the periphery of the external drain terminal 3a.

In the same manner, the drain electrode portion 15b is surrounded by opposing sides 152a and 152c that extend from the end of the semiconductor device to the central portion of the semiconductor device in the direction Y, and an opposing side 152b that extends in the direction X from the end of the opposing side 152b to the end of the opposing side 152c in the central portion of the semiconductor device. The drain electrode portion 15b and the source electrode 14 (14a, 14b, 14c) are opposed each other by way of the opposing sides 152a to 152c at the periphery of the external drain terminal 3b. It can also be said that the source electrodes 14 (14a, 14b, 14c) surround the drain electrode portion 15b at the periphery of the external drain terminal 3b.

In the embodiment of FIG. 1, it can be also said that each one of the external drain terminals 3 (3a, 3b) is disposed over the drain electrode 15 (15a, 15b) separated by the source electrode 14 (14c).

Figure 4:
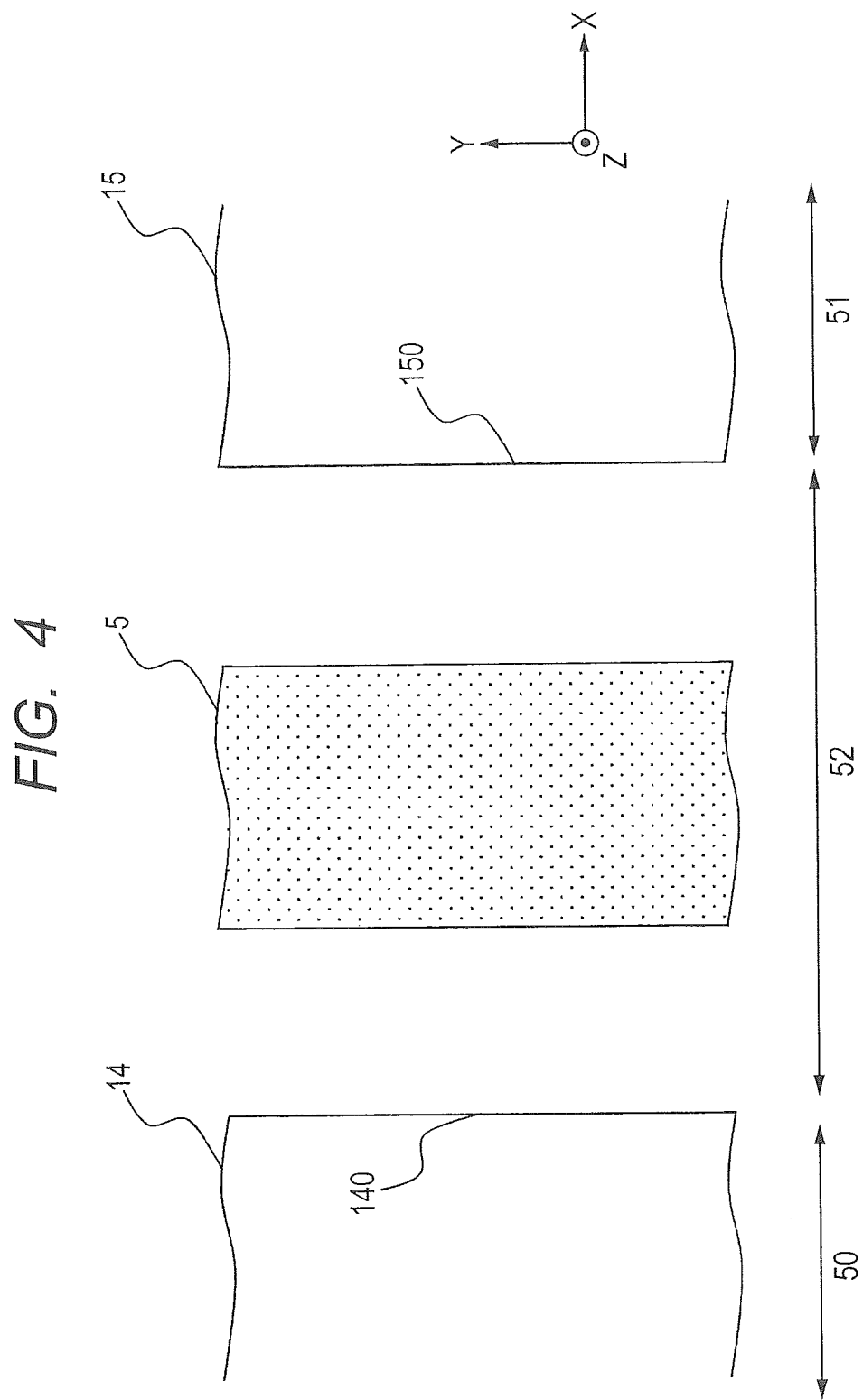
FIG. 4 is an enlarged plan view illustrating a portion of the planar configurational example of the semiconductor device according to the first embodiment.

FIG. 4 is an enlarged view for a portion of the semiconductor device 100 of FIG. 1 in which the source electrode 14 and the drain electrode 15 are opposed each other (opposing sides) and illustrates, for example, opposing portions of the source electrode portion 14a and the drain electrode portion 15a, and the source electrode portion 14a and the drain electrode portion 15b.

As illustrated in FIG. 4, the source electrode 14 (source cell region 50) and the drain electrode 15 (drain lead-out region 51) are isolated (separated). The opposing side 140 as the outer peripheral end of the source electrode 14 and the opposing side 150 as the outer peripheral end of the drain electrode 15 are opposed each other substantially in parallel. For example, the opposing side 140 and the opposing side 150 correspond to the opposing side 151a and 152a in FIG. 1.

An isolation region (separation region) 52 is present between the source electrode 14 and the drain electrode 15, and a gate interconnect 5 is formed in the isolation region 52. The isolation region 52 is a linear rectangular region that isolates the source electrode 14 and the drain electrode 15. Further, the source electrode 14 and the gate interconnect 5 are isolated and the drain electrode 15 and the gate interconnect are also isolated. The gate interconnect 5 extends along the outer periphery of the source electrode 14 and the drain electrode 15 and is formed along the opposing sides 140 and 150.

It can also be said that the source electrode 14 and the drain electrode 15 are opposed each other by way of the isolation region 52 and further that they are opposed each other by way of the gate interconnect 5. The gate interconnect 5 may not be formed in the isolation region 52. That is, it may suffice that the source electrode 14 and the drain electrode 15 are electrically disconnected in the isolation region 52 and also they may be opposed each other by way of the isolation region 52 where the gate interconnect 5 is not present.

Then, a cross sectional configuration of the semiconductor device 100 is to be described with reference to the cross sectional views of FIG. 5 to FIG. 10. For the configurations that overlap between each of the cross sectional views, description is to be omitted optionally.

Figure 5:
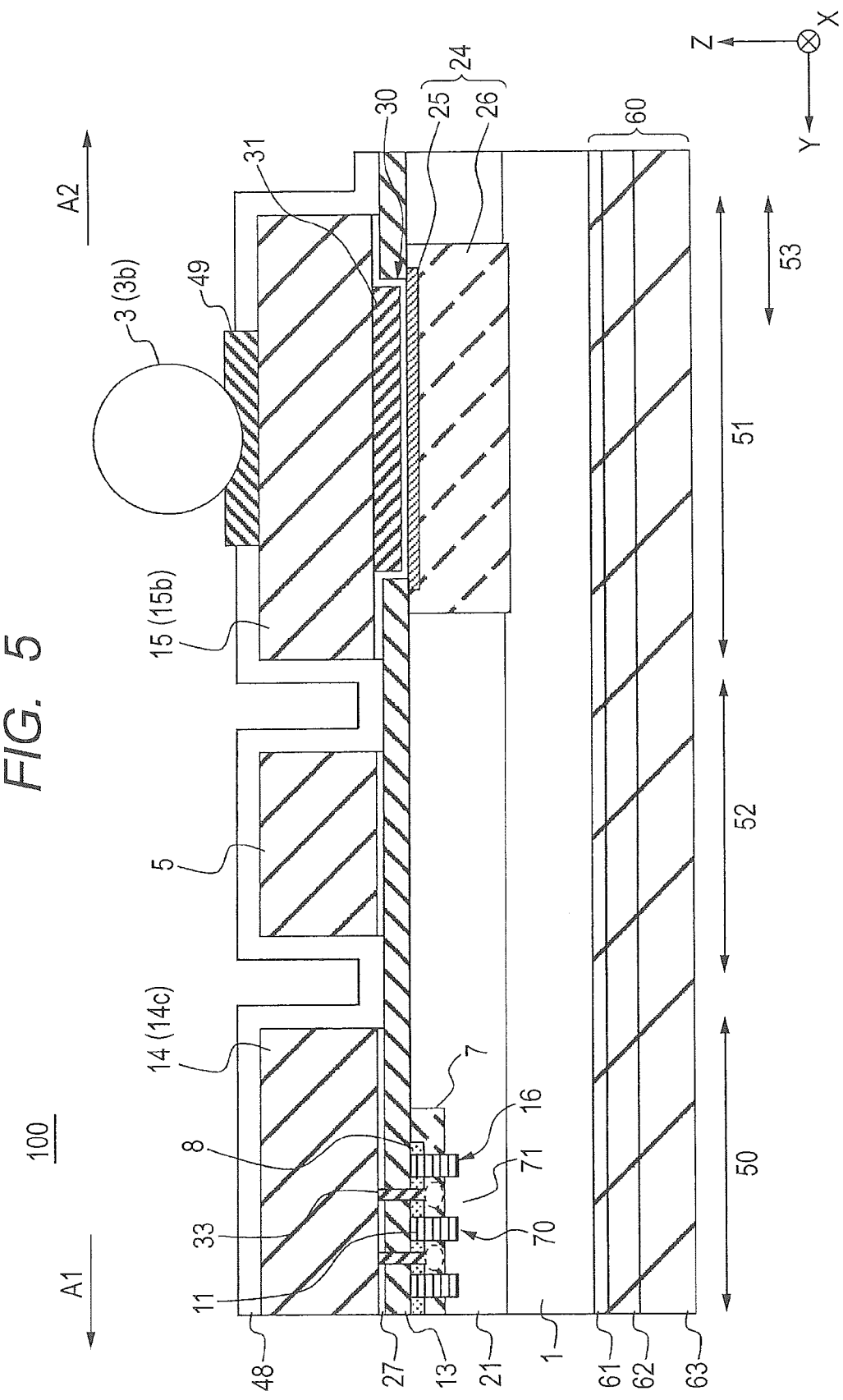
FIG. 5 is a cross sectional view illustrating a cross sectional configurational example of the semiconductor device according to the first embodiment.
Figure 6:
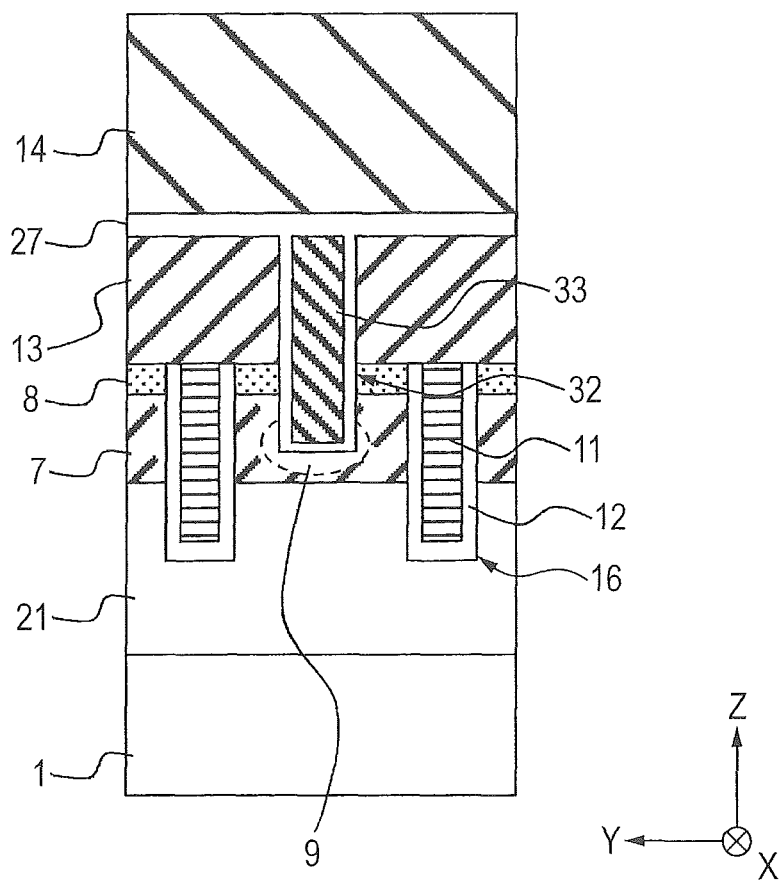
FIG. 6 is an enlarged cross sectional view illustrating a portion of the cross sectional configurational example of the semiconductor device according to the first embodiment.

FIG. 5 is a cross sectional view of the semiconductor device 100 along line A1-A2 in FIG. 1, and FIG. 6 is an enlarged view for a portion of an active cell (MOSFET) in FIG. 5. FIG. 5 illustrates an example of a portion in which the source electrode 14 and the drain electrode 15 are opposed each other, and is an example of a cross sectional view along the direction Y (direction of the shorter side of the gate electrode) relative to the semiconductor device in which the gate electrode (gate trench) is formed and extended in the direction X.

As illustrated in FIG. 5, a back surface electrode 60 is formed over the entire lower surface (back surface) of a silicon substrate 1. The back surface electrode 60 comprises, for example, a stacked structure in which a Ti (titanium) layer 61, a Ni (nickel) layer 62, and an Ag (silver) layer 63 are stacked orderly from the side of the silicon substrate. The back surface electrode 60 (and silicon substrate 1) functions as a drain of the MOSFET, forms a current path by way of a channel of the MOSFET and further forms a current path also between the back surface electrode and the drain contact region 24. When the resistance of the silicon substrate 1 is sufficiently low, the back surface electrode 60 is not always necessary.

Each of the configurations is to be described with reference to an example of the semiconductor device 100 having an N-type conduction. An N⁻ type epitaxial layer 21 as a drift region is formed over an N⁺ type silicon substrate (semiconductor layer) 1. The silicon substrate 1 may be referred to as a semiconductor substrate, or a silicon substrate 1 in which an epitaxial layer 21 is formed (including the epitaxial layer 21) may be referred to also as the semiconductor substrate.

In an active cell region 70 (source cell region 50) over the silicon substrate 1, an active cell 71 illustrated in FIG. 6 is formed. The active cell 71 is a trench gate type vertical MOSFET.

Specifically, as illustrated in FIG. 6, a P⁻ type base diffusion region 7 is formed to a portion over the epitaxial layer 21. An N⁺ type source diffusion region 8 is formed over the base diffusion region 7. A gate trenches 16 extending from the surfaces of the source diffusion region 8 and the base diffusion region 7 and reaching the epitaxial layer 21 is formed. A gate electrode 11 is formed by way of a gate insulating film 12 in the gate trench 16. An interlayer insulating film 13 is formed so as to cover the gate trench 16 (gate electrode 11) and the source diffusion region 8. A source electrode 14 is formed by way of a barrier metal 27 over the interlayer insulating film 13.

A base contact trench 32 that passes from the surface of the interlayer insulating film 13 through the source diffusion region 8 and reaches the base diffusion region 7 is formed. A base plug (base contact electrode) 33 is formed by way of the barrier metal 27 in the base contact trench 32. In the base diffusion region 7, a P⁺ type base contact region 9 is formed near the bottom of the base contact trench 32.

The source electrode 14 is electrically connected by way of the base plug 33 with the source diffusion region 8 and electrically connected by way of the base contact region 9 with the base diffusion region 7. A drain current flows from the silicon substrate 1 by way of the epitaxial layer 21, a channel region formed in the base diffusion region 7 on the lateral side of the gate trench 16 and a source diffusion region 8 to the source electrode 14.

The gate trenches 16 (gate electrodes 11) is formed, for example, linearly (in a stripe shape) in the direction X, and one or plurality of transistor cells are formed in a portion put between the gate trenches 16, and the transistor cells are connected in parallel. The shape of the gate trench 16 is not restricted to the linear shape but may also be a lattice-like or network-like shape as viewed from the upper surface.

The configuration of FIG. 5 is to be described further. A gate interconnect 5 is formed in the isolation region 52 over the silicon substrate 1. Specifically, the interlayer insulating film 13 is formed over the epitaxial layer 21 in the isolation region 52. The gate interconnect 5 is formed by way of the barrier metal 27 over the interlayer insulating film 13. In FIG. 5, the gate interconnect 5 is formed and extended linearly in the direction X.

Further, in the drain lead-out region 51 over the silicon substrate 1, a current path for drawing a drain current from the silicon substrate 1 to the drain electrode 15 is formed. Specifically, in the drain lead-out region 51, a drain contact region 24 is formed in the epitaxial layer 21.

In this example, an N⁺ type first drain contact region 25 and an N⁺ type second drain contact region 26 are formed as a drain contact region 24 in a portion of the epitaxial layer 21. The second drain contact region 26 is formed in a portion of the epitaxial layer 21 from the surface of the epitaxial layer 21 so as to be in contact with the silicon substrate 1. Further, the first drain contact region 25 is formed in a portion over the second drain contact region 26. The first drain contact region 25 and the second drain contact region 26 cooperate together to function as the drain contact region 24.

FIG. 5 illustrates an example in which the drain contact trench 30 is formed in the interlayer insulating film 13. Alternatively, a drain plug 31 may be formed at a deeper position by deeply engraving the drain contact trench 30 as far as the inside of the epitaxial layer 21 to form the first and the second drain contact regions 25 and 26, or by deeply engraving the trench so as to reach the silicon substrate 1 or as far as the inside of the silicon substrate 1 to form the first drain contact region (in this case, the second drain contact region 26 is not always necessary). When the drain contact trench 30 is engraved more deeply, the drain region resistance can be decreased further.

The interlayer insulating film 13 is formed so as to cover the first drain contact region 25 and the second drain contact region 26. A drain electrode 15 is formed by way of the barrier metal 27 over the interlayer insulating film 13.

A drain contact trench 30 that extends from the surface of the interlayer insulating film 13 and reaches the first drain contact region 25 is formed. A drain plug (drain contact electrode) 31 is formed by way of the barrier metal 27 in the drain contact trench 30. For example, the drain contact trench 30 and the drain plug 31 are formed linearly (in a stripe shape) or over the entire surface of the drain contact region 24.

The drain electrode 15 is connected with the first drain contact region 25 by way of the drain plug 31 at the bottom of the drain contact region 25. That is, the drain electrode 15 is electrically connected with the silicon substrate 1 by way of the drain plug 31, the first drain contact region 25, and the second drain contact region 26.

In FIG. 5, a cover insulating film 48 is formed so as to entirely cover the source electrode 14, the gate interconnect 5, the drain electrode 15, and the interlayer insulating film 13. An UBM (Under Bump Metal) 49 that can be solder-bonded is formed over the drain electrode 15 at the position of the external drain terminal 3 (pad position). The external drain terminal 3 is formed over the UBM 49 by means of a solder ball, a solder bump, or the like. The external drain terminal 3 is connected by way of the UBM 49 to the drain electrode 15.

Although not illustrated in the drawing, a contact trench and a plug (contact electrode) for an EQR electrode may also be formed such that the end of the drain electrode 15 forms an EQR electrode 15c in the outer peripheral region 53 of the semiconductor device 100.

Figure 7:
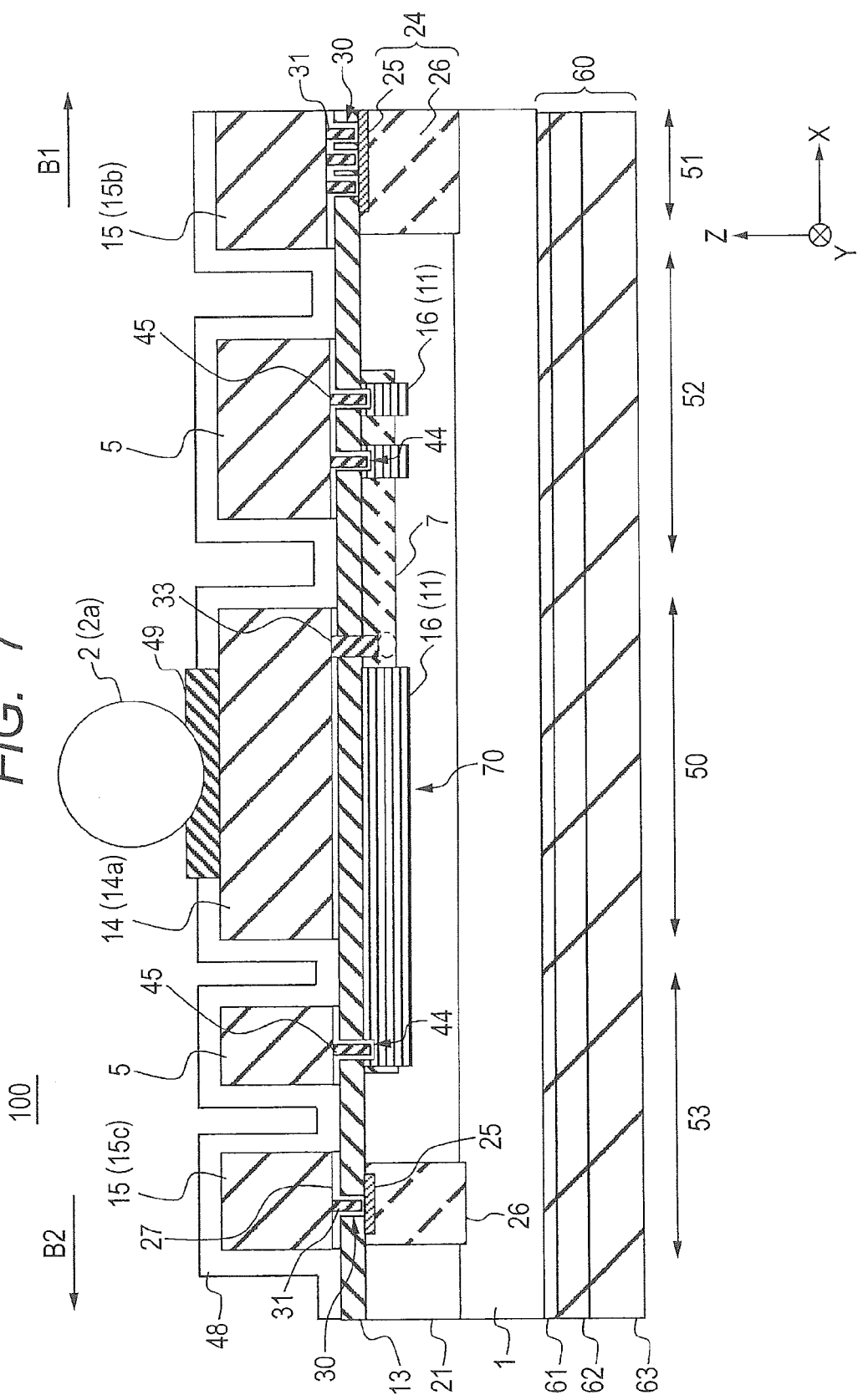
FIG. 7 is a cross sectional view illustrating a cross sectional configurational example of the semiconductor device according to the first embodiment.
Figure 8:
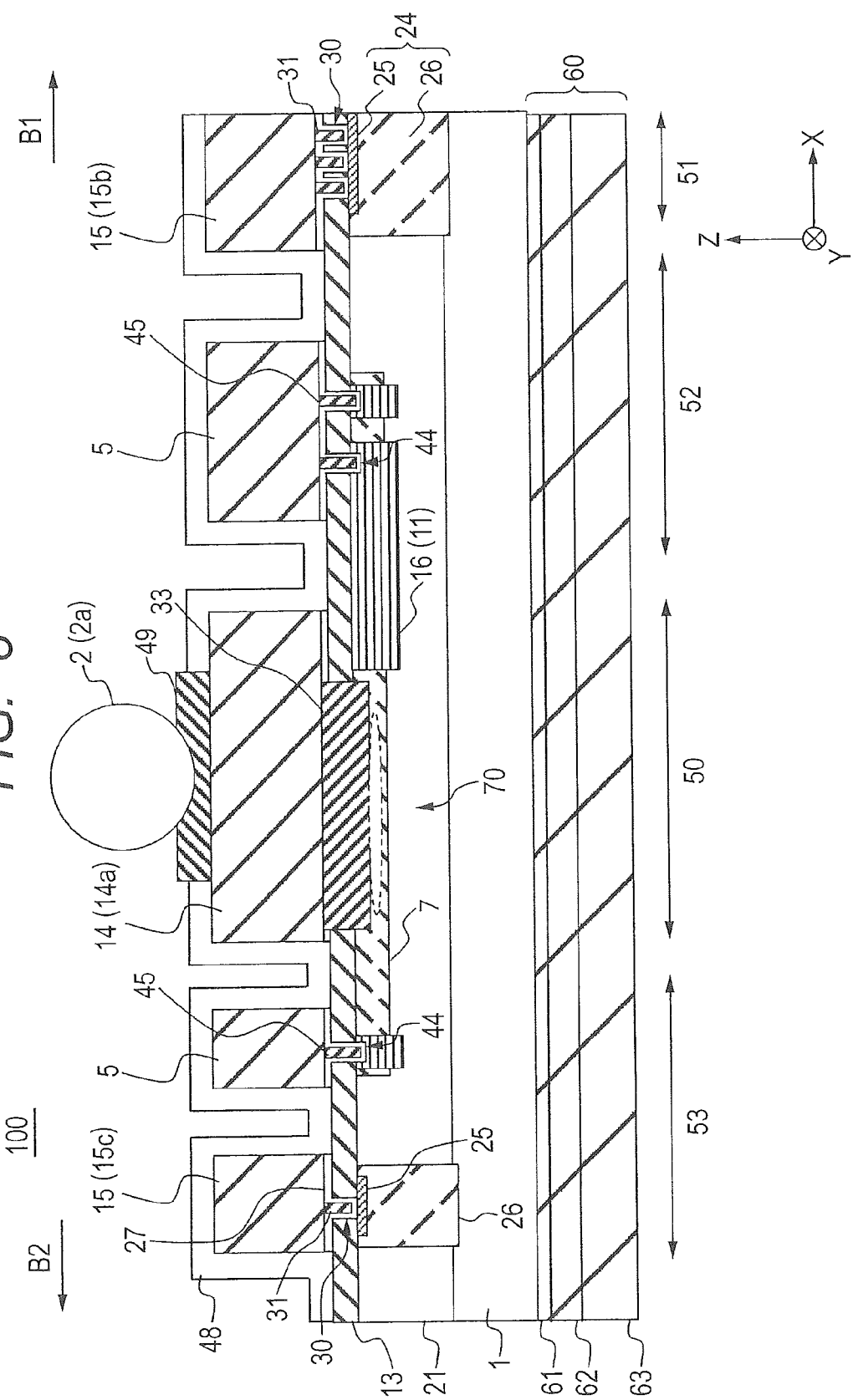
FIG. 8 is a cross sectional view illustrating a cross sectional configurational example of the semiconductor device according to the first embodiment.

FIG. 7 and FIG. 8 are cross sectional views along line B1-B2 of the semiconductor device 100 illustrated in FIG. 1. FIG. 7 and FIG. 8 show other example of portions in which the source electrode 14 and the drain electrode 15 are opposed each other. They are cross sectional views along the direction X (longitudinal direction of the gate electrode) relative to the semiconductor device in which the gate electrode (gate trench) is formed and extended in the direction X.

In the outer peripheral region 53 of FIG. 7, an EQR electrode 15c and a gate interconnect 5 are formed in this order from the outside. The configuration of the EQR electrode 15c is identical with that of the drain electrode 15 in FIG. 5. That is, a first drain contact region 25 and a second drain contact region 26 are formed to a portion of an epitaxial layer 21.

The EQR electrode 15c is formed by way of an interlayer insulating film 13 and a barrier metal 27 over the first drain contact region 25 and the second drain contact region 26. In the drain contact trench 30 formed in the interlayer insulating film 13 by way of the barrier metal 27. A drain plug (drain contact electrode) 31 is formed by way of the barrier metal 27 in the drain contact trench 30 formed to the interlayer insulating film 13.

For example, the drain contact trench 30 and the drain plug 31 are formed and extended linearly in the interconnect direction of the EQR electrode 15c (direction Y in FIG. 7). The EQR electrode 15c is electrically connected with the silicon substrate 1 by way of the drain plug 31, the first drain contact region 25, and the second drain contact region 26.

In FIG. 7, a base diffusion region 7 over the epitaxial layer 21 is formed from a portion below the gate interconnect 5 of the outer peripheral region 53 to a portion below the source electrode 14 in the active cell region 70 and to a portion below the gate interconnect 5 of the isolation region 52. Further, the gate trench 16 (gate electrode 11) is formed and extended in the direction X from a portion below the gate interconnect 5 of the outer peripheral region 53 substantially over the entire portion below the source electrode 14.

The gate electrode 11 is connected electrically with the gate interconnect 5 at the terminal end of the gate trench 16. That is, a gate contact trench 44 that extends from the surface of the interlayer insulating film 13 and reaches the gate electrode 11 is formed below the gate interconnect 5. A gate plug (gate contact electrode) 45 is formed in the gate contact trench 44 by way of a barrier metal 27.

For example, the gate contact trench 44 and the gate plug 45 are formed and extended linearly in the interconnection direction of the gate interconnect 5 (direction Y in FIG. 7). The gate interconnect 5 is connected by way of the gate plug 45 with the gate electrode 11 at the bottom of the gate contact trench 44. In FIG. 7, the gate electrode 11 formed and extended in the direction X and the gate interconnect 5 formed and extended in the direction Y are connected by way of the gate plug 45 in the outer peripheral region 53.

Further, in FIG. 8, a base diffusion region 7 is formed from a portion below the gate interconnect 5 in the outer peripheral region 53 as far as a portion below the source electrode 14 and a portion below the gate interconnect 5 in the isolation region 52 in the same manner as in FIG. 7. Further, a gate trench 16 (gate electrode 11) is formed and extended from a portion below the source electrode 14 to a portion below the interconnect 5 in the direction X in the isolation region 52. Then, in FIG. 8, the gate electrode 11 formed and extended in the direction X and the gate interconnect 5 formed and extended in the direction Y in the isolation region 52 are connected by way of a gate plug 45.

In the drain lead-out region 51 in FIG. 7, a drain contact trench 30 and a drain plug 31 are formed in the interlayer insulating film 13 in the same manner as in FIG. 5. In FIG. 7, the drain contact trench 30 and the drain plug 31 are formed and extended in the direction Y.

Figure 9:
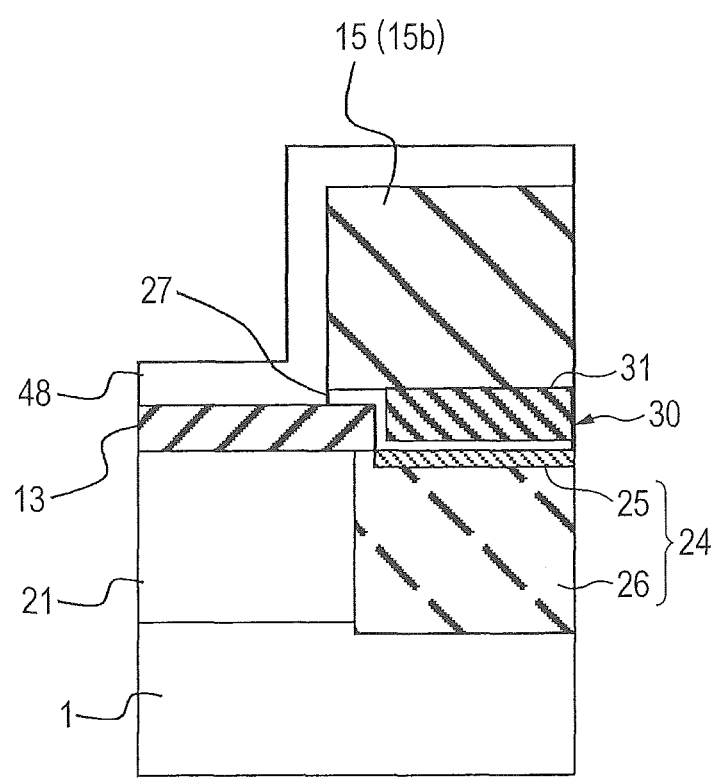
FIG. 9 is a cross sectional view illustrating a portion of the cross sectional configurational example of the semiconductor device according to the first embodiment.

FIG. 9 illustrates another example of the drain contact trench 30 and the drain plug 31. In FIG. 9, the drain contact trench 30 and the drain plug 31 are formed over the entire surface of the drain contact region 24. That is, the drain contact trench 30 and the drain plug 31 may be formed linearly as illustrated in FIG. 7 and FIG. 8, or may be formed over the entire surface as illustrated in FIG. 9. For example, the on-resistance may be controlled also depending on the shape of the drain contact trench 30 and the drain plug 31.

Further, in FIG. 7, a cover insulating film 48 is formed so as to entirely cover the source electrode 14, the gate interconnect 5, the drain electrode 15 (EQR electrode 15c), and the interlayer insulating film 13. Then, at the position for the external source terminal 2 (pad position), the UBM 49 is formed over the source electrode 14 and the external source terminal 2 is formed over the UBM 49. The external source terminal 2 is connected by way of the UBM 49 with the source electrode 14.

Figure 10:
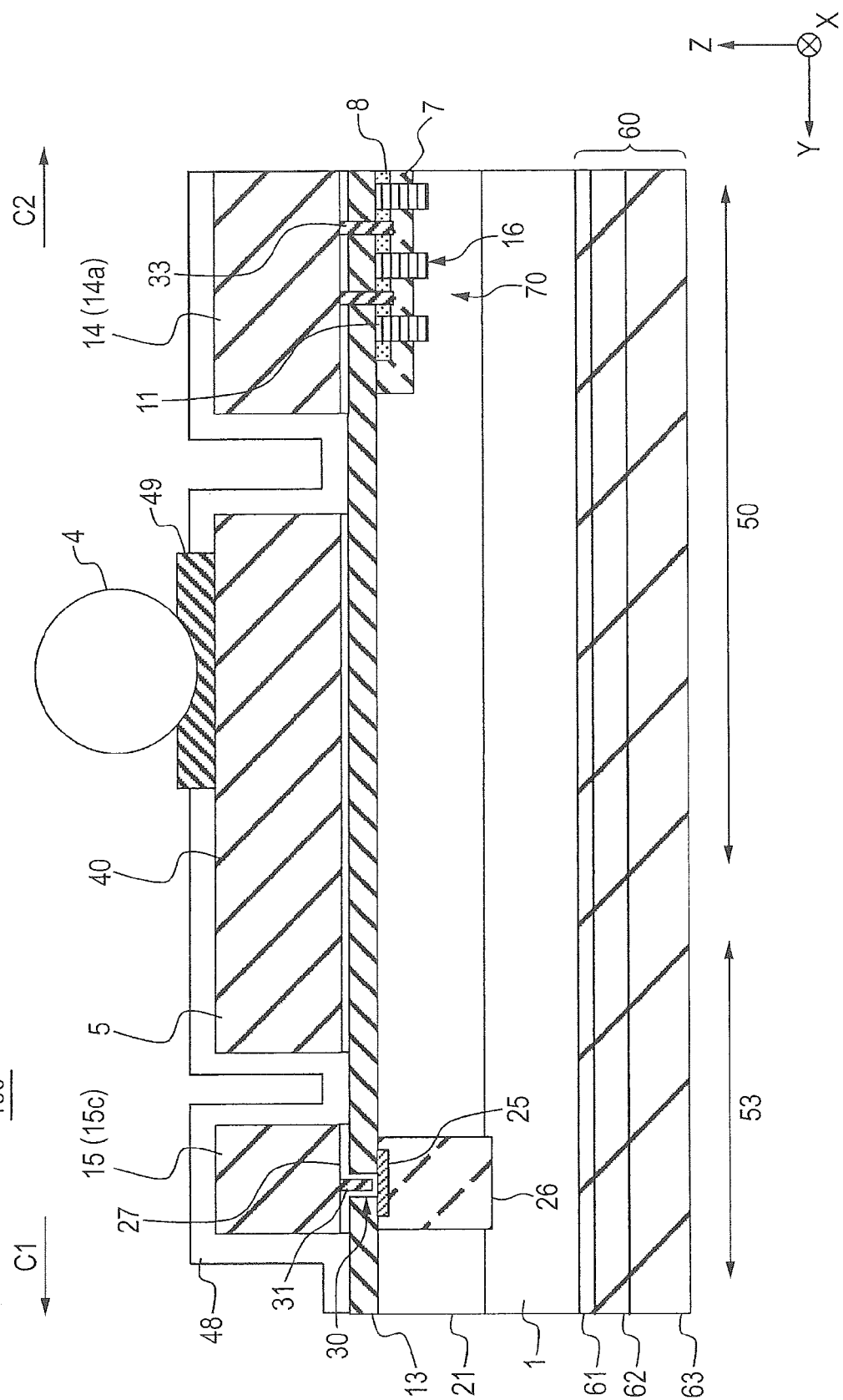
FIG. 10 is a cross sectional view illustrating a cross sectional configurational example of the semiconductor device according to the first embodiment.

FIG. 10 is a cross sectional view along a line C1-C2 of the semiconductor device 100 in FIG. 1. FIG. 10 illustrates an example of a portion including the gate pad 40. FIG. 10 is a cross sectional view along the direction Y (shorter direction of the gate electrode) of the semiconductor device in which the gate electrode (gate trench) is formed and extended in the direction X.

In an outer peripheral region 53 of FIG. 10, an EQR electrode 15c and a gate interconnect 5 are formed in this order from the outer side in the same manner as in FIG. 7. Further, the electrode is formed integrally from the region of the gate interconnect 5 to a portion below the external gate terminal 4 to form a gate pad 40 below the external gate terminal 4. That is, an interlayer insulating film 13 is formed over an epitaxial layer 21, and the gate pad 40 is formed by way of a barrier metal 27 over the interlayer insulating film 13. The gate interconnect 5 and the gate pad 40 are formed integrally and connected electrically.

In the region below the gate pad 40, an active cell may be formed as an active cell region 70, or other circuits such as a protection circuit may also be formed.

In FIG. 10, a cover insulating film 48 is formed so as to entirely cover the gate interconnect 5, the EQR electrode 15c, the gate pad 40, and the interlayer insulating film 13. At the position for the external gate terminal 4 (pad position), an UBM 49 is formed over the gate pad 40, and an external gate terminal 4 is formed over the UBM 49. The external gate terminal 4 is connected by way of the UBM 49 to the gate pad 40.

Then, steps of manufacturing the semiconductor device 100 according to this embodiment are to be described with reference to cross sectional views of FIG. 11 to FIG. 14. The cross sectional views of FIG. 11 to FIG. 14 correspond to the cross sectional view of FIG. 5.

Figure 11:
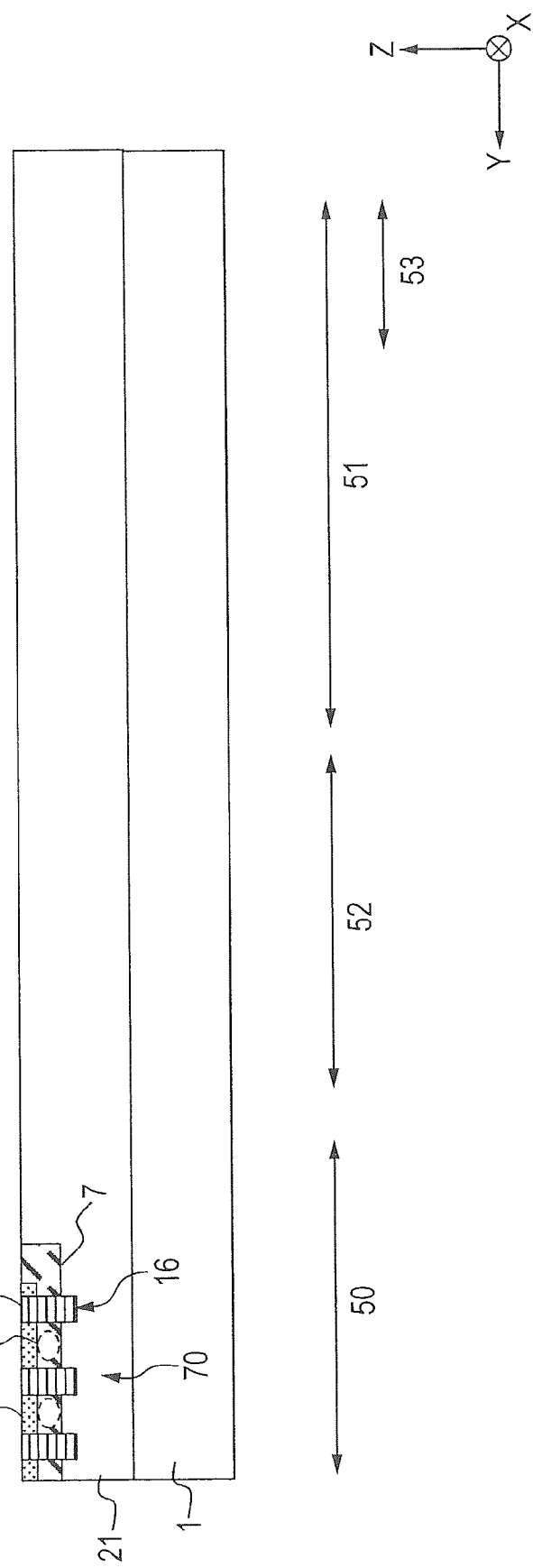
FIG. 11 is a cross sectional view illustrating an example of a step of manufacturing the semiconductor device according to the first embodiment.

At first, as illustrated in FIG. 11, an N$^-$ type epitaxial layer 21 is formed over the entire surface of an N$^+$ type silicon substrate 1.

Then, a gate trench 16 is formed in a stripe pattern by etching in the direction X in a region to be formed as an active cell region 70 (source cell region 50) to the surface of an epitaxial layer 21. Then, after forming a gate insulating film 12 on the surface inside the gate trench 16, polysilicon is buried in the gate trench 16 and patterned to form a gate electrode 11.

Then, a base diffusion region 7 is formed by ion implantation of P type impurities in a region to be formed as an active cell region 70 to the surface of the epitaxial layer 21 by using a photoresist. Further, a source diffusion region 8 is formed by ion implantation of N+ type impurities to the surface of the base diffusion region 7, and a base contact region 9 is formed by ion implantation of P+ type impurities.

Figure 12:
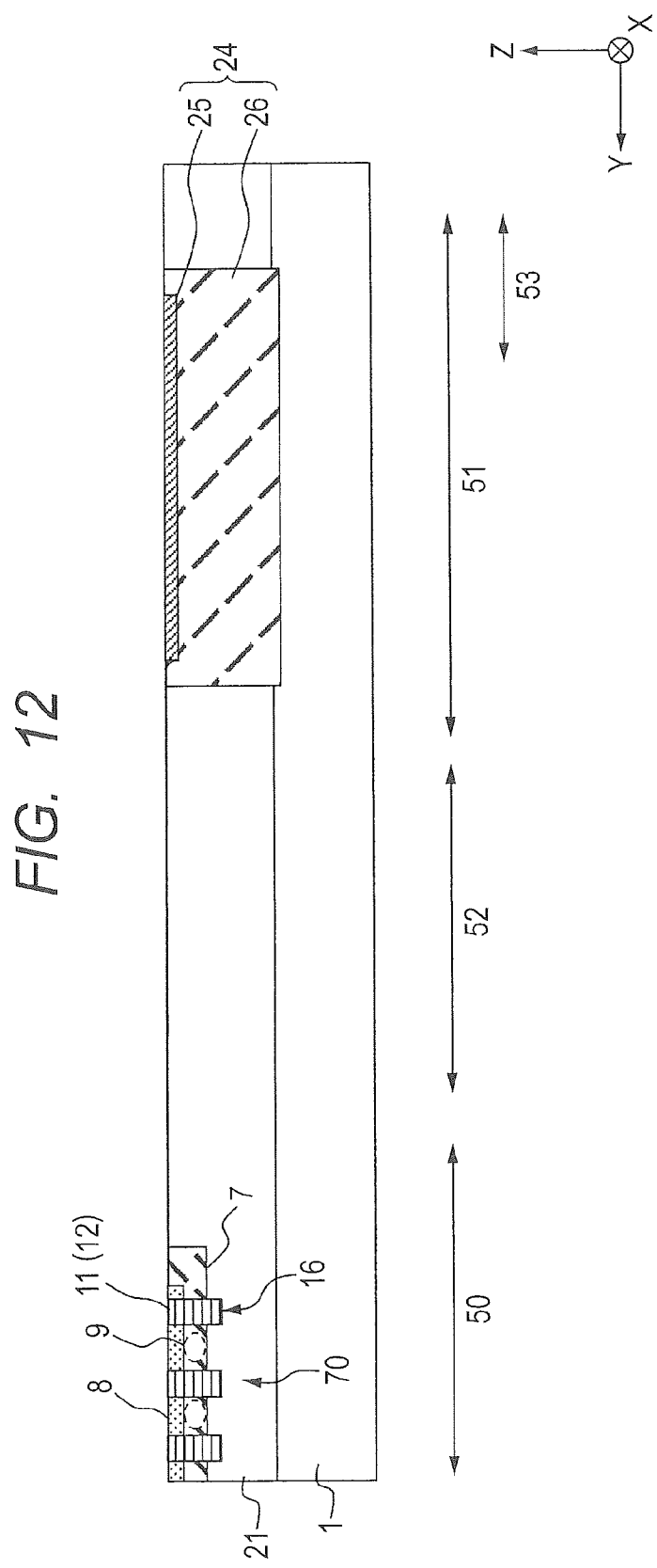
FIG. 12 is a cross sectional view illustrating an example of a step of manufacturing the semiconductor device according to the first embodiment.

Then, as illustrated in FIG. 12, after etching a region to be formed as a drain contact region 24 (drain lead-out region 51) over the surface of the epitaxial layer 21 as far as the midway of the epitaxial layer 21, a second drain contact region 26 is formed by ion implantation of N+ type impurities into the etched trench. Further, a first drain contact region 25 is formed by ion implantation of N+ type impurities to the surface of the second drain contact region 26.

The order of performing the step of manufacturing the active cell region 70 in FIG. 11 and the step of manufacturing the drain contact region 24 in FIG. 12 may be reversed, or a portion of the manufacturing steps may be performed simultaneously. By the steps in FIG. 11 and FIG. 12, the active cell region 70 and the drain contact region 24 are formed such that they are opposed each other along three sides as described above.

Figure 13:
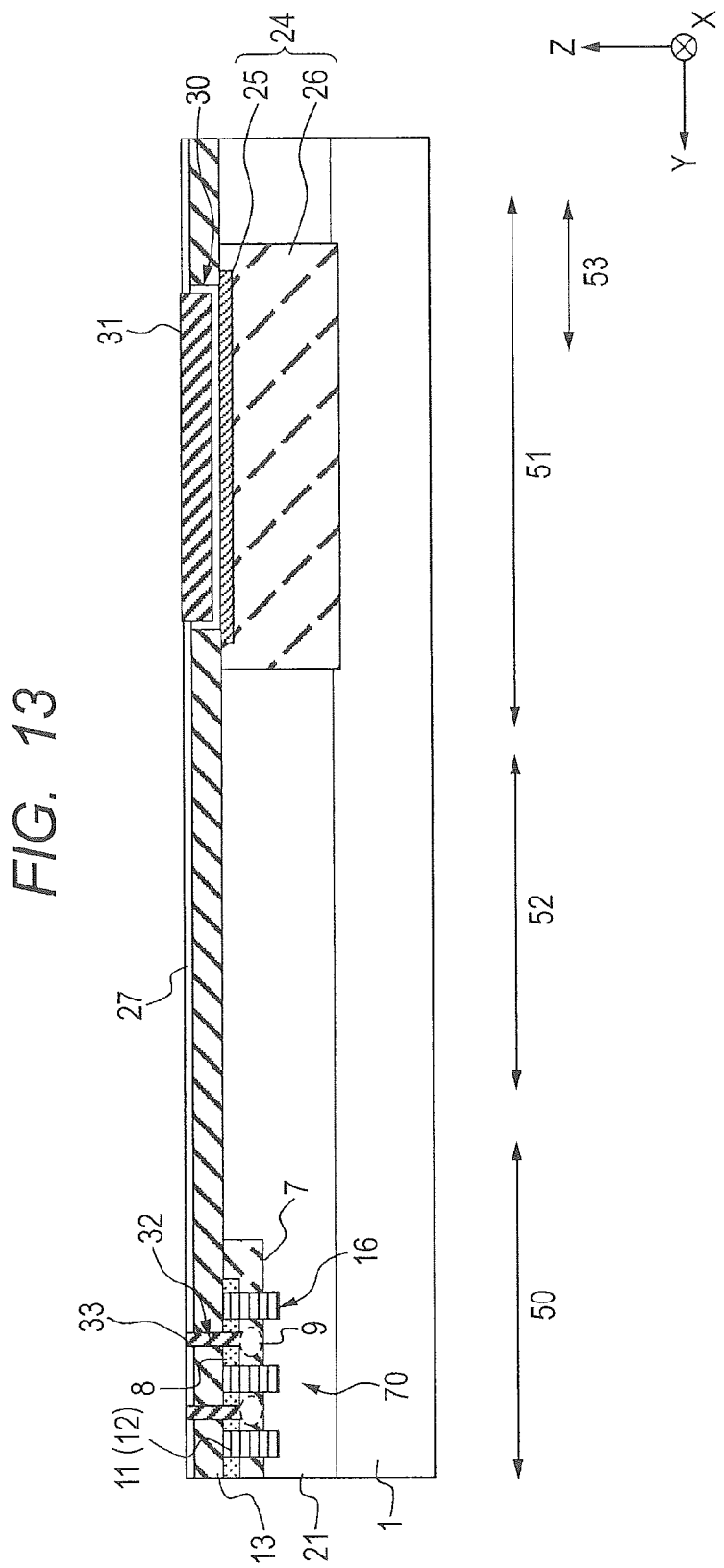
FIG. 13 is a cross sectional view illustrating an example of a step of manufacturing the semiconductor device according to the first embodiment.

Then, as illustrated in FIG. 13, an interlayer insulating film 13 comprising, for example, BPSG (Boron Phosphorus Silicon Glass) is formed over the entire surface including the epitaxial layer 21, the active cell region 70, and the drain contact region 24. Further, by etching to pattern the interlayer insulating film 13, a base contact trenches 32 is formed in the active cell region 70, a drain contact trench 30 is formed in the drain lead-out region 51, and a gate contact trench 44 (not illustrated) is formed in a region in which the gate interconnect 5 is formed (isolation region 52). The drain contact trench 30 is formed by etching the drain lead-out region 51 in a stripe-pattern or entirely etching the region.

Then, a barrier metal 27 comprising, for example, titanium/titanium nitride (Ti/TiN) is formed over the entire surface including the interlayer insulating film 13, the base contact trenches 32, the drain contact trench 30, and the gate contact trench 44. Polysilicon is buried in the base contact trench 32, in the drain contact trench 30, and in the gate contact trench 44 to form a base plug 33, a drain plug 31, and a gate plug 45.

Figure 14:
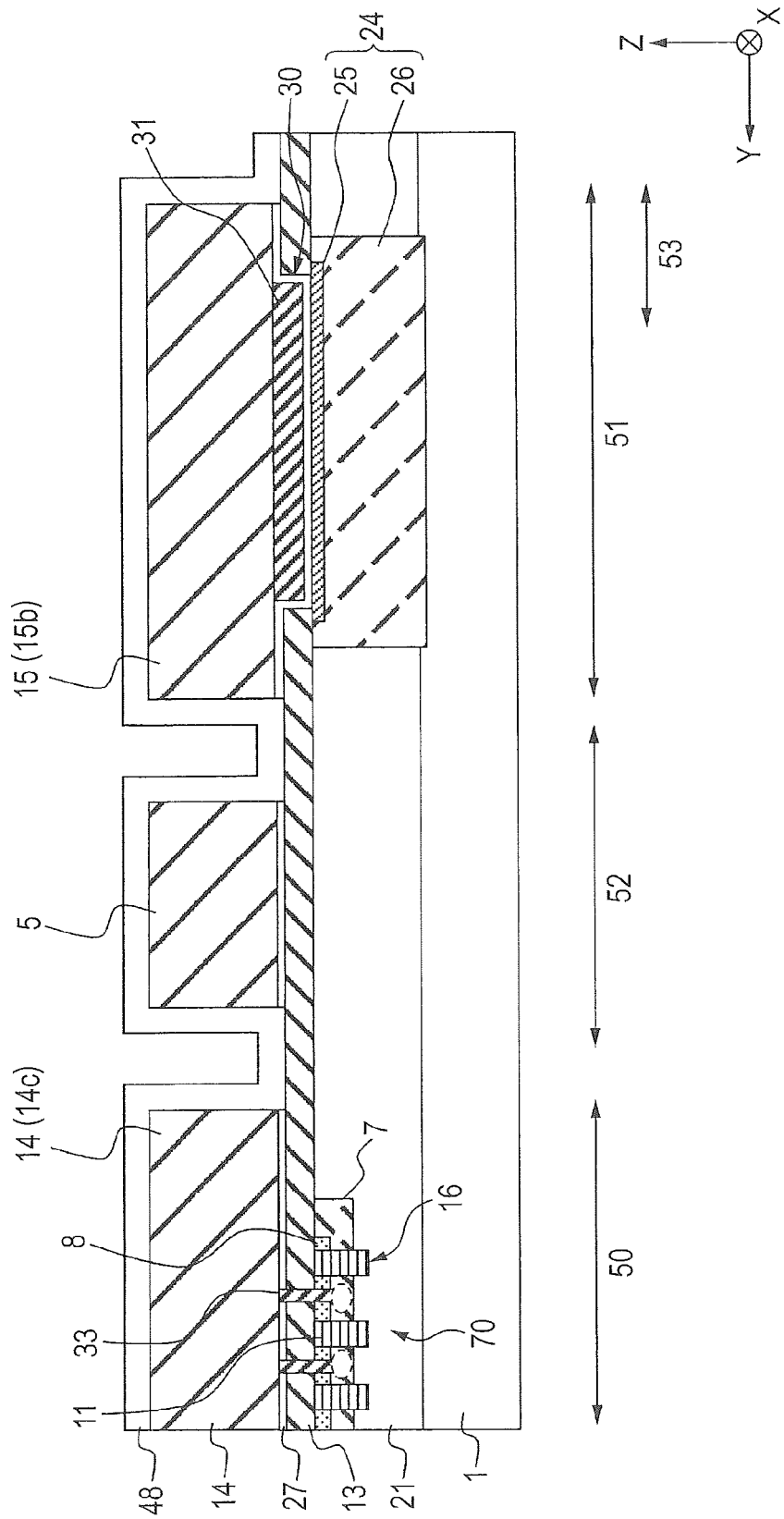
FIG. 14 is a cross sectional view illustrating an example of a step of manufacturing the semiconductor device according to the first embodiment.

Then, as illustrated in FIG. 14, a conductive layer comprising, for example, aluminum silicon copper (AlSiCu) or A/Cu is formed by a sputtering method over the entire surface including the barrier metal 27, the base plug 33, the drain plug 31, and the gate plug 45, and they are patterned to form a drain electrode 15, a gate interconnect 5, a source electrode 14, and a gate pad 40 (not illustrated). The drain electrode 15 and the source electrode 14 are formed by the step such that they are opposed each other along three sides as described above. Further, a cover insulating film 48 is formed over the entire surface including the drain electrode 15, the gate interconnect 5, the source electrode 14, and the gate pad 40.

Subsequently, an UBM 49 is formed over the drain electrode 15, the source electrode 14, and the gate pad 40, and the external source terminal 2, the external drain terminal 3, and the external gate terminal 4 are formed each over the UBM. Further, a back surface electrode 60 is formed by stacking a Ti layer 61, an Ni layer 62, and an Ag layer 63 over the entire back surface of the silicon substrate 1. Thus, the semiconductor device 100 as illustrated in FIG. 1 and FIG. 5 is formed. As described above, the back surface electrode 60 may be omitted.

Figure 15:
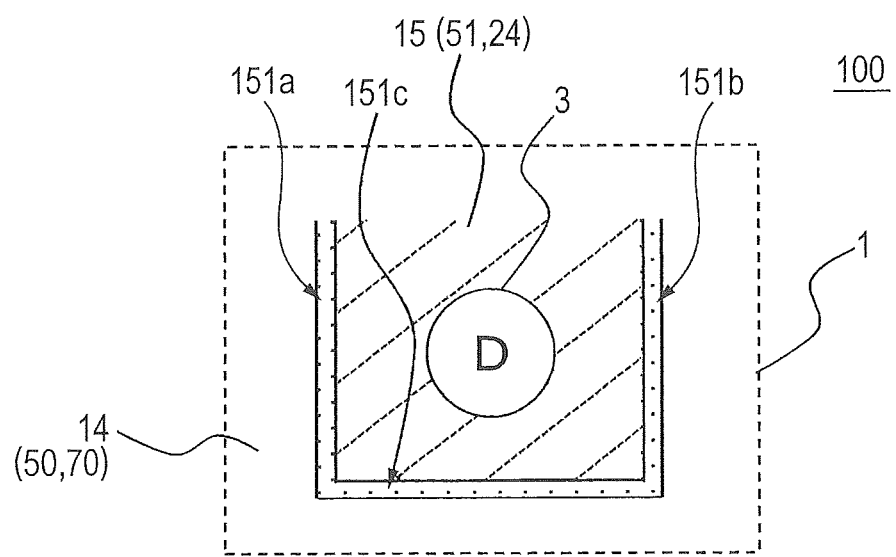
FIG. 15 is a plan view illustrating a main configuration of the semiconductor device according to the first embodiment.

Then, main features and advantages of the semiconductor device according to this embodiment are to be described. As illustrated in FIG. 15, a semiconductor device 100 according to this embodiment comprises, as main components, an active cell region 70 of a silicon substrate (semiconductor substrate) 1, a drain electrode 15, an external drain terminal 3, and a source electrode 14. The active cell region 70 is formed over the surface of the silicon substrate 1 and includes a vertical transistor.

The drain electrode 15 is formed over the surface of the silicon substrate 1 and leads out the drain of the vertical transistor from the back surface of the silicon substrate 1. The external drain terminal 3 is formed over the drain electrode 15. The source electrode 14 is formed over the active cell region 70 so as to be opposed to the drain electrode 15 at the periphery of the external drain terminal 3 at least along three opposing sides 151a to 151c.

In other words, the source cell region 50 including the source electrode 14 or the active cell region 70 and the drain lead-out region 51 including the drain electrode 15 or the drain contact region 24 are isolated and opposed each other by way of three opposing sides 151a to 151c (linear region) that surround the source electrode 14 or the drain electrode 15. It can also be said that the active cell region 70 and the drain contact region 24 are opposed each other by way of the three opposing sides 151a to 151c. With the configuration illustrated in FIG. 15, since the boundary portion between the drain region (drain lead-out region 51) and the source region (source cell region 50) is increased, the back surface resistance can be effectively decreased to reduce the on-resistance.

Figure 16:
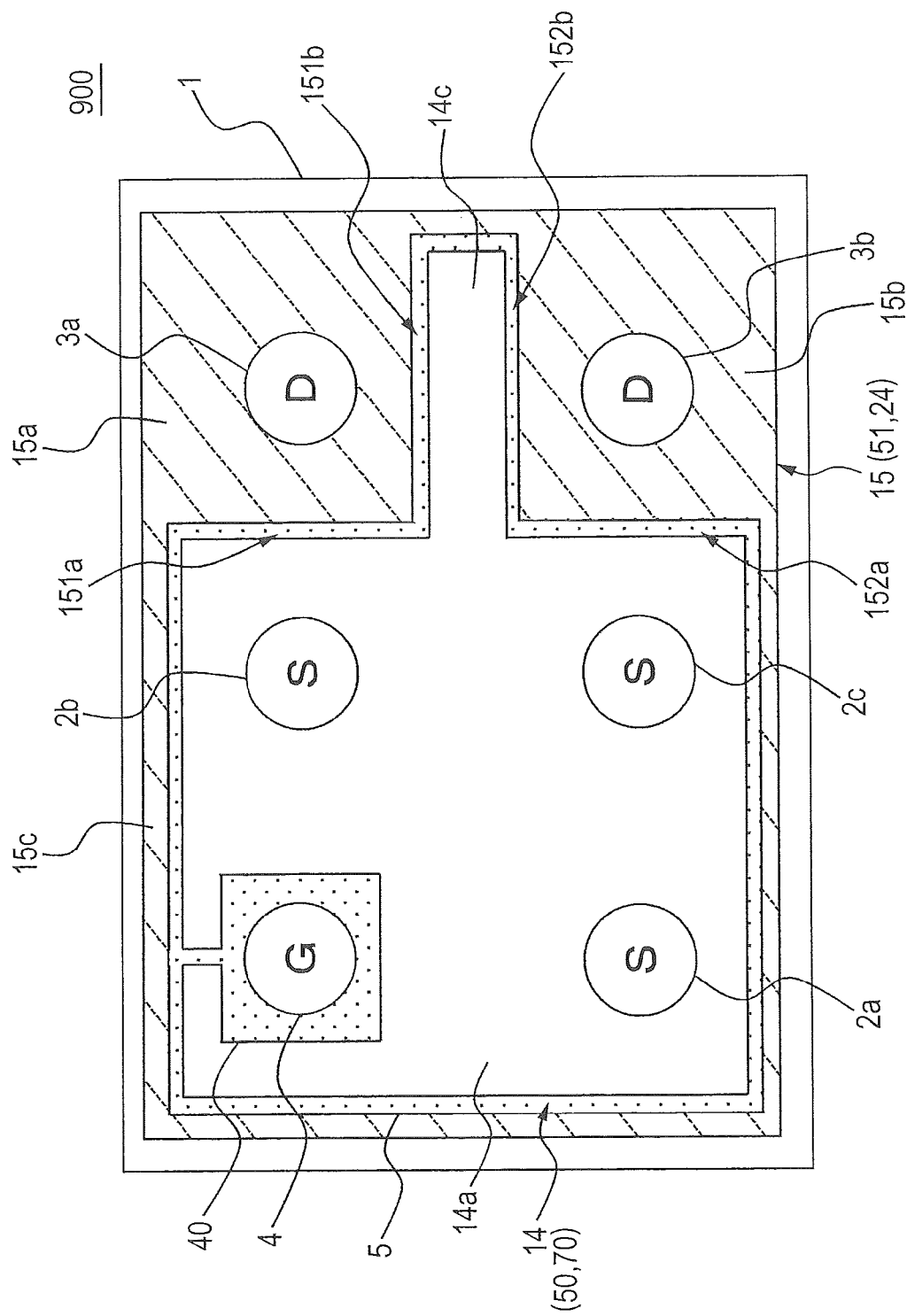
FIG. 16 is a plan view illustrating a planar configuration of a semiconductor device of a first comparative example.

FIG. 16 is a plan view of a semiconductor device of the first comparative example. As illustrated in FIG. 16, a semiconductor device 900 of the first comparative example has a pad layout of two rows×three columns and comprises three external source terminals 2a to 2c, two external drain terminals 3a and 3b, and one external gate terminal 4.

In FIG. 16, external drain terminals 3a and 3b are disposed on one end of the surface of a silicon substrate 1 and the external source terminals 2a to 2c and the external gate terminal 4 are collectively disposed over the surface of the silicon substrate 1 from the central portion to the other end.

The source electrode 14 comprises a substantially square source electrode portion 14a including from the periphery of the external gate terminal 4 to the periphery of the external source terminal 2a, the periphery of the external source terminal 2b, the periphery of the external source terminal 2c, and a rectangular source electrode portion 14c between the external drain terminal 3a and the external drain terminal 3b.

The drain electrode 15 comprises a substantially square drain electrode portion 15a along the periphery of the external drain terminal 3a, a substantially square drain electrode portion 15b along the periphery of the external drain terminal 3b, and an annular EQR electrode 15c at the outer peripheral end of the silicon substrate 1.

Figure 17:
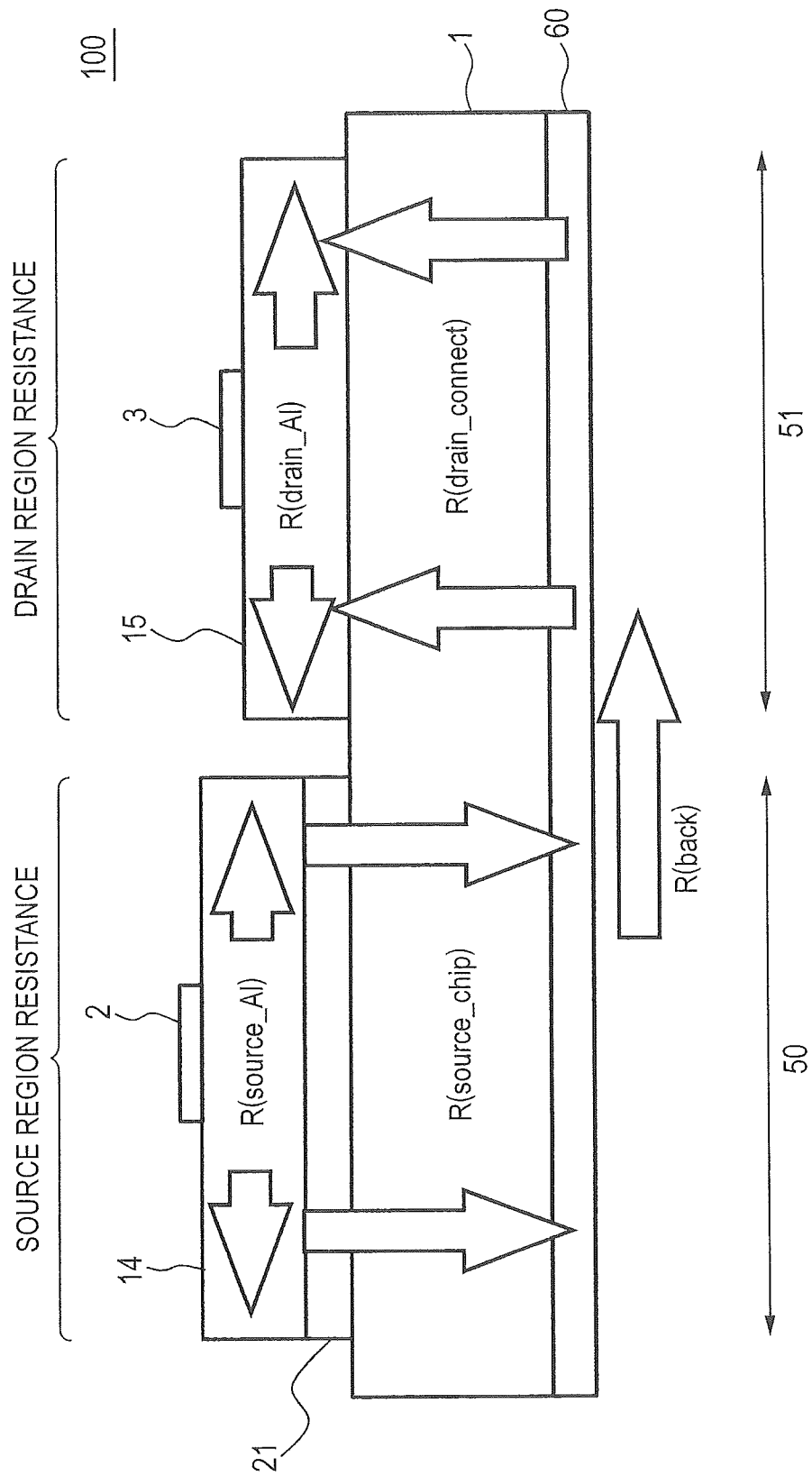
FIG. 17 is an explanatory view for explaining the effect of the semiconductor device according to the first embodiment.

The on-resistance of the semiconductor device 100 is to be investigated. As illustrated in FIG. 17, a semiconductor device of a single-CSP structure (one chip CSP structure) requires a drain lead-out region 51 in addition to an active cell region 70. Accordingly, in the on-resistance Rds (on), a drain chip resistance R (drain_connect) of the drain lead-out region 51 in the semiconductor chip is added to a source chip resistance R (source_chip) of the active cell region 70 in the semiconductor chip, and a back surface resistance R (back) in the lateral direction from the source region to the drain region is further added since a back surface electrode 60 is present as shown by the following equation 1:

$$Rds(\text{on})=R(\text{source\_chip})+R(\text{back})+R(\text{drain\_connect}) \qquad \text{Equation 1}$$

The back surface resistance R (back) includes a back surface resistance component due to a current flowing in the back surface electrode 60 or the silicon substrate 1 in the lateral direction which is a value not negligible in the equation 1. For example, in order to reduce the on-resistance Rds (on) to 10 mΩ, it is necessary that the source chip resistance R (source_chip) is about 5 mΩ, the drain chip resistance R (drain_connect) is about 2 mΩ, and the back surface resistance R (back) is about 3 mΩ.

Although the source chip resistance R (source_chip) and the drain chip resistance R (drain_connect) can be lowered by increasing the size of the semiconductor substrate, this is not preferred since the size of the semiconductor device increases. Accordingly, the back surface resistance R (back) has to be restricted as low as possible with respect to a predetermined chip size. Particularly, since the proportion of the back surface resistance R (back) in the on-resistance Rds (on) increases and becomes tangible as the channel resistance Rch (resistance in the channel portion of the cell) in the chip process is smaller, it is necessary to reduce the back surface resistance R (back).

In the semiconductor device 900 of the first comparative example, since the external source terminals (source regions) and the external drain terminals (drain region) are collectively disposed respectively, the back surface resistance R (back) increases to hinder the reduction of the resistance. That is, in the semiconductor device 900 of the first comparative example, the external source terminals 2a to 2c are disposed collectively and the external drain terminals 3a and 3b are disposed on the side thereof. Accordingly, since the external source terminal 2a and the external drain terminal 3b are spaced apart, the back surface resistance R (back) is increased corresponding to the resistance component from one end to the other end of the semiconductor substrate.

Figure 18:
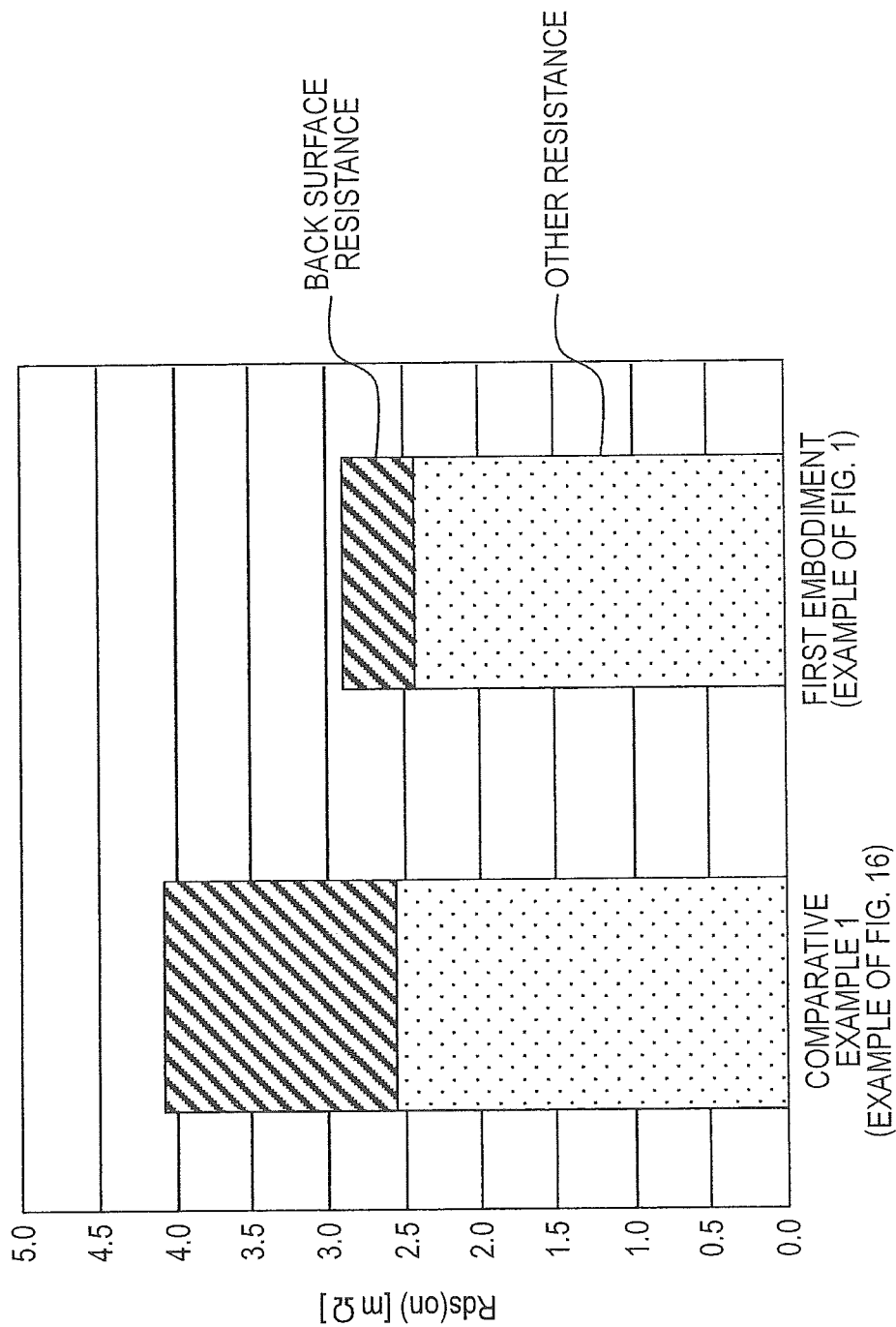
FIG. 18 is a graph illustrating the result of simulation on the semiconductor device according to the first embodiment.

Particularly, in the semiconductor device 900 of the first comparative example, since the drain electrode 15 below the external drain terminals 3 is opposed only along two sides (151a and 151b, or 152a and 152b) to the source electrode 14, the resistance value of the back surface resistance R (back) is based on the boundary region of the two sides. As illustrated in FIG. 18, in view of the result of simulation on the semiconductor device 900 of the first comparative example, the back surface resistance is about 1.5 mΩ, and the on-resistance including the back surface resistance is about 4.1 mΩ.

On the other hand, as illustrated in FIG. 1, in the semiconductor device 100 according to the embodiment of the present invention, the external source terminals are disposed divisionally, the external drain terminals are disposed at the center of the semiconductor substrate, and the external source terminals are disposed on both ends thereof.

That is, they are disposed such that the external drain terminals are put between the external source terminals. Columns (rows) each including the external source terminals and rows (or columns) each including the external drain terminals are disposed alternately such that the external source terminal and the external drain terminal are adjacent each other.

Thus, since the external source terminal and the external drain terminal are always adjacent to each other and the external source terminal and the external drain terminal are not spaced apart as in the case of the first comparative example, the back surface resistance R (back) can be decreased. Further, in order to dispose the external source terminals and the external drain terminals in such a configuration, it is preferred that the pad layout of the semiconductor device is two rows×three columns or more.

Particularly, in the semiconductor device 100 according to this embodiment, since the drain electrode 15 (drain contact region 24) below the external drain terminal 3 is opposed to the source electrode 14 (active cell region 70) along three sides (151a to 151c or 152a to 152c), the back surface resistance R (back) has a resistance value based on the boundary region along the three sides.

That is, since the area of the boundary region between the source electrode (active cell region 70) and the drain electrode (drain contact region 24) (area of cross section) increases more compared with that of the first comparative example, the back surface resistance can be decreased than that of the first comparative example.

In this embodiment, it can also be said that the boundary region is increased by separating the drain electrode 15 in which the external drain terminals 3a and 3b are formed is separated by the source electrode 14 (14c). As illustrated in FIG. 18, in view of the result of simulation on the semiconductor device 100 according to this embodiment, the back surface resistance is about 0.5 mΩ and the on-resistance including the back surface resistance is about 2.4 mΩ. In this embodiment, the back surface resistance can be decreased by about 1.0 mΩ and the on-resistance can be decreased outstandingly compared with the first comparative example.

Then, a relation between the area ratio of the source region (source cell region 50) and the drain region (drain lead-out region 51), and the on-resistance is to be investigated. In FIG. 17, considering the source electrode resistance R (source_Al) formed laterally in the source electrode and the drain electrode resistance R (drain_Al) formed laterally in the drain electrode, the on-resistance Rds (on) is represented by the following equation 2:

$$Rds(\text{on})=R(\text{source\_Al})+R(\text{source\_chip})+R(\text{back})+R(\text{drain\_connect})+R(\text{drain\_Al}) \qquad \text{Equation 2}$$

Source electrode resistance R (source_Al)+Source chip resistance R (source_chip) are assumed as a source region resistance and drain chip resistance R (drain_connect)+drain electrode resistance R (drain_Al) are assumed as a drain region resistance.

The source region resistance is determined depending on the area of the source electrode and the active cell region (source region), and the drain region resistance is determined depending on the area of the drain electrode and the drain lead-out region (drain region). Since the source region resistance includes the resistance component of the channel portion (active cell region 70 in the epitaxial layer 21), the source region resistance is higher than the drain region resistance. Accordingly, enlargement of the source region having a higher resistance value provides an effect of decreasing the source region resistance. On the other hand, when the drain region is narrowed by widening the source region, the drain region resistance increases. Accordingly, the area of the source region and that of the drain region are optimized such that the on-resistance is reduced while increasing the area of the source region than the drain region.

Figure 19:
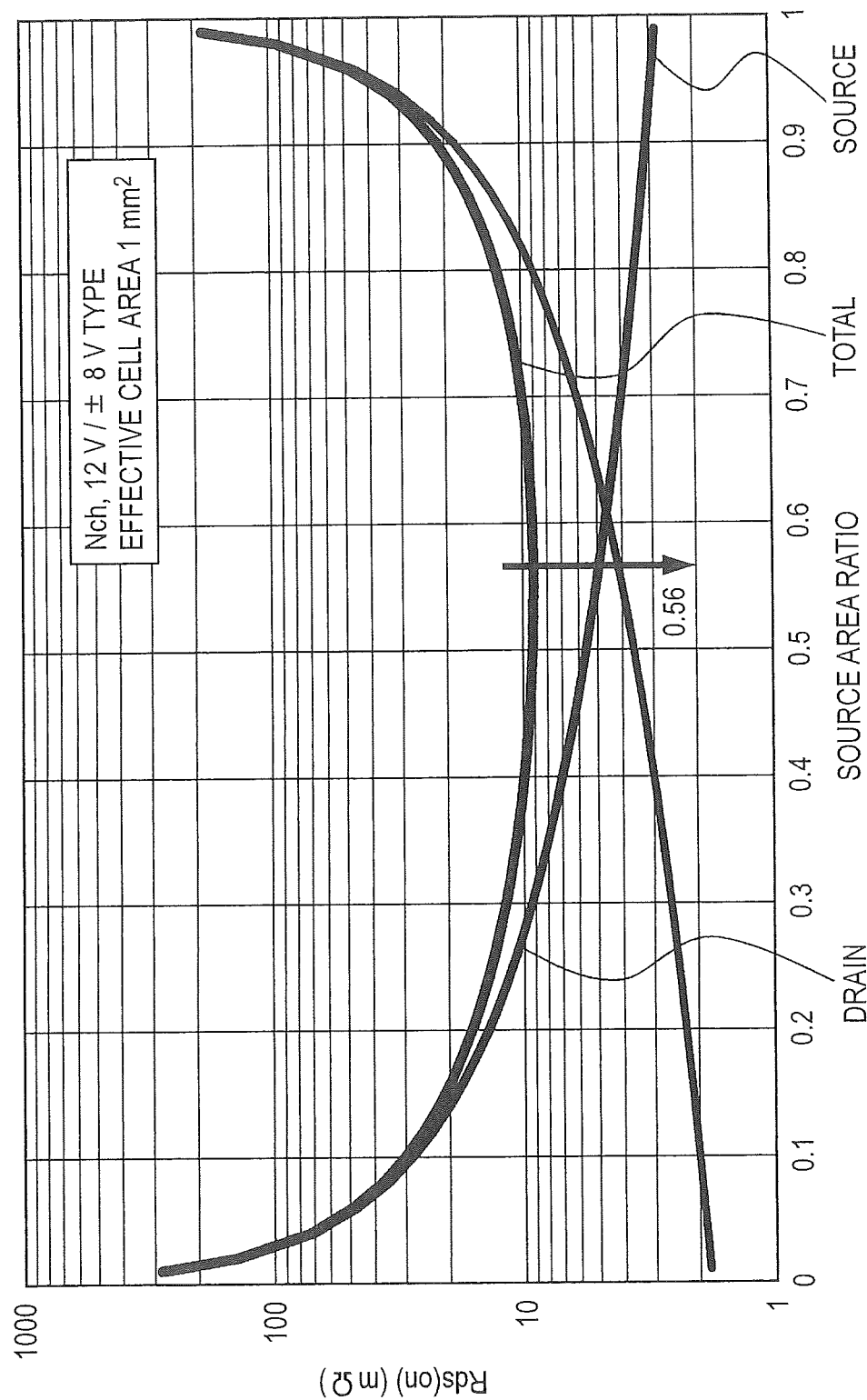
FIG. 19 is a graph illustrating a result of simulation on the semiconductor device according to the first embodiment.

Graphs in FIG. 19 illustrates a relation between the area ratio of the source region and the drain region and the on-resistance Rds (on) the Nch type semiconductor device 100. If the area of the drain region is excessively large compared with the source region (if the area of the source region is small), the drain region resistance is lowered. However, since the source region resistance increases excessively, the on-resistance becomes higher. In the same manner, if the area of the source area is excessively large compared with the drain region (area of the drain region is small), the source region resistance is decreased. However, the on-resistance increases since the drain region resistance increases excessively. In view of the result of the simulation, as illustrated in FIG. 19, for reducing the on-resistance in the case of the Nch type, source region area:drain region area=0.56:0.44 (about 6:4) is optimal.

Figure 20:
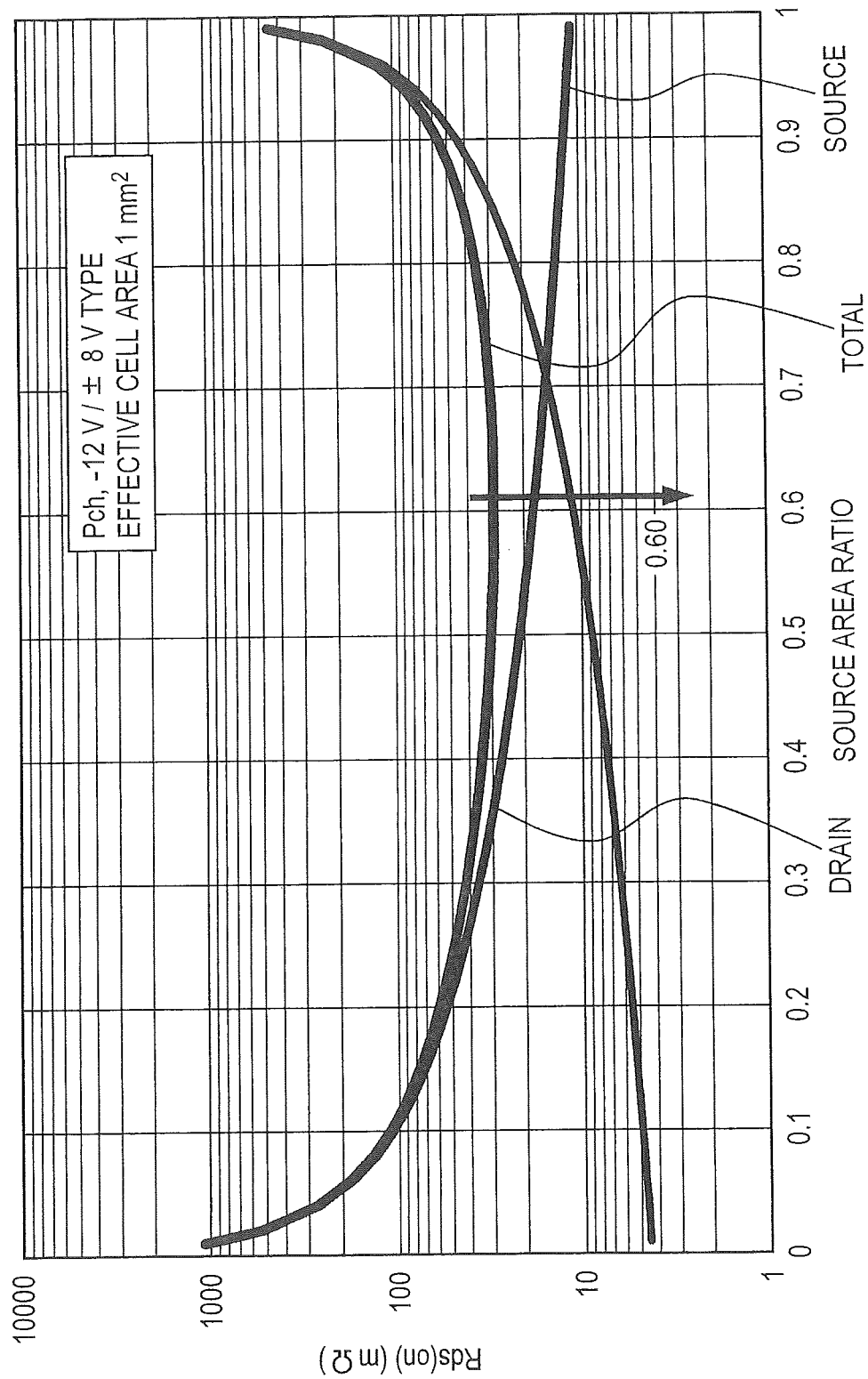
FIG. 20 is a graph illustrating the result of simulation on the semiconductor device according to the first embodiment.

Graphs of FIG. 20 illustrates a relation between the area ratio of the source region and the drain region and the on-resistance Rds (on) in the case of the Pch type semiconductor device 100. As illustrated in FIG. 20, area of source region:area of drain region=about 6:4 is optimal in order to reduce the on-resistance in a case of the Pch type device in view of the result of simulation.

Based on the result of simulations in FIG. 19 and FIG. 20, it is preferred for reducing the on-resistance that the area of the source region (source cell region 50, source electrode 14, or active cell region 70) is larger than the area of the drain region (drain lead-out region 51, drain electrode 15, or drain contact region 24) and, particularly preferably that the area ratio of the source region and the drain region is 6:4 (=3:2).

Further, it can be also be said that the number of the external source terminals 2 is preferably larger than the number of the external drain terminals 3 and the ratio of the number of the external source terminals 2 and external drain terminals 3 is, particularly preferably, 6:4 (=3:2). In this embodiment, the on-resistance can further be reduced since the number of the external source terminals 2 is three, the number of the external drain terminals 3 is two, and the ratio between the source electrodes 14 and the drain electrodes 15 (source region and the drain region) is also 3:2 to 4:2 as illustrated in FIG. 1.

As described above in this embodiment, it is noted for the semiconductor device of the CSP structure that decrease of the back surface resistance component is important and the source region and the drain region are disposed being close to each other as far as the layout permits to ensure a wide boundary region between the source region and the drain region. Thus, since the current path is widened, it is possible to decrease the back surface resistance component and reduce the on-resistance. Accordingly, products of low on-resistance can be manufactured without increasing the manufacturing cost.

Second Embodiment

This embodiment is to be described with reference to the drawings. This embodiment is other example of a semiconductor device having a pad layout of two rows×three columns.

Figure 21:
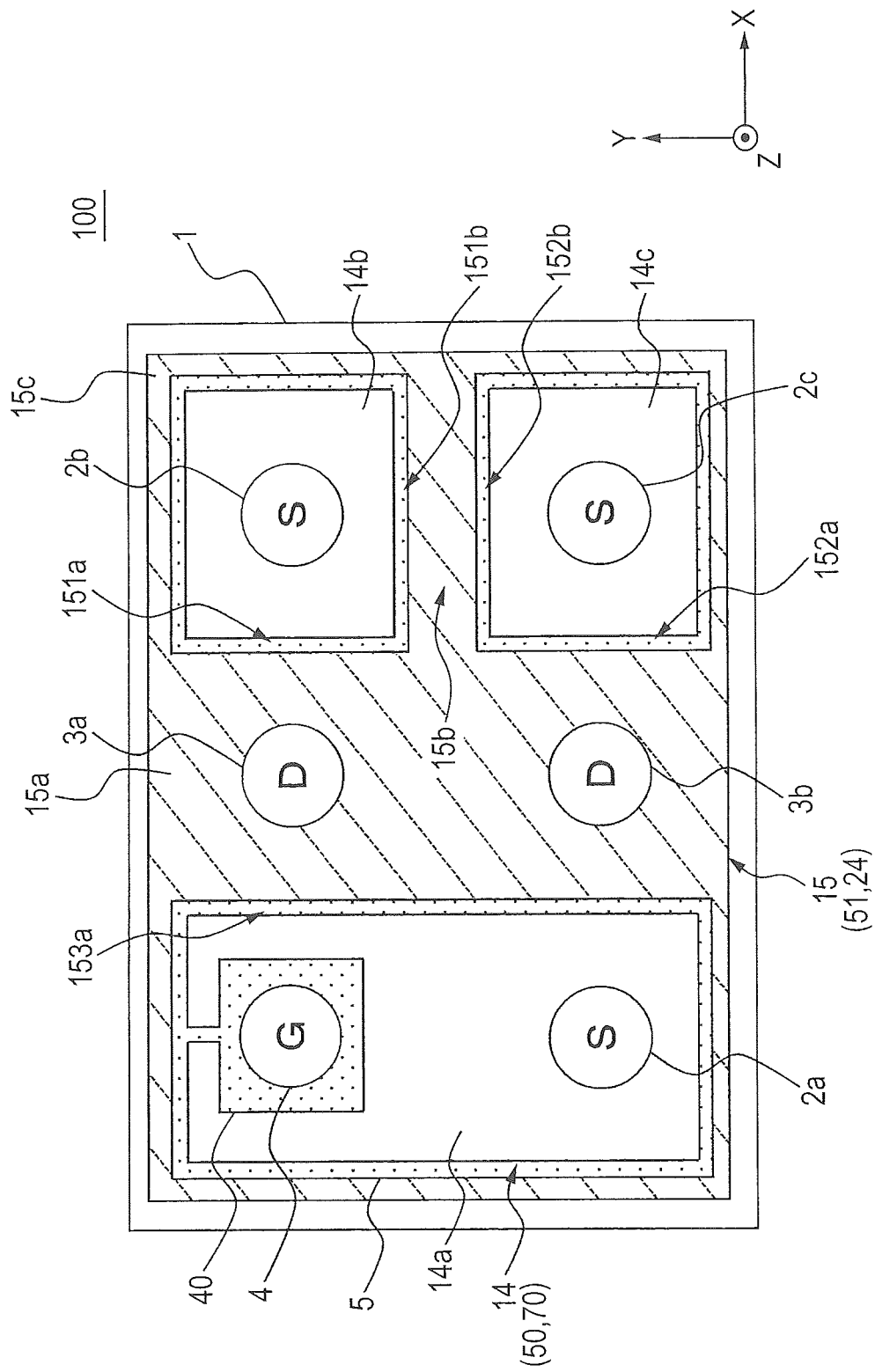
FIG. 21 is a plan view illustrating a planar configurational example of a semiconductor device according to a second embodiment.

FIG. 21 is a plan view illustrating an example of a semiconductor device 100 according to this embodiment. The semiconductor device 100 in FIG. 21 is an example having a pad layout of two rows×three columns in which arrangement of an external gate terminal 4, external drain terminals 3, and external source terminals 2 is identical with that in FIG. 1. Source electrodes 14 are continuous and drain electrodes 15 are separated in the example of FIG. 1, whereas the drain electrodes 15 are continuous and the source electrodes 14 are separated in the example of FIG. 21.

In FIG. 21, the source electrode 14 comprises a rectangular source electrode portion 14a that extends from the periphery of the external gate terminal 4 to the periphery of an external source terminal 2a, and a substantially square source electrode portion 14b at the periphery of the external source terminal 2b and a substantially square source electrode portion 14c at the periphery of external source terminal 2c. The source electrode portion 14a and the source electrode portion 14b and the source electrode portion 14c are isolated by way of the drain electrode 15 (15a), and the source electrode portion 14b and the source electrode portion 14c are separated by way of the drain electrode 15 (15b). It can be said that each one external source terminal 2 is disposed to the separated source electrode 14 (source region) in this example.

Further, the drain electrode 15 comprises a rectangular drain electrode portion 15a that extends from the periphery of the external drain terminal 3a to the periphery of the external drain terminal 3b, a rectangular drain electrode portion 15b that extends from the central portion of the drain electrode portion 15a to the outer peripheral end of the silicon substrate 1, and an EQR electrode 15c. The drain electrode portion 15a, the drain electrode portion 15b, and the EQR electrode 15c are formed integrally and connected electrically.

In the example of FIG. 21, since external source terminals are disposed on both ends of the external drain terminals, the back surface resistance can be decreased. Further, since the drain electrodes 15 and the source electrode 14 are opposed each other along more sides (151a, 151b, 152a, 152b, 153a) than those of the first comparative example, the boundary region between the source electrode and the drain electrode can be widened to decrease the back surface resistance. Further, the area ratio between the source region and the drain region is identical with that of FIG. 1, and the on-resistance can be reduced further.

Figure 22:
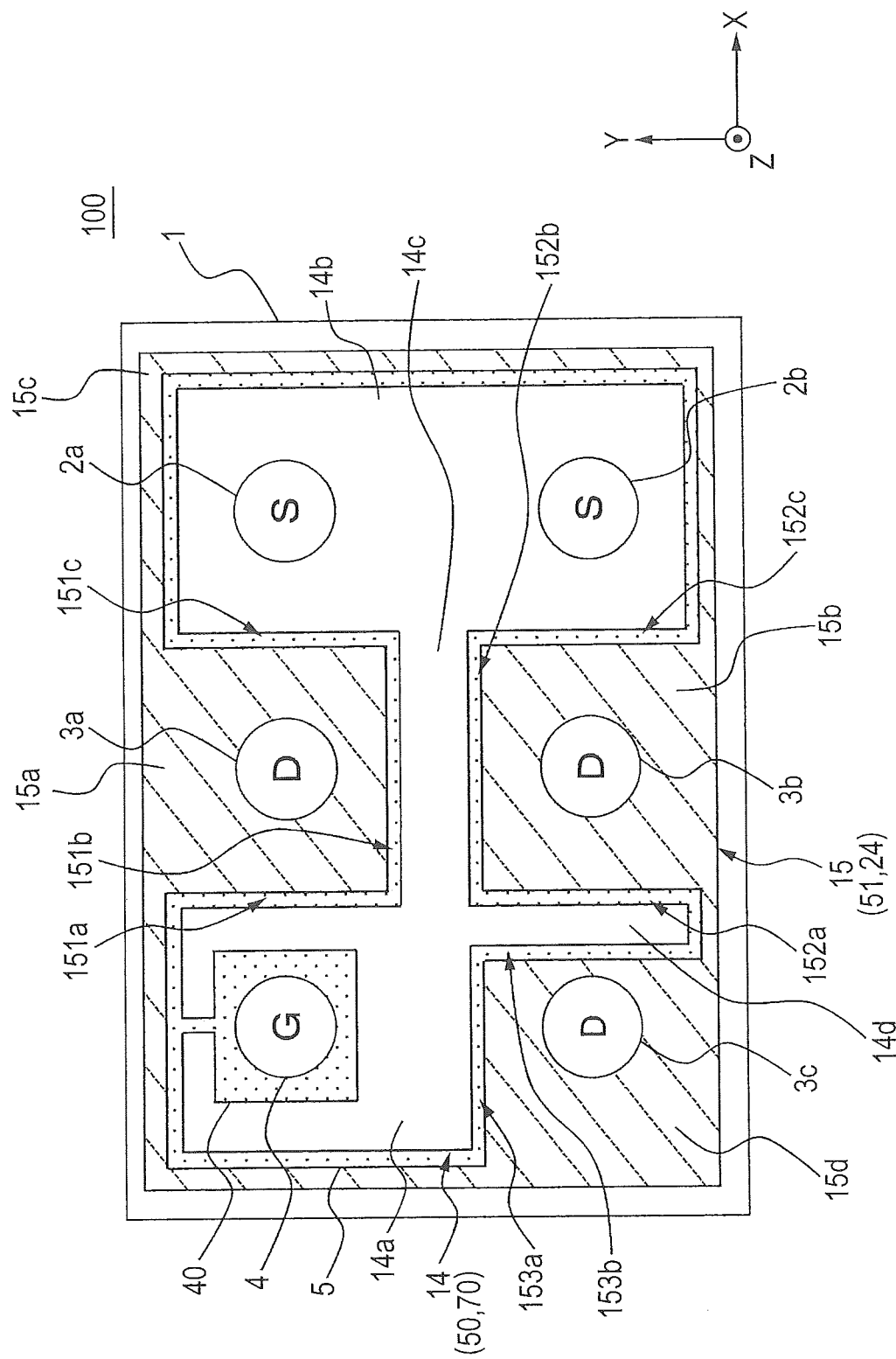
FIG. 22 is a plan view illustrating a planar configurational example of the semiconductor device according to the second embodiment.

FIG. 22 is a plan view illustrating other example of the semiconductor device 100 according to this embodiment. The semiconductor device 100 in FIG. 22 is an example having a pad layout of two rows×three columns and has two external source terminals 2a and 2b, three external drain terminals 3a to 3c, and one external gate terminal 4.

In FIG. 22, external source terminals 2a and 2b are disposed on one end over the surface of a silicon substrate 1, and external drain terminals 3a to 3c are collectively disposed from the central portion to the other end over the surface of the silicon substrate 1. That is, an external gate terminal 4, the external drain terminal 3a, and the external source terminal 2a are disposed in this order in the first row, and the external drain terminal 3c, the external drain terminal 3b, and the external source terminal 2b are disposed in this order in the second row. The external drain terminal 3c is disposed at the position for the external source terminal 2a in FIG. 1.

In the example of FIG. 22, a source electrode 14 comprises a rectangular source electrode portion 14a at the periphery of the external gate terminal 4, a rectangular source electrode portion 14b that extends from the periphery of the external source terminal 2a to the periphery of the external source terminal 2b, a rectangular source electrode portion 14c between the external drain terminal 3a and the external drain terminal 3b, and a rectangular source electrode portion 14d between the external drain terminal 3c and the external drain terminal 3b. The source electrode portions 14a to 14d are formed integrally and connected electrically.

Further, the drain electrode 15 comprises a substantially square drain electrode portion 15a at the periphery of the external drain terminal 3*a*, a substantially square drain electrode portion 15*b* at the periphery of the external drain terminal 3*b*, a substantially square drain electrode portion 15*d* at the periphery of the external drain terminal 3*c*, and an EQR electrode 15*c*. The drain electrode portion 15*a* and the drain electrode portion 15*b* are isolated by way of the source electrode portion 14*c*, and the drain electrode portion 15*b* and the drain electrode portion 15*d* are isolated by way of the source electrode portion 14*d*. The drain electrode portion 15*a* and the drain electrode portions 15*b* and 15*d* are formed integrally and connected electrically by way of the EQR electrode 15*c*.

In the example of FIG. 22, since the external source terminals and the external drain terminals are disposed collectively and the area ratio between the source region and the drain region is 2:3, this provides a less effect of reducing the on-resistance compared with the configuration of FIG. 1. However, in FIG. 22, one drain electrode portion 15*a* or 15*b* is opposed to the source electrode 14 at least along three sides (151*a* to 151*c*, or 152*a* to 152*c*). Further, it can also be said that the entire drain electrode 15 are opposed to the source electrodes 14 along 8 sides (151*a* to 151*c*, 152*a* to 152*c*, 153*a*, and 153*b*). Accordingly, since the boundary region between the source electrode and the drain electrode is widened, the back surface resistance can be decreased.

Figure 23:
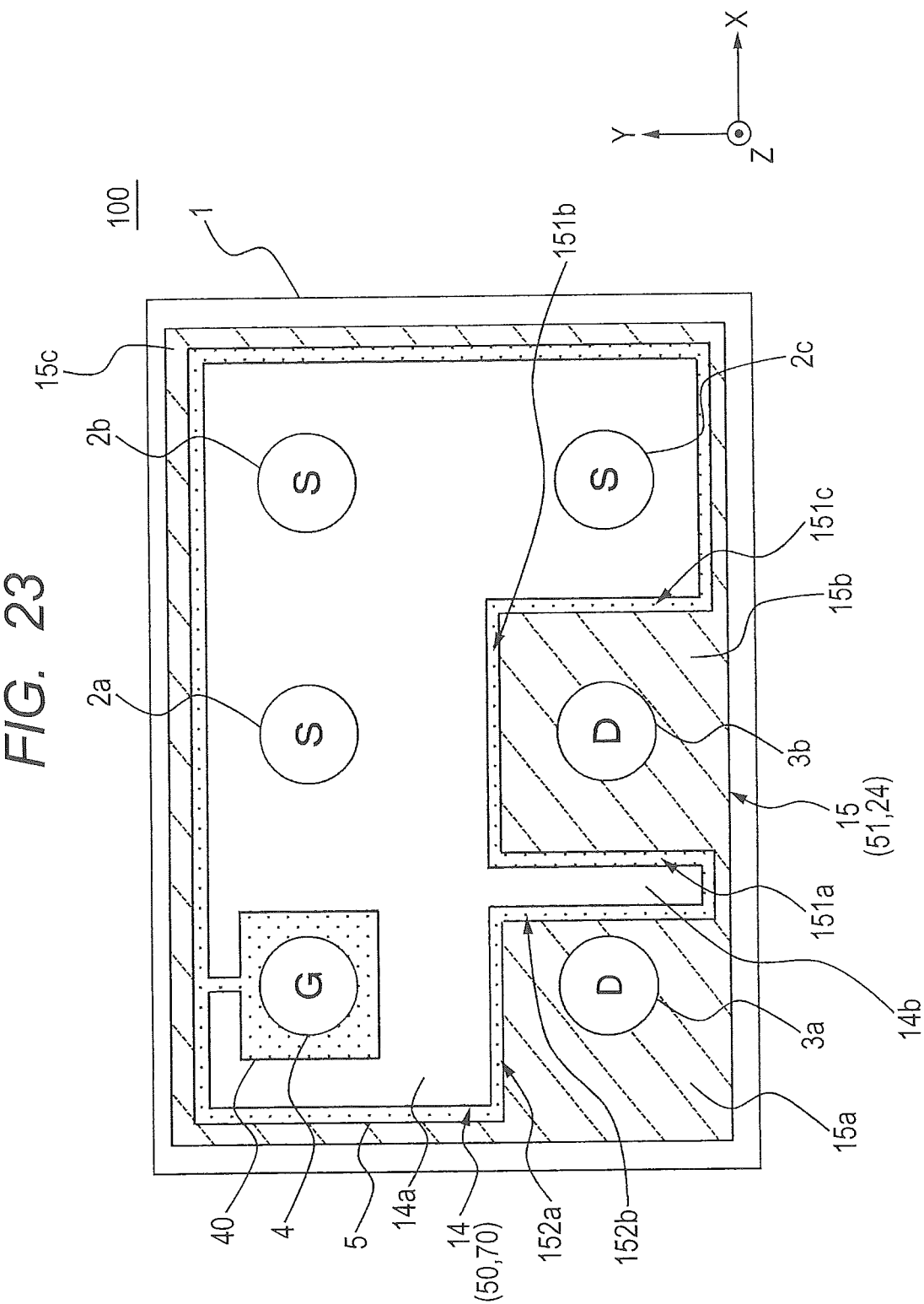
FIG. 23 is a plan view illustrating a planar configurational example of the semiconductor device according to the second embodiment.

FIG. 23 is a plan view illustrating other example of the semiconductor device 100 according to this embodiment. The semiconductor device 100 of FIG. 23 is an example having a pad layout of two rows×three columns and comprises three external source terminals 2*a* to 2*c*, two external drain terminals 3*a*, and 3*b* and one external gate terminal 4.

In FIG. 23, the external source terminals 2*a* to 2*c* are collectively disposed from the central portion to one end over the surface of a silicon substrate 1, and the external drain terminals 3*a* and 3*b* are disposed from the central portion to the other end over the surface of the silicon substrate 1. That is, the external gate terminal 4, the external source terminal 2*a*, and the external source terminal 2*b* are disposed in this order in the first row, and the external drain terminal 3*a*, the external drain terminal 3*b*, and the external source terminal 2*c* are disposed in this order in the second row. The external drain terminal 3*a* is disposed at the position for the external source terminal 2*a* in FIG. 1, and an external source terminal 2*a* is disposed at a position for the external drain terminal 3*a* in FIG. 1.

In the example of FIG. 23, the source electrode 14 comprises an L-shaped source electrode portion 14*a* that extends while meandering from the periphery of the external gate terminal 4, to the periphery of the external source terminal 2*a*, the periphery of the external source terminal 2*b*, and the external source terminal 2*c*, and a rectangular source electrode portion 14*b* between the external drain terminal 3*a* and the external drain terminal 3*b*. The source electrode portions 14*a* and 14*b* are formed integrally and connected electrically.

Further, the drain electrode 15 comprises a substantially square drain electrode portion 15*a* at the periphery of the external drain terminal 3*a*, a substantially square drain electrode portion 15*b* at the periphery of the external drain terminal 3*b*, and an EQR electrode 15*c*. The drain electrode portion 15*a* and the drain electrode portion 15*b* are isolated by way of the source electrode portion 14*b*. The drain electrode portion 15*a* and the drain electrode portion 15*b* are formed integrally and connected electrically by way of the EQR electrode 15*c*.

In the example of FIG. 23, the external source terminals and the external drain terminals are disposed collectively and provide a less effect of reducing the on-resistance compared with the configuration in FIG. 1. However, in FIG. 23, the drain electrode portion 15*b* is opposed to the source electrode 14 at least along three sides (151*a* to 151*c*) in the same manner as in FIG. 1. Further, it can also be said that the entire drain electrodes 15 are opposed to the source electrodes 14 along five sides (151*a* to 151*c*, 152*a*, and 152*b*). Accordingly, since the boundary region between the source electrode and the drain electrode is widened, the back surface resistance can be decreased. Further, the area ratio between the source region and the drain region is identical with that of FIG. 1 and the on-resistance can be reduced further.

Figure 24:
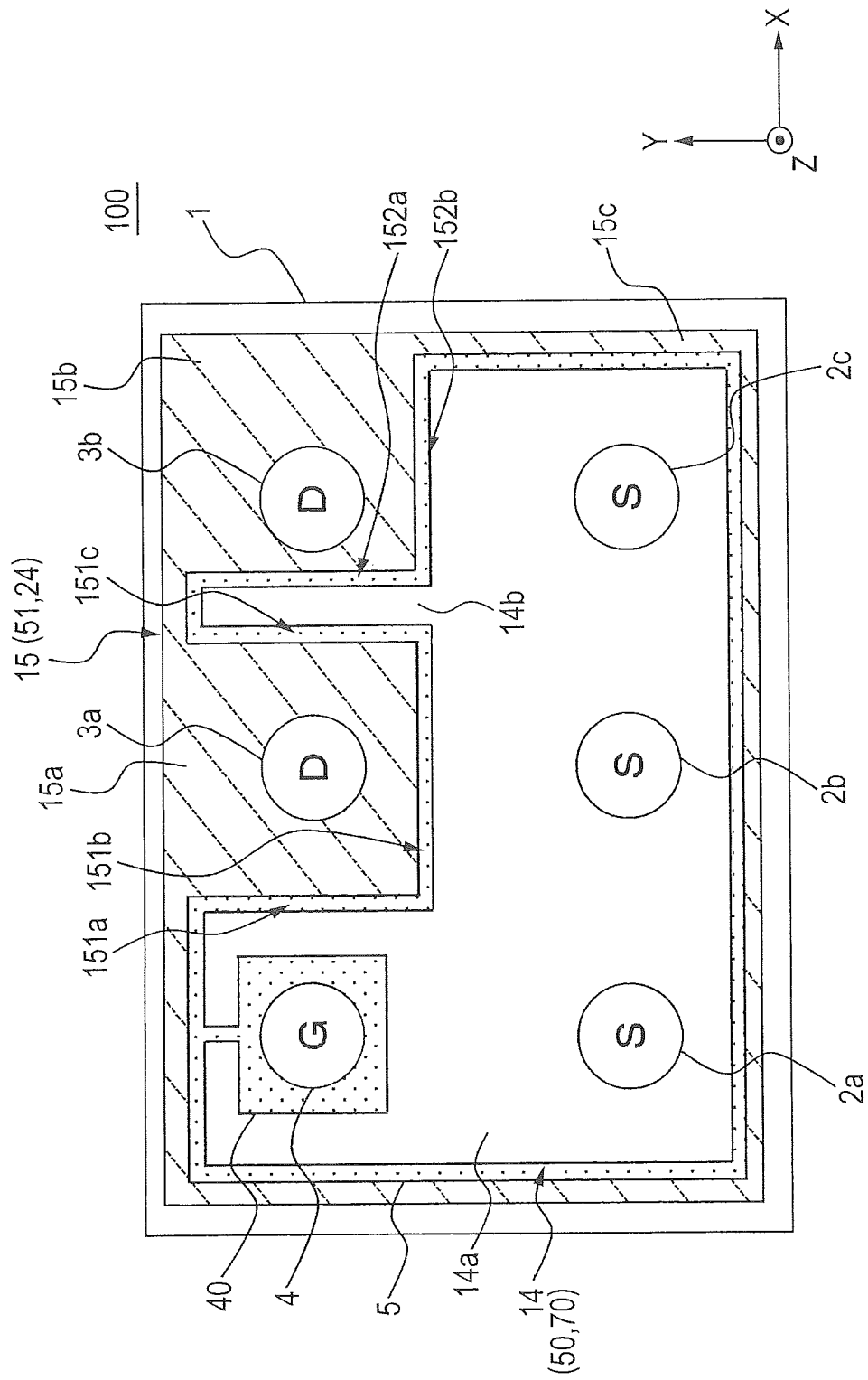
FIG. 24 is a plan view illustrating a planar configurational example of the semiconductor device according to the second embodiment.

FIG. 24 is a plan view illustrating other example of the semiconductor device 100 according to this embodiment. The semiconductor device 100 in FIG. 24 is an example having a pad layout of two rows×three columns and comprises three external source terminals 2*a* to 2*c*, two external drain terminals 3*a* and 3*b*, and one external gate electrode 4.

In FIG. 24, the external source terminals 2*a* to 2*c* are disposed collectively on one end over the silicon substrate 1 and the external drain terminals 3*a* and 3*b* are disposed on the other end over the surface of the silicon substrate 1. That is, the external gate terminal 4, the external drain terminal 3*a*, and the external drain terminal 3*b* are disposed in this order in the first row, and the external source terminal 2*a*, the external source terminal 2*b*, and the external source 2*c* are disposed in this order in the second row. The external drain terminal 3*b* is disposed at a position for the external source terminal 2*b* in FIG. 1, and the external source terminal 2*b* is disposed at a position for the external drain terminal 3*b* in FIG. 1.

In the example of FIG. 24, the source electrode 14 comprises an L-shaped source electrode portion 14*a* that extends while meandering from the periphery of the external gate terminal 4, to the periphery of the external source terminal 2*a*, the periphery of the external source terminal 2*b*, and the periphery of the external source terminal 2*c*, and a rectangular source electrode portion 14*b* between the external drain terminal 3*a* and the external drain terminal 3*b*. The source electrode portions 14*a* and 14*b* are formed integrally and connected electrically.

Further, the drain electrode 15 comprises a substantially square drain electrode portion 15*a* at the periphery of the external drain terminal 3*a*, a substantially square drain electrode portion 15*b* at the periphery of the external drain terminal 3*b*, and an EQR electrode 15*c*. The drain electrode portion 15*a* and the drain electrode portion 15*b* are isolated by way of the source electrode portion 14*b*. The drain electrode portion 15*a* and the drain electrode portion 15*b* are formed integrally and connected electrically by way of the EQR electrode 15*c*.

In the example of FIG. 24, the external source terminals and the external drain terminals are disposed collectively and provide a less effect of reducing the on-resistance compared with the configuration in FIG. 1.

However, in FIG. 24, the drain electrode portion 15*a* is opposed to the source electrode 14 at least along three sides (151*a* to 151*c*) in the same manner as in FIG. 1. Further, it can also be said that the entire drain electrodes 15 are opposed to the source electrode 14 along five sides (151*a* to 151*c*, 152*a*, and 152*b*). Accordingly, since the boundary region between the source electrode and the drain electrode is widened, the back surface resistance can be decreased. Further, the area ratio between the source region and the drain region is identical with that in FIG. 1 and the on-resistance can be reduced further.

Figure 25:
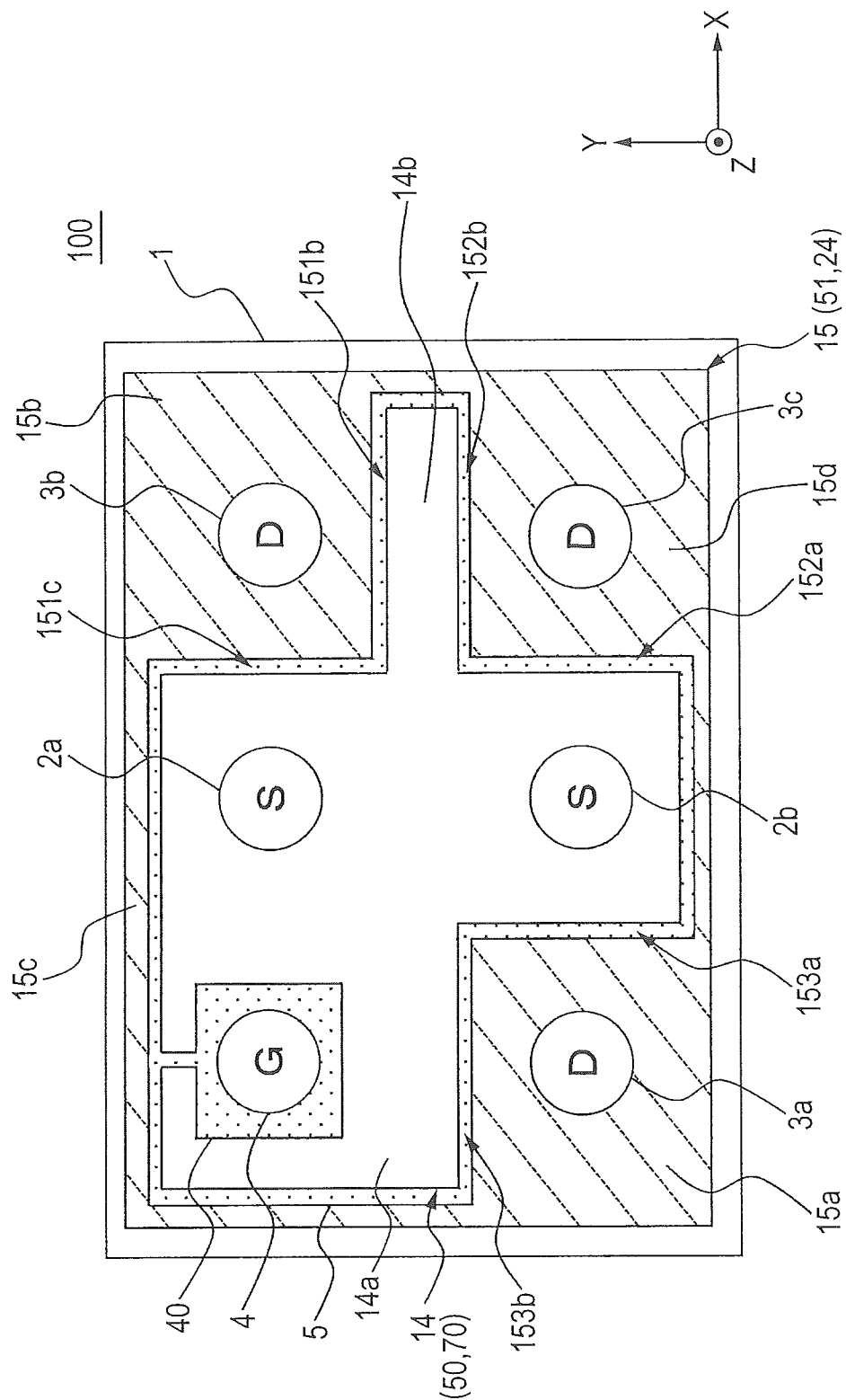
FIG. 25 is a plan view illustrating a planar configurational example of the semiconductor device according to the second embodiment.

FIG. 25 is a plan view illustrating other example of the semiconductor device 100 according to this embodiment. The semiconductor device 100 in FIG. 25 is an example having a pad layout of two rows×three columns and comprises two external source terminals 2a and 2b, three external drain terminals 3a to 3c, and one external gate electrode 4.

In FIG. 25, the external drain terminals 3a to 3c are disposed on both sides of the external source terminals 2a and 2b. That is, the external gate terminal 4, the external source terminal 2a, and the external drain terminal 3b are disposed in this order in the first row, and the external drain terminal 3a, the external drain terminal 2b, and the external drain terminal 3c are disposed in this order in the second row. The positions for the external source terminal and the external drain terminal are reversed with respect to those of the example of FIG. 1.

In the example of FIG. 25, the source electrode 14 comprises an L-shaped source electrode portion 14a that extends while meandering from the periphery of the external gate terminal 4, to the periphery of the external source terminal 2a and the periphery of the external source terminal 2b, and a rectangular source electrode portion 14b between the external drain terminal 3b and the external drain terminal 3c. The source electrode portions 14a and 14b are formed integrally and connected electrically.

Further, the drain electrode 15 comprises a substantially square drain electrode portion 15a at the periphery of the external drain terminal 3a, a substantially square drain electrode portion 15b at the periphery of the external drain terminal 3b, a substantially square drain electrode portion 15d at the periphery of the external drain terminal 3c, and an EQR electrode 15c. The drain electrode portion 15a and the drain electrode portions 15b and 15d are isolated by way of the source electrode portion 14a, and the drain electrode portion 15b and the drain electrode portion 15d are isolated by way of the source electrode portion 14b. The drain electrode portion 15a and the drain electrode portions 15b and 15d are formed integrally and connected electrically by way of the EQR electrode 15c.

In the example of FIG. 25, since the area ratio between the source region and the drain region is 2:3, this provides a less effect of reducing the on-resistance compared with the configuration in FIG. 1. However, in FIG. 25, since the external source terminal is disposed adjacent to the external drain terminal in the same manner as in FIG. 1, the back surface resistance can be decreased. Further, since the drain electrode 15 and the source electrode 14 are opposed each other along six sides (151b, 151c, 152a, 152b, 153a, and 153b) which are more than those of the first comparative example, the boundary region between the source electrode and the drain electrode is widened and the back surface resistance can be decreased.

Third Embodiment

This embodiment is to be described with reference to the drawings. This embodiment is other example of a semiconductor device having a pad layout of two rows×four columns.

Figure 26:
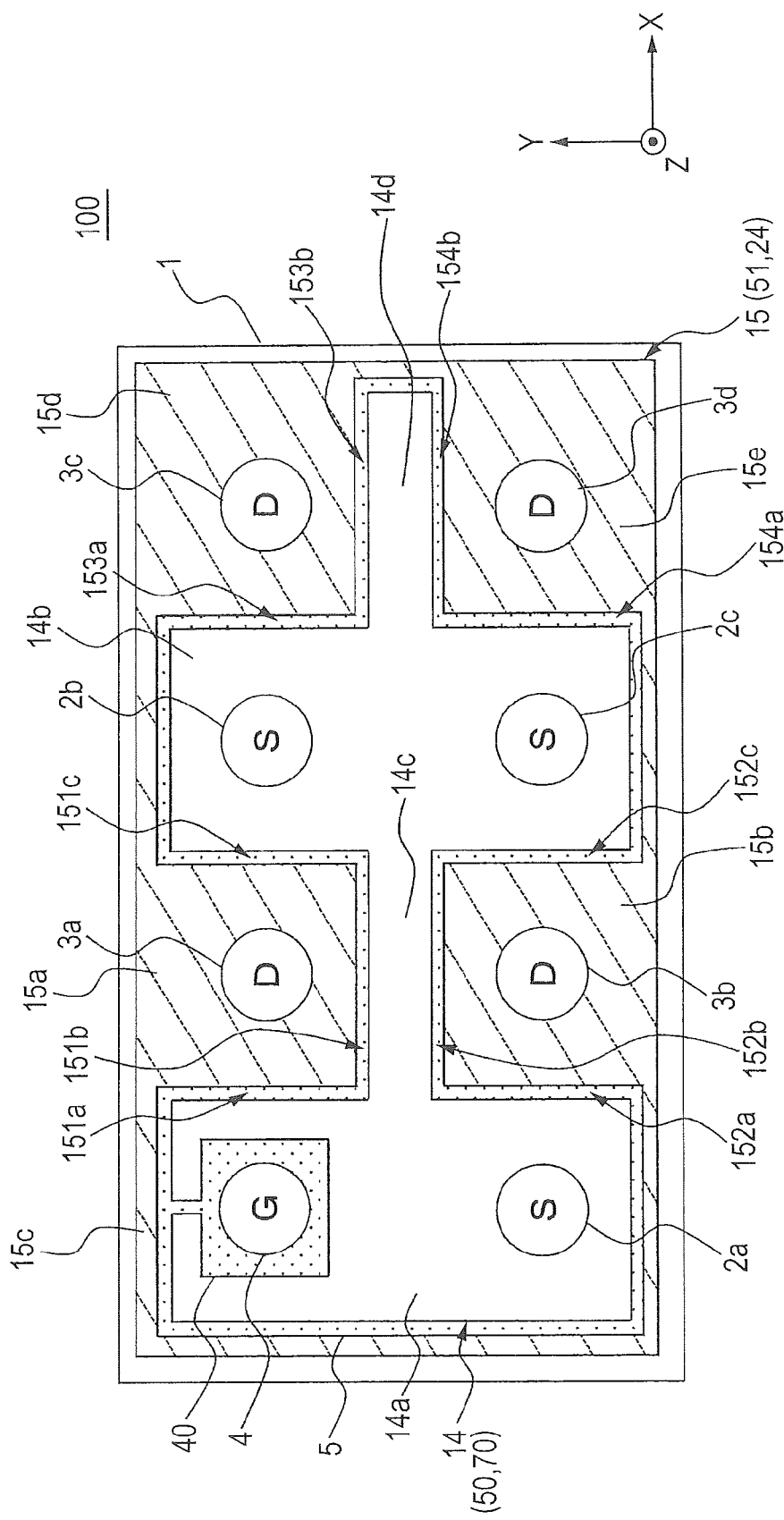
FIG. 26 is a plan view illustrating a planar configurational example of a semiconductor device according to a third embodiment.

FIG. 26 is a plan view illustrating an example of the semiconductor device 100 according to this embodiment. The semiconductor device 100 in FIG. 26 is an example having a 2 row×4 column pad layout and comprises three external source terminals 2a to 2c, four external drain terminals 3a to 3d, and one external gate terminal 4.

In FIG. 26, columns of the external source terminals and columns of the external drain terminals are disposed alternately such that the external source electrode and the external drain electrode are adjacent to each other. That is, an external gate electrode terminal 4, an external drain terminal 3a, an external source terminal 2b, and an external drain terminal 3c are disposed in this order in the first row, and an external source terminal 2a, an external drain terminal 3b, an external source terminal 2c, and an external drain terminal 3b are disposed in this order in the second row. The external drain terminals 3c and 3b are added to the example of FIG. 1.

In the example of FIG. 26, the source electrode 14 comprises a rectangular source electrode portion 14a that extends from the periphery of the external gate terminal 4 to the periphery of the external source terminal 2a, a rectangular source electrode portion 14b that extends from the periphery of the external source terminal 2b to the periphery of the external source terminal 2c, a rectangular source electrode portion 14c between the external drain terminal 3a and the external drain terminal 3b, and a rectangular source electrode portion 14d between the external drain terminal 3c and the external drain terminal 3d. The source electrode portions 14a to 14d are formed integrally and connected electrically.

Further, the drain electrode 15 comprises a substantially square drain electrode portion 15a at the periphery of the external drain terminal 3a, a substantially square drain electrode portion 15b at the periphery of the external drain terminal 3b, a substantially square drain electrode portion 15d at the periphery of the external drain terminal 3c, a substantially square drain electrode portion 15e at the periphery of the external drain terminal 3d, and an EQR electrode 15c. The drain electrode portion 15a and the drain electrode portion 15b are isolated by way of the source electrode portion 14c, and the drain electrode portion 15d and the drain electrode portion 15e are isolated by way of the source electrode portion 14d. The drain electrode portions 15a, 15b, 15d, and 15e are formed integrally and connected electrically by way of the EQR electrode 15c.

In FIG. 26, since the external source terminal is disposed adjacent to the external drain terminal, the back surface resistance can be decreased in the same manner as in the first embodiment. Further, the drain electrode portions 15a and 15b are opposed to the source electrode 14 at least along three sides (151a to 151c, 152a to 152c) in the same manner as in the first embodiment. Further, the drain electrode 15 and the source electrode 14 are opposed each other along 10 sides (151a to 151c, 152a to 152c, 153a, 153b, 154a, and 154b) which are more than those of the first embodiment. Accordingly, the boundary region between the source electrode and the drain electrode is widened and the back surface resistance can be decreased further.

Figure 27:
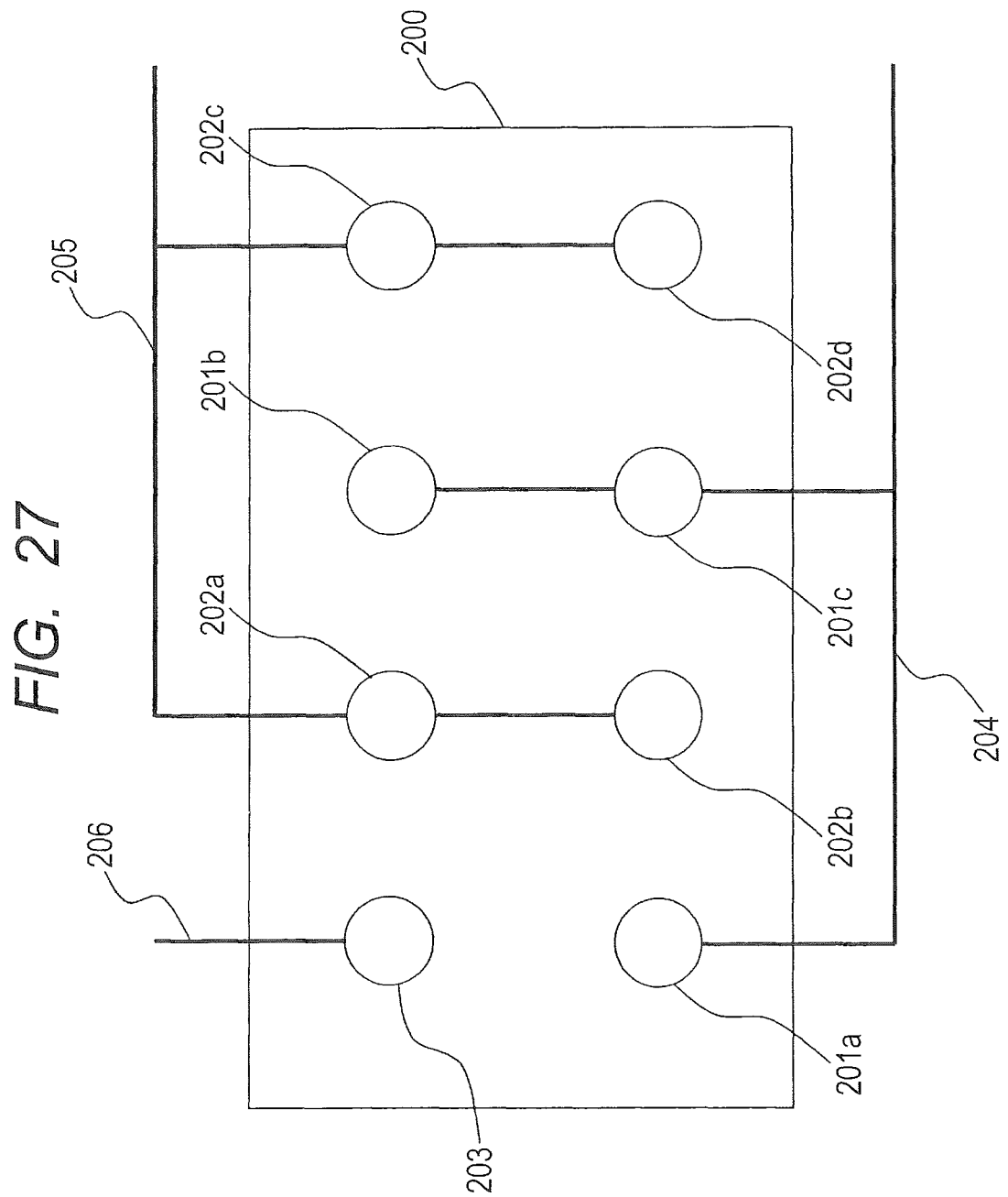
FIG. 27 is a view illustrating an interconnection example of a mounting substrate for mounting the semiconductor device according to the third embodiment.

FIG. 27 illustrates an interconnection example of a mounting substrate for mounting the semiconductor device 100 in FIG. 26. As illustrated in FIG. 27, the mounting substrate 200 is formed with mounting terminals corresponding to the positions for the external source terminal 2, the external drain terminal 3, and the external gate terminal 4 of the semiconductor device 100 and as interconnect is connected to each of the mounting terminals in the same manner as in the first embodiment.

Mounting terminals 201a to 201c are formed at positions corresponding to the external source terminals 2a to 2c respectively and a source interconnect 204 is connected in common with the mounting terminals 201a to 201c.

Mounting terminals 202a to 202d are formed at positions corresponding to external drain terminals 3a to 3d, respectively, and a drain interconnect 205 is connected in common with the mounting terminals 202a to 202d.

A mounting terminal 203 is formed at a position corresponding to the external gate terminal 4 and a gate interconnect 206 is connected to the mounting terminal 203.

As described above, in this embodiment, since a column of the external drain terminals is disposed between columns of the external source terminals and the column of the external source terminals and the column of the external drain terminals are disposed alternately in the same manner as in the first embodiment, interconnect of the mounting substrate can also be simplified.

Figure 28:
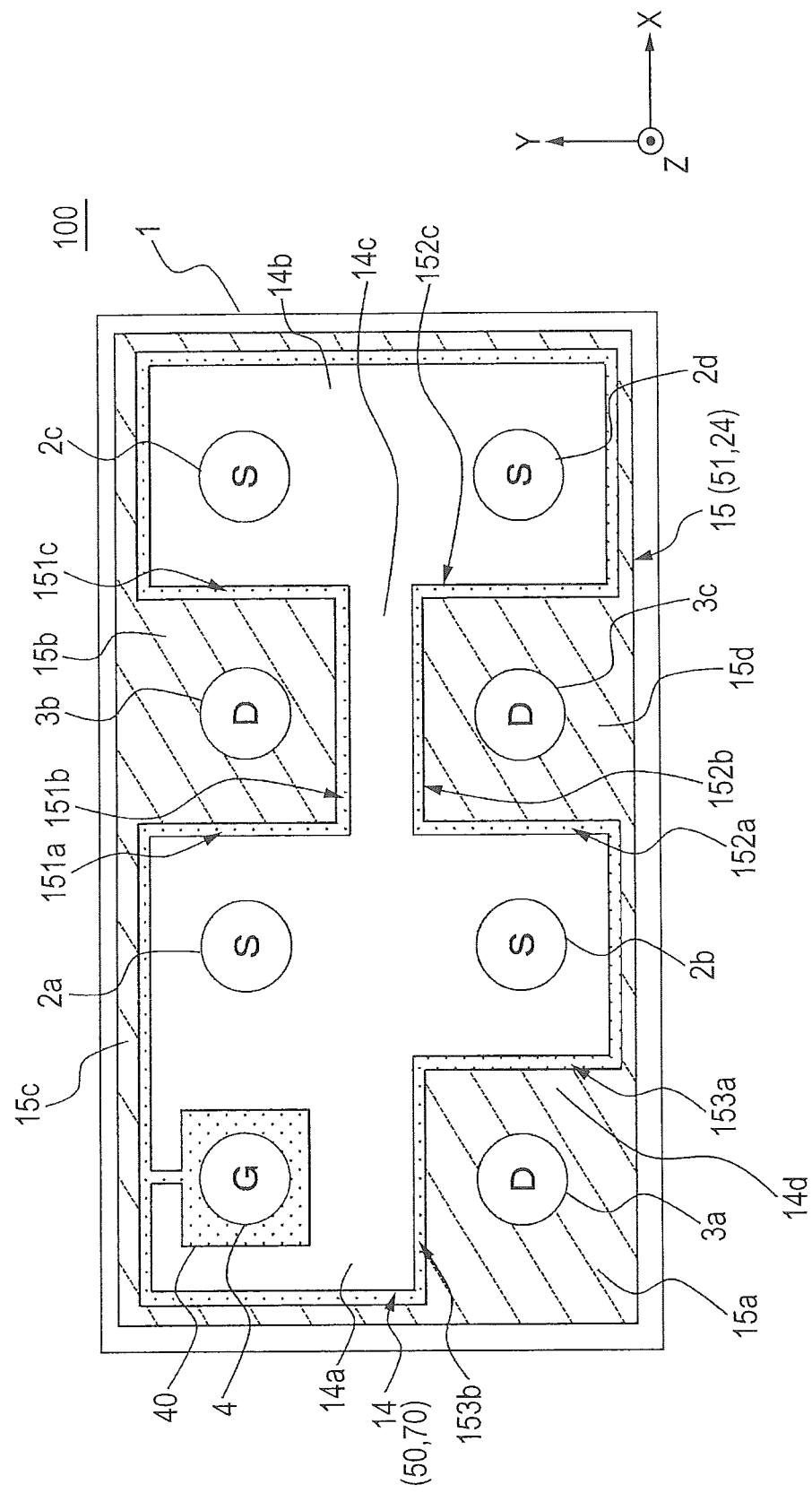
FIG. 28 is a plan view illustrating a planar configuration example of the semiconductor device according to the third embodiment.

FIG. 28 is a plan view illustrating other example of the semiconductor device 100 according to this embodiment. The semiconductor device 100 of FIG. 28 is an example having a pad layout of two rows×four columns and comprises four external source terminals 2a to 2d, three external drain terminals 3a to 3c, and one external gate terminal 4.

In FIG. 28, a column of external source terminals and a column of external drain terminals are disposed alternately such that the external source terminal and the external drain terminal are adjacent each other respectively. That is, the external gate terminal 4, the external source terminal 2a, the external drain terminal 3b, and the external source terminal 2c are disposed in this order in the first row, and the external drain terminal 3a, the external source terminal 2b, the external drain terminal 3c, and the external source terminal 2d are disposed in this order in the second row. The external source terminals 2c and 2d are added to the example of FIG. 25.

In the example of FIG. 28, the source electrode 14 comprises an L-shaped source electrode portion 14a that extends while meandering from the periphery of the external gate terminal 4 to the periphery of the external source terminal 2a and the periphery of the external source terminal 2b, a rectangular source electrode portion 14b that extends from the periphery of the external source terminal 2c to the periphery of the external source terminal 2d, and a rectangular source electrode portion 14c between the external drain terminal 3b and the external drain terminal 3c. The source electrode portions 14a to 14c are formed integrally and connected electrically.

Further, the drain electrode 15 comprises a substantially square drain electrode portion 15a at the periphery of the external drain terminal 3a, a substantially square drain electrode portion 15b at the periphery of the external drain terminal 3b, a substantially square drain electrode portion 15d at the periphery of the external drain terminal 3c, and an EQR electrode 15c.

The drain electrode portion 15a and the drain electrode portions 15b and 15d are isolated by way of the source electrode portion 14a, and the drain electrode portion 15b and the drain electrode portion 15d are isolated by way of the source electrode portion 14c. The drain electrode portion 15a and the drain electrode portions 15b and 15d are formed integrally and connected electrically by way of the EQR electrode 15c.

In FIG. 28, since the external source terminal is disposed adjacent to the external drain terminal in the same manner as in the first embodiment, the back surface resistance can be decreased. Further, each of the drain electrode portions 15b and 15d is opposed to the source electrode 14 at least along three sides (151a to 151c, 152a to 152c). Further, the drain electrode 15 and the source electrode 14 are opposed each other along eight sides (151a to 151c, 152a to 152c, 153a, 153b) which are more than those of the first embodiment.

Accordingly, the boundary region between the source electrode and the drain electrode is widened and the back surface resistance can be decreased further. Further, the area ratio between the source region and the drain region is 4:3 and the on-resistance can be reduced further compared with the configuration in FIG. 26.

Figure 29:
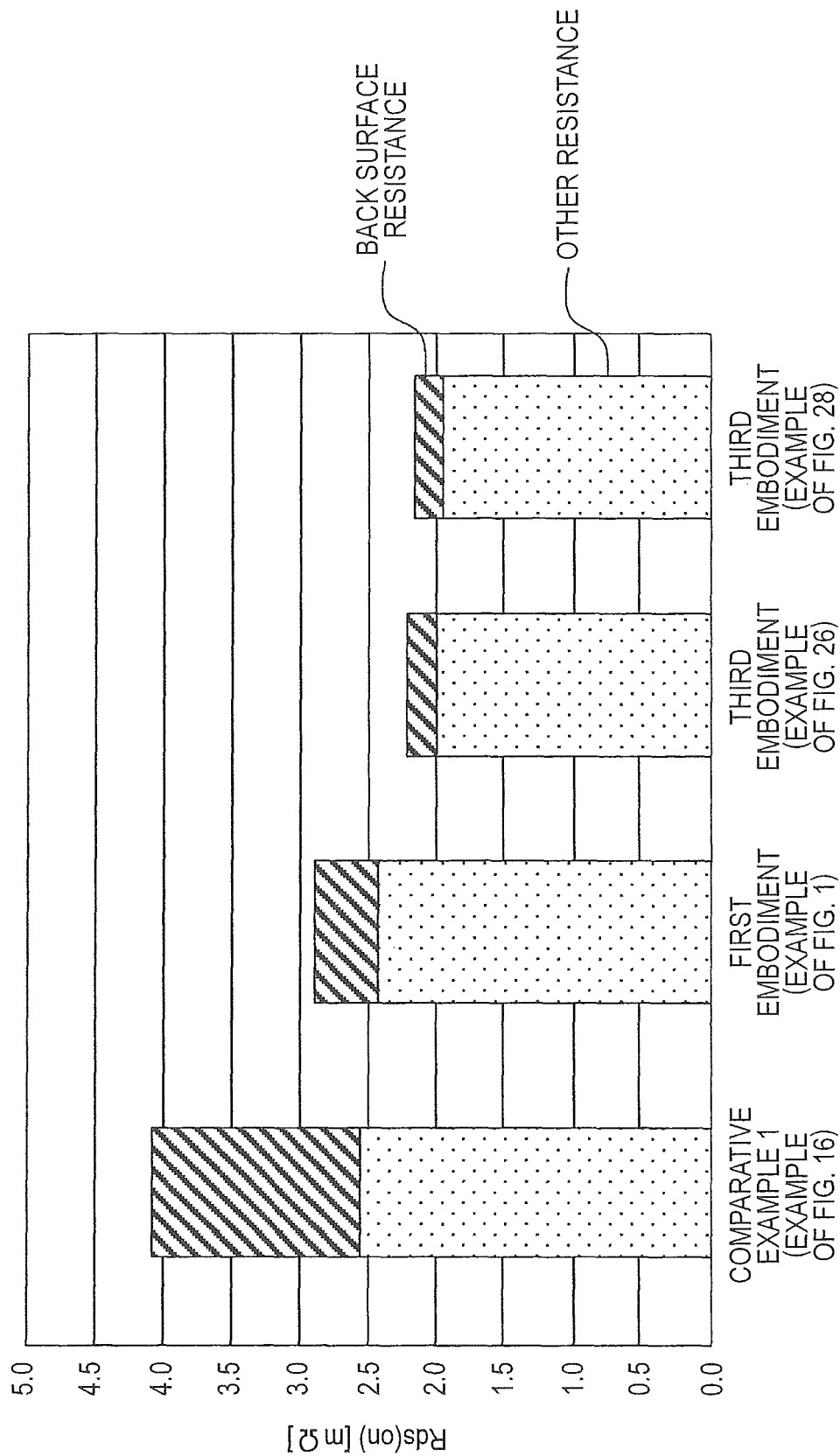
FIG. 29 is a graph illustrating the result of simulation on the semiconductor device according to the third embodiment.

FIG. 29 illustrates the result of simulation on the on-resistance of the semiconductor devices of the first comparative example, the first embodiment, and this embodiment shown in FIG. 26 and FIG. 28. As illustrated in FIG. 29, in this embodiment of FIG. 26 and FIG. 28, the back surface resistance is about 0.2 mΩ and the on-resistance including the back surface resistance is about 2.1 to 2.2 mΩ. In this embodiment, the back surface resistance can be decreased by about 0.3 mΩ and the on-resistance can be reduced further compared with the first embodiment.

As described above, in this embodiment, the 2-row arrangement pad layout is extended in the direction of the row to increase the number of pads, thereby further increasing the boundary portion between the source region and the drain region. Thus, the back surface resistance can be decreased further and the on-resistance can be reduced.

In addition, when the number of the pads is increased, increase of the on-resistance can be suppressed to a relatively low level in a case where the semiconductor device is connected by soldering or the like to the mounting substrate and if a portion of pads cannot be connected accidentally.

Fourth Embodiment

This embodiment is to be described with reference to the drawings. This embodiment is other example of a semiconductor device having a pad layout of two rows×four columns.

Figure 30:
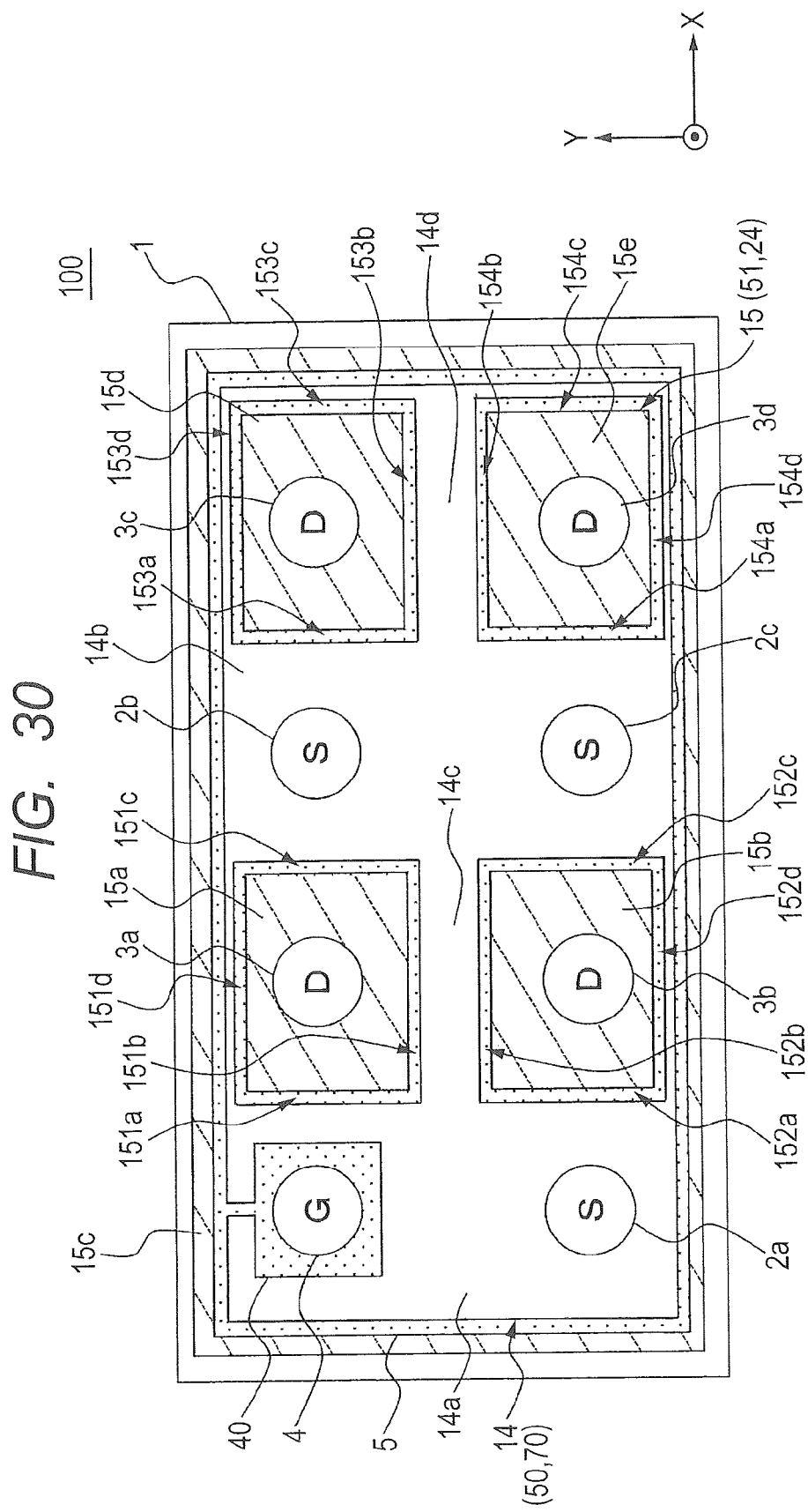
FIG. 30 is a plan view illustrating a planar configurational example of a semiconductor device according to a fourth embodiment.

FIG. 30 is a plan view illustrating other example of a semiconductor device 100 according to this embodiment. The semiconductor device 100 in FIG. 30 is an example having a pad layout of two rows×four columns and comprises three external source terminals 2a to 2c, four external drain terminals 3a to 3d, and one external gate terminal 4. Arrangement of the external terminals is identical with that in FIG. 26. Further, the configuration of the source electrode 14 and the drain electrode 15 is substantially identical with that in FIG. 26.

In FIG. 30, the entire periphery of the drain electrode 15 is surrounded by the source electrode 14. The drain electrode portion 15a is opposed to the source electrode 14 by way of four peripheral opposing sides 151a to 151d, and the drain electrode portion 15b is opposed to the source electrode 14 by way of four peripheral opposing sides 152a to 152d, the drain electrode portion 15d is opposed to the source electrode 14 by way of four opposing sides 153a to 153d, and the drain electrode portion 15e is opposed to the source electrode 14 by way of four peripheral sides 154a to 154d.

Accordingly, since the drain electrode 15 and the source electrode 14 are opposed each other along 16 sides which are more than those of the example in FIG. 26, the boundary region between the source electrode and the drain electrode is widened and the back surface resistance can be decreased further.

Figure 31:
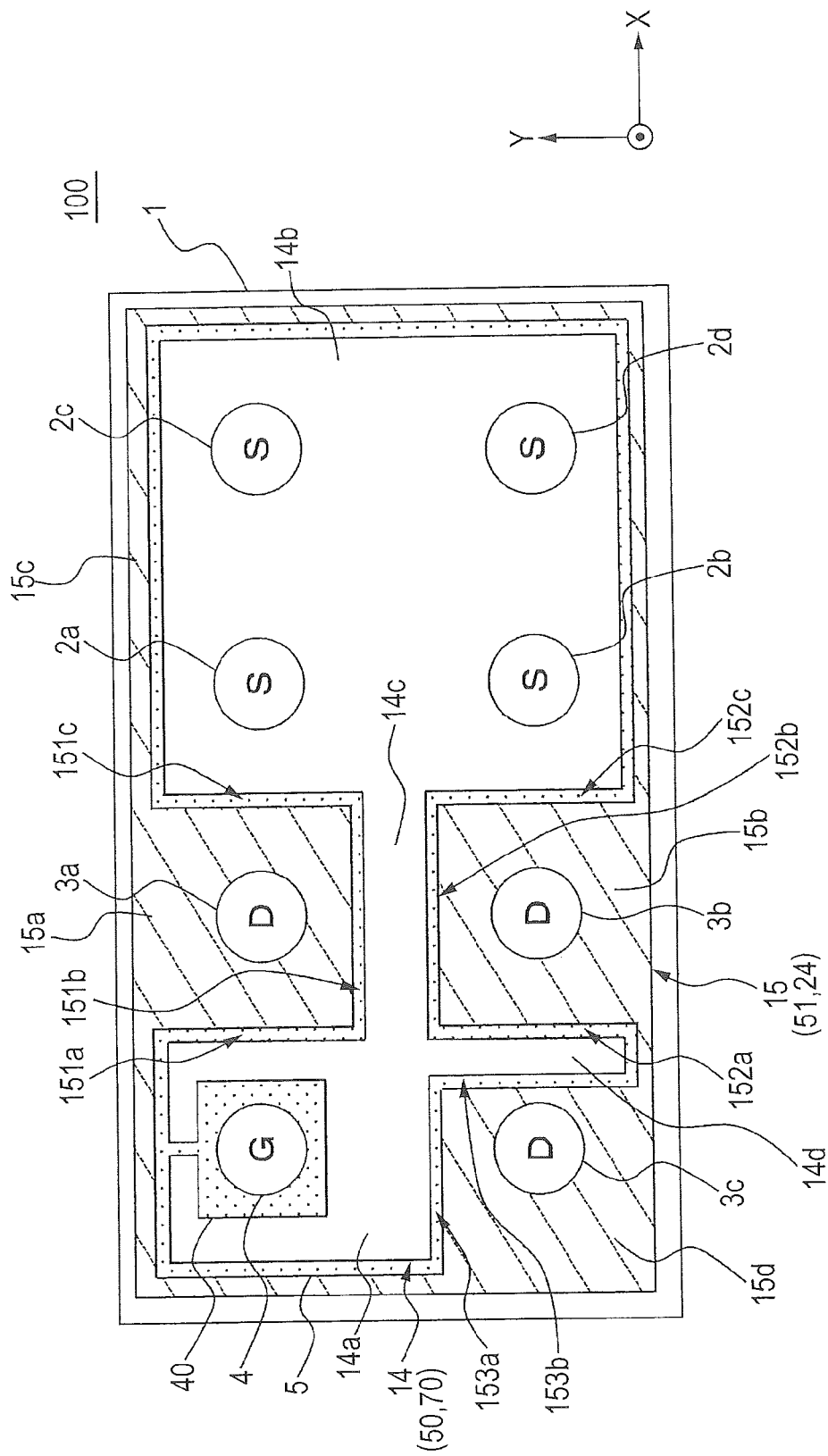
FIG. 31 is a plan view illustrating a planar configurational example of the semiconductor device according to the fourth embodiment.

FIG. 31 is a plan view illustrating other example of the semiconductor device 100 according to this embodiment. The semiconductor device 100 of FIG. 31 is an example having a 2 row×4 column pad layout and comprises four external source terminals 2a to 2d, three external terminals 3a to 3c, and one external gate terminal 4.

In FIG. 31, the external source terminals 2a to 2d are collectively disposed on one end over the surface of a silicon substrate 1, and the external drain terminals 3a to 3c are collectively disposed from a central portion to the other end over the surface of the silicon substrate 1. That is, the external gate terminal 4, the external drain terminal 3a, the external source terminal 2a, and the external source terminal 2c are disposed in this order in the first row, and the external drain terminal 3c, the external drain terminal 3b, the external source terminal 2b, and the external source terminal 2d are disposed in this order in the second row. The external source terminals 2c and 2d are added to the example of FIG. 22.

In the example of FIG. 31, the source electrode 14 comprises a rectangular source electrode portion 14a at the periphery of the external gate terminal 4, a substantially square source electrode portion 14b including the peripheries of the external source terminals 2a to 2d, a rectangular source electrode portion 14c between the external drain terminal 3a and the external drain terminal 3b, and a rectangular source electrode portion 14d between the external drain terminal 3c and the external drain terminal 3b. The source electrode portions 14a to 14d are formed integrally and connected electrically.

Further, the drain electrode 15 comprises a substantially square drain electrode portion 15a at the periphery of the external drain terminal 3a, a substantially square drain electrode portion 15b at the periphery of the external drain terminal 3b, a substantially square drain electrode portion 15d at the periphery of the external drain terminal 3c, and an EQR electrode 15c. The drain electrode portion 15a and the drain electrode portion 15b are isolated by way of the source electrode portion 14c, and the drain electrode portion 15b and the drain electrode portion 15d are isolated by way of the source electrode portion 14d. The drain electrode portion 15a and the drain electrode portions 15b and 15d are formed integrally and connected electrically by way of the EQR electrode 15c.

In the example of FIG. 31, since the external source terminals and the external drain terminals are disposed collectively, they provide a less effect of reducing the on-resistance compared with that obtained by the configurations of FIG. 26 and FIG. 28.

However, in FIG. 31, each of the drain electrode portions 15a and 15b is opposed to the source electrode 14 at least along three sides (151a to 151b, 152a to 152c) in the same manner as in the first embodiment. Further, the drain electrode 15 and the source electrode 14 are opposed each other at eight sides (151a to 151c, 152a to 152c, 153a, 153b) which are more than those of the first embodiment. Accordingly, the boundary region between the source electrode and the drain electrode is widened and the back surface resistance can be decreased further. Further, the area ratio between the source region and the drain region is 4:3 and the on-resistance can be reduced further compared with that of FIG. 26.

Figure 32:
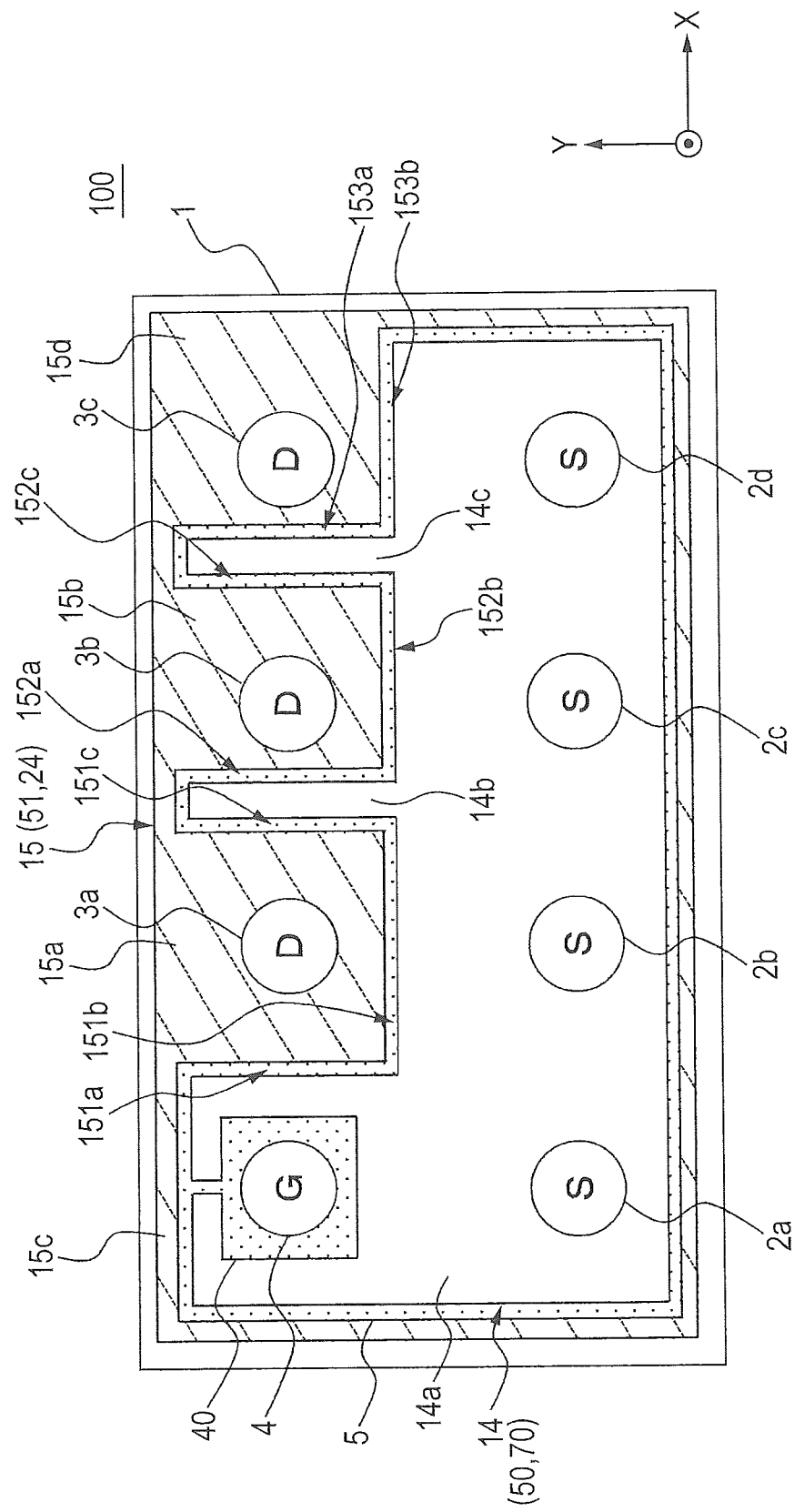
FIG. 32 is a plan view illustrating a planar configurational example of the semiconductor device according to the fourth embodiment.

FIG. 32 is a plan view illustrating other example of the semiconductor device 100 according to this embodiment. The semiconductor device 100 of FIG. 32 is an example having a pad layout of two rows×four columns and comprises four external source terminals 2a to 2d, three external drain terminals 3a to 3c, and one external gate terminal 4.

In FIG. 32, the external source terminals 2a to 2d are collectively disposed on one end over the surface of the silicon substrate 1, and the external drain terminals 3a to 3c are disposed collectively on the other end over the surface of the silicon substrate 1. That is, the external gate terminal 4, the external drain terminal 3a, the external drain terminal 3b, and the external drain terminal 3c are disposed in this order in the first row, and the external source terminal 2a, the external source terminal 2b, the external source terminal 2c, and the external source terminal 2d are disposed in this order in the second row. The external drain terminal 3c and the external drain terminal 2d are added to the example of FIG. 24.

In the example of FIG. 32, the source electrode 14 comprises an L-shaped source electrode portion 14a that extends while meandering from the periphery of the external gate terminal 4, to the periphery of the external source terminal 2a, the periphery of the external source terminal 2b, the periphery of the external source terminal 2c, the periphery of the external source terminal 2d, a rectangular source electrode portion 14b between the external drain terminal 3a and the external drain terminal 3b, and a rectangular source electrode portion 14c between the external drain terminal 3b and the external drain terminal 3c. The source electrode portions 14a to 14c are formed integrally and connected electrically.

Further, the drain electrode 15 comprises a substantially square drain electrode portion 15a at the periphery of the external drain terminal 3a, a substantially square drain electrode portion 15b at the periphery of the external drain terminal 3b, and a substantially square drain electrode portion 15d at the periphery of the external drain terminal 3c, and an EQR electrode 15c. The drain electrode portion 15a and the drain electrode portion 15b are isolated by way of the source electrode portion 14b, and the drain electrode portion 15b and the drain electrode portion 15d are isolated by way of the source electrode portion 14c. The drain electrode portion 15a and the drain electrode portions 15b and 15d are formed integrally and connected electrically by way of the EQR electrode 15c.

In the example of FIG. 32, since the external source terminals and the external drain terminals are disposed collectively, they provide a less effect of reducing the on-resistance compared with the configurations of FIG. 26 and FIG. 28. However, in FIG. 32 each of the drain electrode portion 15a and 15b is opposed to the source electrode 14 at least along three sides (151a to 151c, 152a to 152c) in the same manner as in the first embodiment. Further, the drain electrode 15 and the source electrode 14 are opposed each other along eight sides (151a to 151c, 152a to 152c, 153a, and 153b) which are more than those of the first embodiment. Accordingly, the boundary region between the source electrode and the drain electrode is widened and the back surface resistance can be decreased further. Further, the area ratio between the source region and the drain region is 4:3 and the on-resistance can be reduced further compared with the configuration is FIG. 26.

Fifth Embodiment

This embodiment is to be described with reference to the drawings. This embodiment is an example of a semiconductor device having a pad layout of three rows×three columns.

Figure 33:
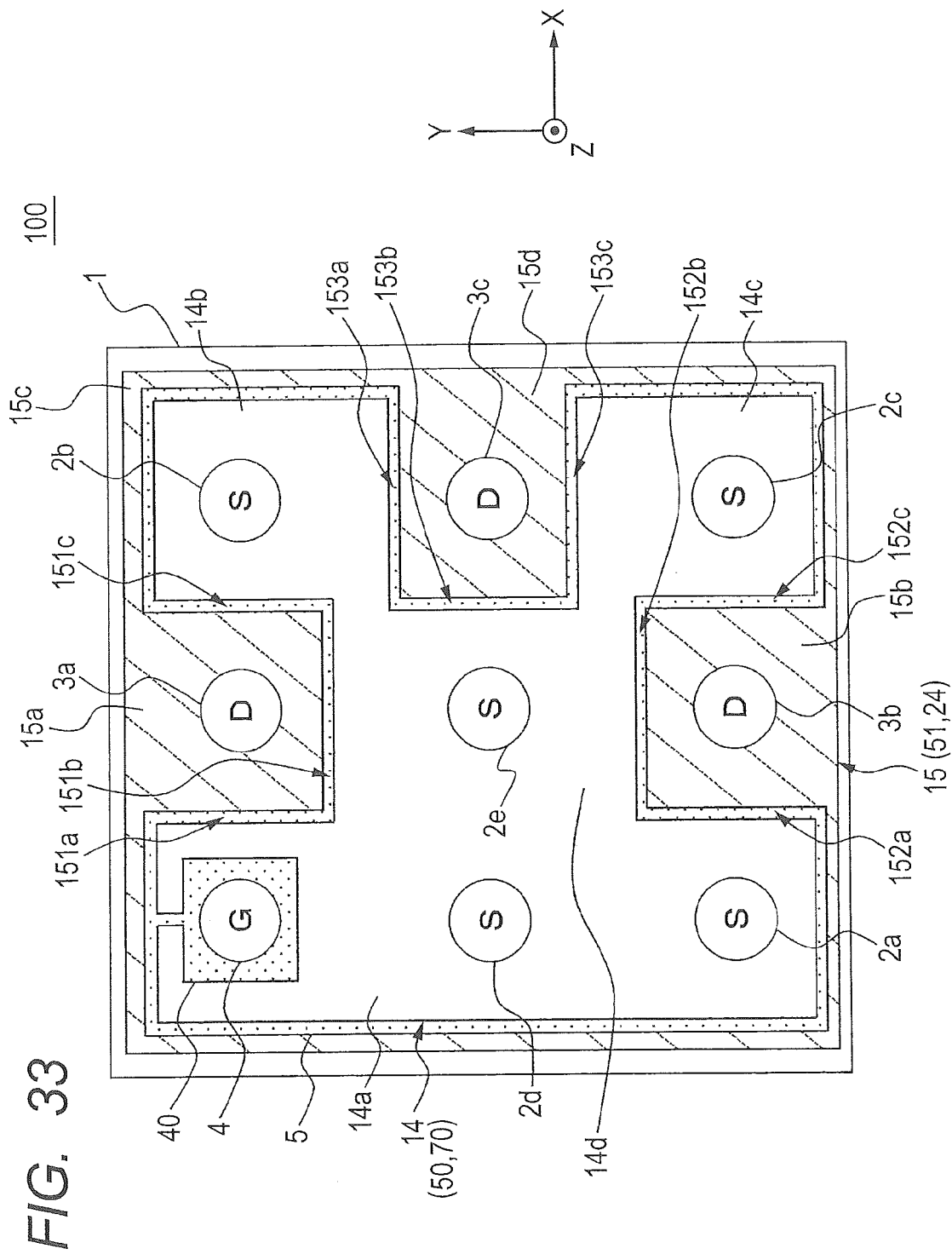
FIG. 33 is a plan view illustrating a planar configurational example of a semiconductor device according to a fifth embodiment.

FIG. 33 is a plan view illustrating an example of the semiconductor device 100 according to this embodiment. The semiconductor device 100 of FIG. 33 is an example having a pad layout of three rows×three columns and comprises five external source terminals 2a to 2e, three external drain terminals 3a to 3c, and one external gate terminal 4.

In FIG. 33, in at least two rows or columns, the external source terminal and the external drain terminal are disposed alternately such that they are adjacent to each other. That is, the external gate terminal 4, the external drain terminal 3a, and the external source terminal 2b are disposed in this order in the first row, the external source terminal 2d, the external source terminal 2e, and the external drain terminal 3c are disposed in this order in the second row, and the external source terminal 2a, the external drain terminal 3b, and the external source terminal 2c are disposed in this order in the third row. The external source terminals 2d and 2e and the external drain terminal 3c are added to the example of FIG. 1.

In the example of FIG. 33, the source electrode 14 comprises a rectangular source electrode portion 14a that extends from the periphery of the external gate terminal 4 to the periphery of the external source terminal 2d and the periphery of the external source terminal 2a, a rectangular source electrode portion 14b at the periphery of the external source terminal 2b, a rectangular source electrode portion 14c at the periphery of the external source terminal 2c, and a rectangular source electrode portion 14d at the periphery of the external source terminal 2e. The source electrode portions 14a to 14d are formed integrally and connected electrically.

Further, the drain electrode 15 comprises a substantially square drain electrode portion 15a at the periphery of the external drain terminal 3a, a substantially square drain electrode portion 15b at the periphery of the external drain terminal 3b, a substantially square drain electrode portion 15d at the periphery of the external drain terminal 3c, and an EQR electrode 15c. The drain electrode portion 15a, the drain electrode portion 15b, and the drain electrode portion 15d are isolated byway of the source electrode portion 14d. The drain electrode portions 15a, 15b and 15d are formed integrally and connected electrically by way of the EQR electrode 15c.

In FIG. 33, since the external source terminal is disposed adjacent to the external drain terminal at least in two rows (first row, second row) or columns (second column, third column), the back surface resistance can be decreased. Further, in the same manner as in the first embodiment, the drain electrode 15 is opposed to the source electrode 14 at least along three sides and, particularly, opposed to the source electrode 14 along three sides in the three drain electrode portions 15a, 15b, and 15d.

That is, the drain electrode 15 and source electrode 14 are opposed each other along more sides (151a to 151c, 152a to 152c, and 153a to 153c) than those of the first embodiment. Accordingly, the boundary region between the source electrode and the drain electrode is widened and the back surface resistance can be decreased further. Further, the area ratio between the source region and the drain region is 5:2 and the on-resistance can further be reduced.

Figure 34:
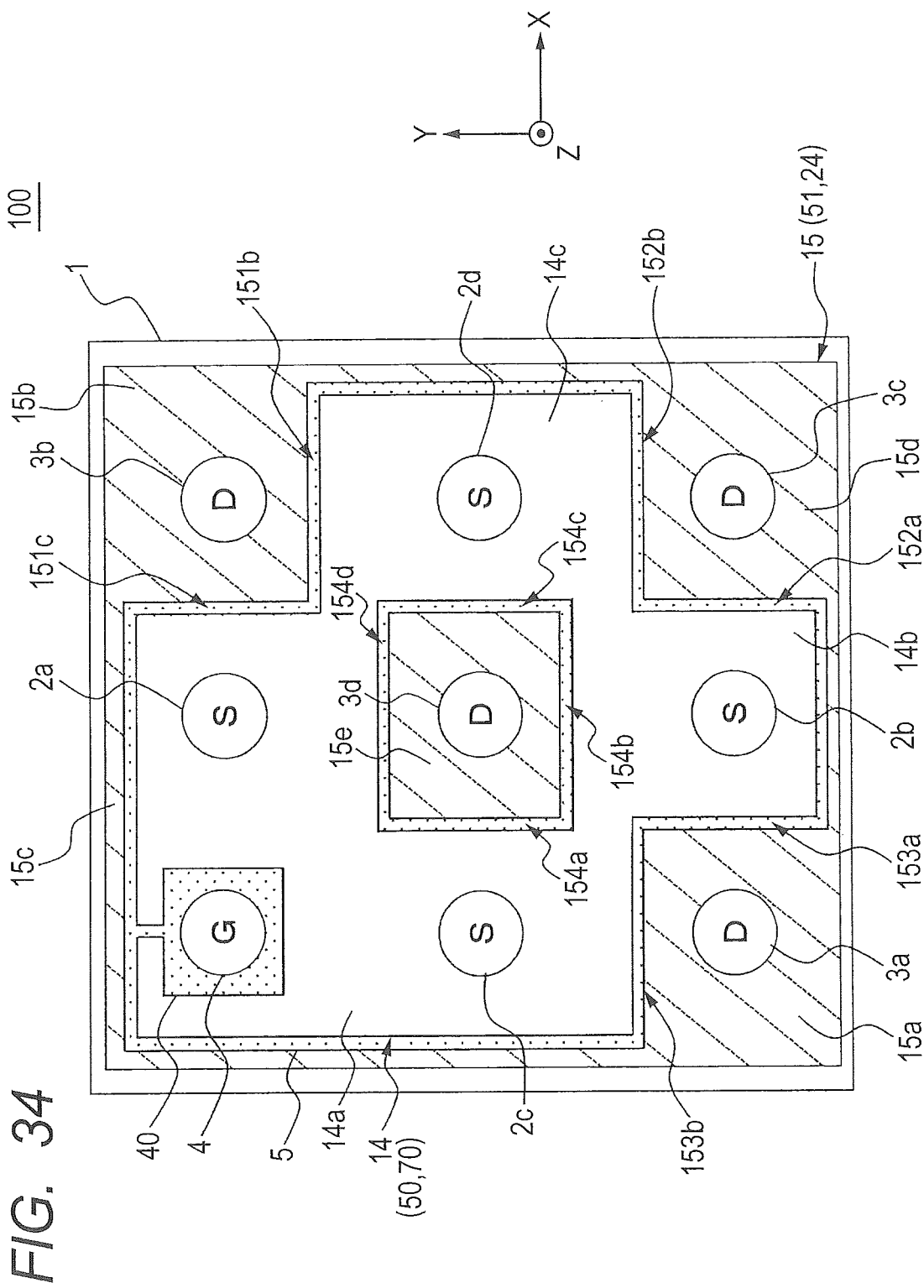
FIG. 34 is a plan view illustrating a planar configurational example of the semiconductor device according to the fifth embodiment.

FIG. 34 is a plan view illustrating other example of the semiconductor device 100 according to this embodiment. The semiconductor device 100 of FIG. 34 is an example having a pad layout of three rows×three columns and comprises four external source terminals 2a to 2d, four external drain terminals 3a to 3d, and one external gate terminal 4.

In FIG. 34, external source terminals are disposed around each of the external drain terminals, and the external drain terminal and the external source terminal are disposed alternately such that they are adjacent to each other in all of the rows and the columns.

That is, the external gate terminal 4, the external source terminal 2a, and the external drain terminal 3b are disposed in this order in the first row, the external source terminal 2c, the external drain terminal 3d, and the external source terminal 2d are disposed in this order in the second row, and the external drain terminal 3a, the external source terminal 2b, and the external drain terminal 3c are disposed in this order in the third row. The external source terminals 2c and 2d and the external drain terminal 3d are added to the example in FIG. 25.

In the example of FIG. 34, the source electrode 14 comprises an L-shaped source electrode portion 14a that extends while meandering from the periphery of the external source terminal 2a to the periphery of the external gate terminal 4, and the periphery of the external source terminal 2c, a rectangular source electrode portion 14b at the periphery of the external source terminal 2b, and a rectangular source electrode portion 14c at the periphery of the external source terminal 2d. The source electrode portions 14a to 14c are formed integrally and connected electrically.

Further, the drain electrode 15 comprises a substantially square drain electrode portion 15a at the periphery of the external drain terminal 3a, a substantially square drain electrode portion 15b at the periphery of the external drain terminal 3b, a substantially square drain electrode portion 15d at the periphery of the external drain terminal 3c, a substantially square drain electrode portion 15e at the periphery of the external drain terminal 3d, and an EQR electrode 15c.

The drain electrode portion 15a and the drain electrode portion 15d are isolated by way of the source electrode portion 14b, the drain electrode portion 15b and the drain electrode portion 15d are isolated by way of the source electrode portion 14c, and the drain electrode portion 15e is isolated from other drain electrode portions by way of the source electrode portions 14a to 14c.

The drain electrode portion 15e is surrounded at the entire periphery by the source electrode 14. The drain electrode portion 15a and the drain electrode portions 15b and 15d are formed integrally and connected electrically by way of the EQR electrode 15c. The drain electrode portion 15e is not connected to other drain electrode portions.

In FIG. 34, since the external source terminal is disposed adjacent to the external drain terminal in all of the rows and the columns, the back surface resistance can be decreased. Further, since the drain electrodes 15 and the source electrodes 14 are opposed each other along 10 sides (151b, 151c, 152a, 152b, 153a, 153b, 154a to 154d) which are more than those of the first embodiment, the boundary region between the source electrode and the drain electrode is widened and the back surface resistance can be decreased further. Particularly, since the drain electrode portion 15e is opposed to the source electrode 14 at four sides (154a to 154d), a large effect of decreasing the back surface resistance can be obtained.

Figure 35:
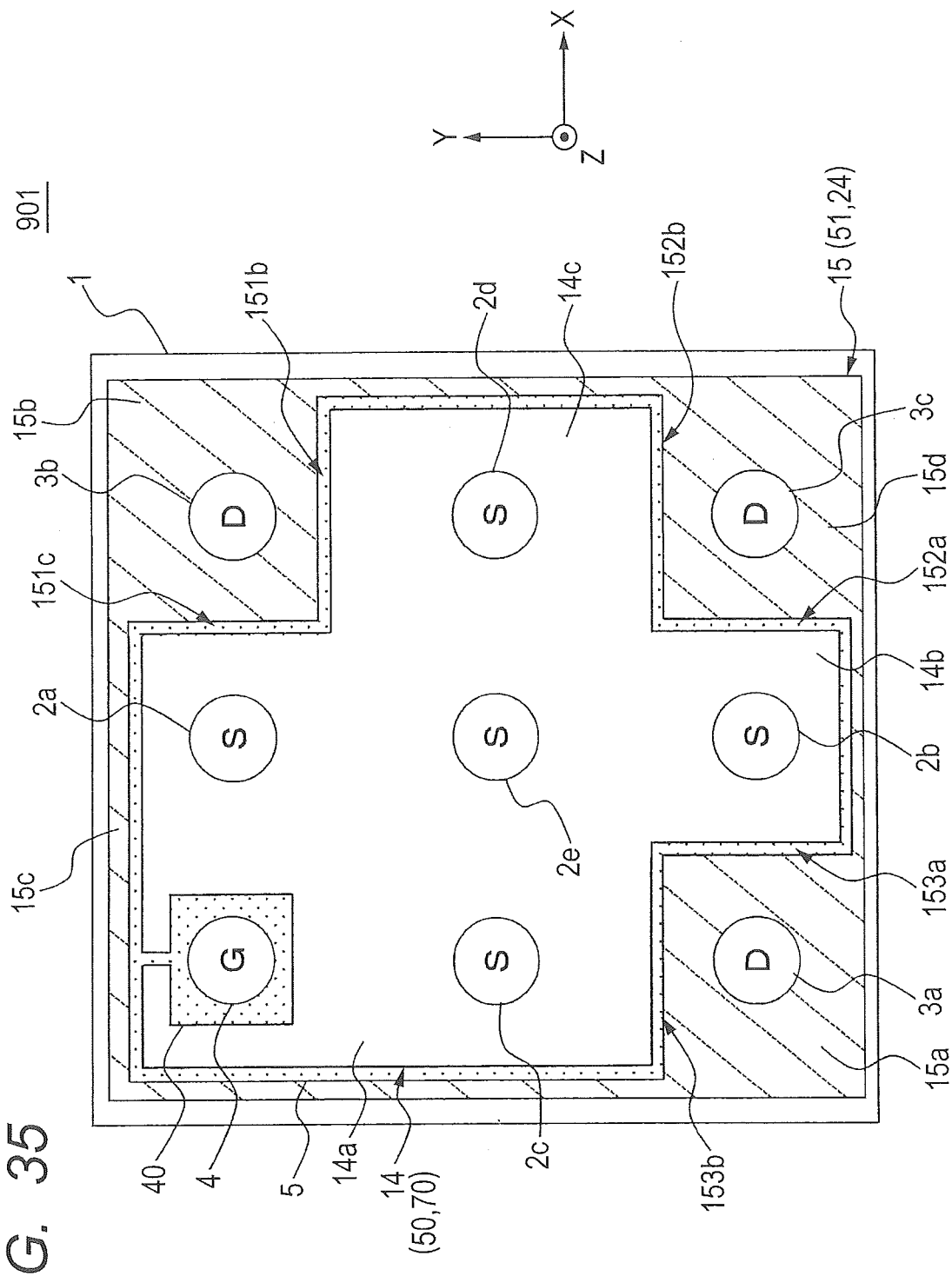
FIG. 35 is a plan view illustrating a planar configuration of a semiconductor device according to a second comparative example.

FIG. 35 is a plan view of a semiconductor device of the second comparative example. As illustrated in FIG. 35, a semiconductor device 901 of the second comparative example has a pad layout of three rows×three columns and comprises five external source terminals 2a to 2e, three external drain terminals 3a to 3c and one external gate terminal 4. The external gate terminal 4, the external source terminal 2a, and the external drain terminal 3b are disposed in this order in the first row, the external source terminal 2c, the external source terminal 2e, and the external source terminal 2d are disposed in this order in the second row, and the external drain terminal 3*a*, the external source terminal 2*b*, and the external drain terminal 3*c* are disposed in this order in the third row.

The source electrode 14 comprises a substantially square source electrode portion 14*a* including a portion from the periphery of the external gate terminal 4 to the periphery of the external source terminal 2*a*, the periphery of the external source terminal 2*c*, and the periphery of the external source terminal 2*e*, a rectangular source electrode portion 14*b* at the periphery of the external source terminal 2*b*, and a rectangular source electrode portion 14*c* along the periphery of the external source terminal 2*d*.

The drain electrode 15 comprises a substantially square drain electrode portion 15*a* at the periphery of the external drain terminal 3*a*, a substantially square drain electrode portion 15*b* at the periphery of the external drain terminal 3*b*, a substantially square drain electrode portion 15*d* at the periphery of the external drain terminal 3*c*, and a ring-shaped EQR electrode 15*c* at the outer peripheral end of the silicon substrate 1.

In the second comparative example of FIG. 35, since the drain electrode 15 below the external drain terminal 3 is opposed to the source electrode 14 only along two sides (151*b* and 151*c*, 152*a* and 152*b*, or 153*a* and 153*b*), the boundary between the source region and the drain region is small. On the contrary, in the embodiment of FIG. 33 and FIG. 34 of the invention, since the drain electrode 15 and the source electrode 14 are opposed along three sides to four sides as described above and the boundary between the source region and the drain region is increased, the on-resistance can be reduced further compared with the configuration of the second comparative example.

Figure 36:
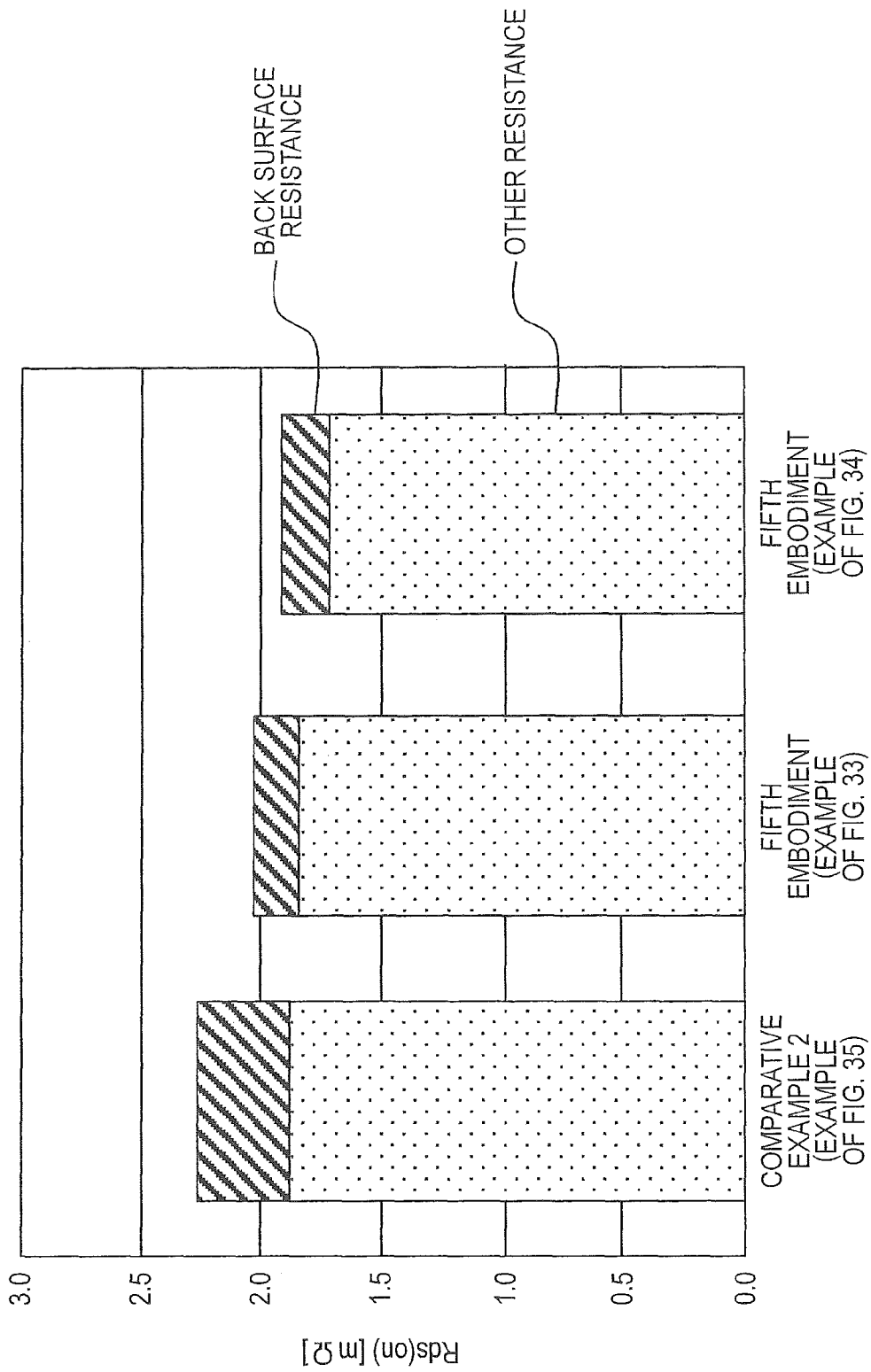
FIG. 36 is a graph illustrating the result of simulation on a semiconductor device according to the fifth embodiment.

FIG. 36 shows the result of simulation on the on-resistance in the semiconductor devices of the second comparative example and the embodiments of FIG. 33 and the FIG. 34 of the invention. In the second comparative example, as shown in FIG. 36, the back surface resistance is about 0.4 mΩ and the on-resistance including the back surface resistance is about 2.3 mΩ. In the embodiment of FIG. 33 and FIG. 34, the back surface resistance is about 0.2 mΩ and the on-resistance including the back surface resistance is about 1.9 to 2.1 mΩ. In this embodiment, the back surface resistance can be decreased by about 0.2 mΩ and the on-resistance can be reduced further compared with the configuration of the second comparative example.

As described above, in this embodiment, the pad layout of the 3-column arrangement is extended in the direction of the column to increase the number of pads and the boundary portion between the source region and the drain region is increased more. Thus, the back surface resistance can be decreased further and the on-resistance can be reduced.

Sixth Embodiment

This embodiment is to be described with reference to the drawings. This embodiment is an example of a semiconductor device having a pad layout of two rows×five columns.

Figure 37:
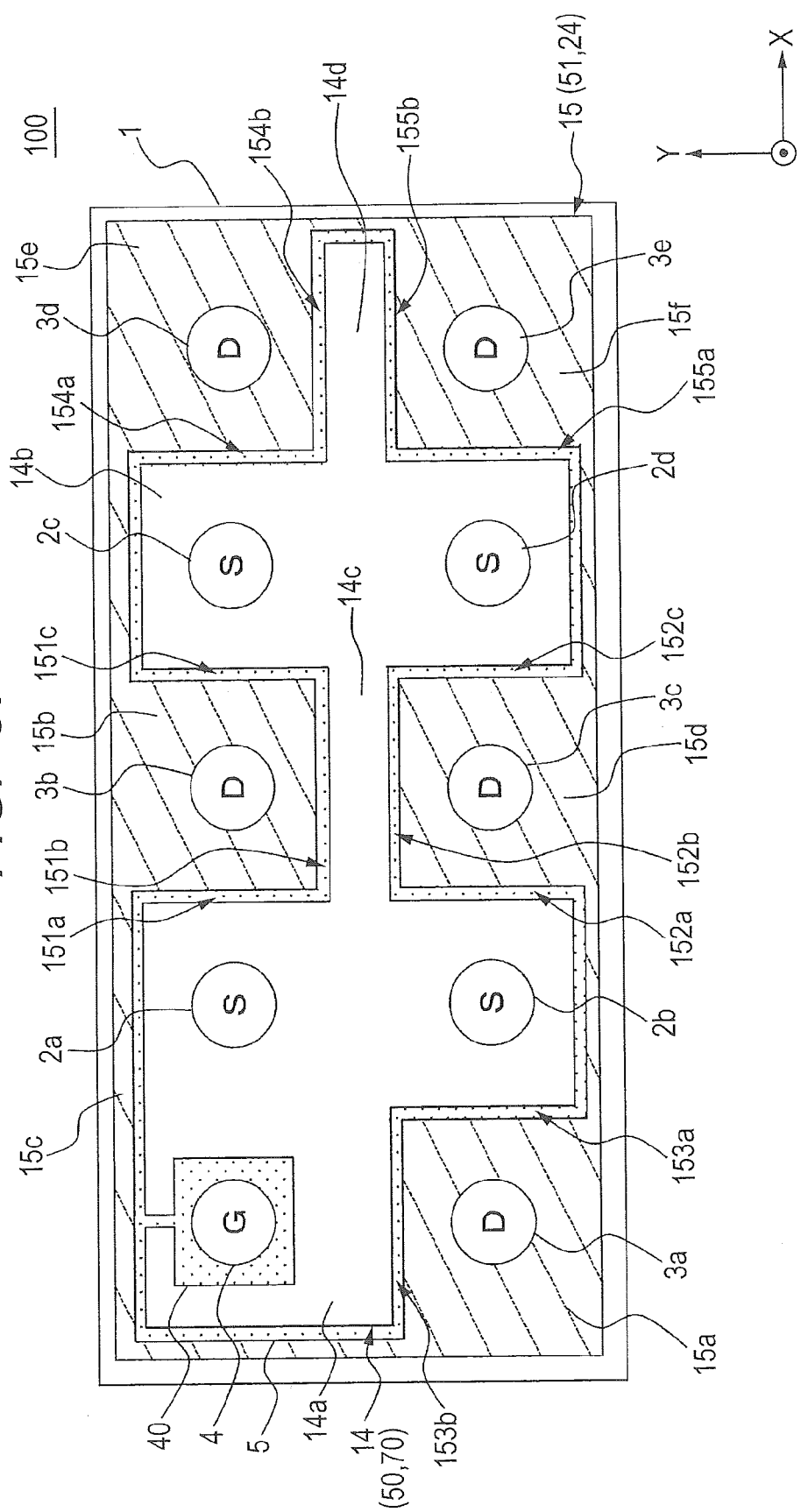
FIG. 37 is a plan view illustrating a planar configurational example of a semiconductor device according to a sixth embodiment.

FIG. 37 is a plan view illustrating an example of the semiconductor device 100 according to this embodiment. The semiconductor device 100 in FIG. 37 is an example having a pad layout of two rows×five columns and comprises four external source terminals 2*a* to 2*d*, five external drain terminals 3*a* to 3*e*, and one external gate terminal 4.

In FIG. 37, a column for external source terminals and a column for external drain terminals are disposed alternately such that the external source terminal and the external drain terminal are adjacent each other, respectively. That is, the external gate terminal 4, the external source terminal 2*a*, the external drain terminal 3*b*, the external source terminal 2*c*, and the external drain terminal 3*d* are disposed in this order in the first row, and the external drain terminal 3*a*, the external source terminal 2*b*, the external drain terminal 3*c*, the external source terminal 2*d*, and the external drain terminal 3*e* are disposed in this order in the second row. The external drain terminals 3*d* and 3*e* are added to the example of FIG. 28.

In the example of FIG. 37, a source electrode 14 comprises an L-shaped source electrode portion 14*a* that extends while meandering from the periphery of the external gate terminal 4 to the periphery of the external source terminal 2*a* and the periphery of the external source terminal 2*b*, a rectangular source electrode portion 14*b* that extends from the periphery of the external source terminal 2*c* to the periphery of the external source terminal 2*d*, a rectangular source electrode portion 14*c* between the external drain terminal 3*b* and the external drain terminal 3*c*, and a rectangular source electrode portion 14*d* between the external drain terminal 3*d* and the external drain terminal 3*e*. The source electrode portions 14*a* to 14*d* are formed integrally and connected electrically.

Further, the drain electrode 15 comprises a substantially square drain electrode portion 15*a* at the periphery of the external drain terminal 3*a*, a substantially square drain electrode portion 15*b* at the periphery of the external drain terminal 3*b*, a substantially square drain electrode portion 15*d* at the periphery of the external drain terminal 3*c*, a substantially square drain electrode portion 15*e* at the periphery of the external drain terminal 3*d*, a substantially square drain electrode portion 15*f* at the periphery of the external drain terminal 3*e*, and an EQR electrode 15*c*.

The drain electrode portion 15*a* and the drain electrode portions 15*b* and 15*d* are isolated by way of the source electrode portion 14*a*, the drain electrode portions 15*b* and 15*d* and the drain electrode portions 15*e* and 15*f* are isolated by way of the source electrode portion 14*b*, the drain electrode portion 15*b* and the drain electrode portion 15*d* are isolated by way of the source electrode portion 14*c*, and the drain electrode portion 15*e* and the drain electrode portion 15*f* are isolated by way of the source electrode portion 14*d*. The drain electrode portions 15*a*, 15*b*, 15*d*, 15*e*, and 15*f* are formed integrally and connected electrically by way of the EQR electrode 15*c*.

In FIG. 37, since the external source terminal is disposed adjacent to the external drain terminal, the surface resistance can be decreased in the same manner as in the first or third embodiment. Further, in the same manner as in the first or third embodiment, each of the drain electrode portions 15*b* and 15*c* is opposed to the source electrode 14 at least along three sides (151*a* to 151*c*, 152*a* to 152*c*).

Further, the drain electrodes 15 and the source electrodes 14 are opposed each other along 12 sides (151*a* to 151*c*, 152*a* to 152*c*, 153*a*, 153*b*, 154*a*, 154*b*, 155*a*, and 155*b*) which are more than those of the first or third embodiment. Accordingly, the boundary region between the source electrode and the drain electrode is widened and the back surface resistance can further be decreased.

Figure 38:
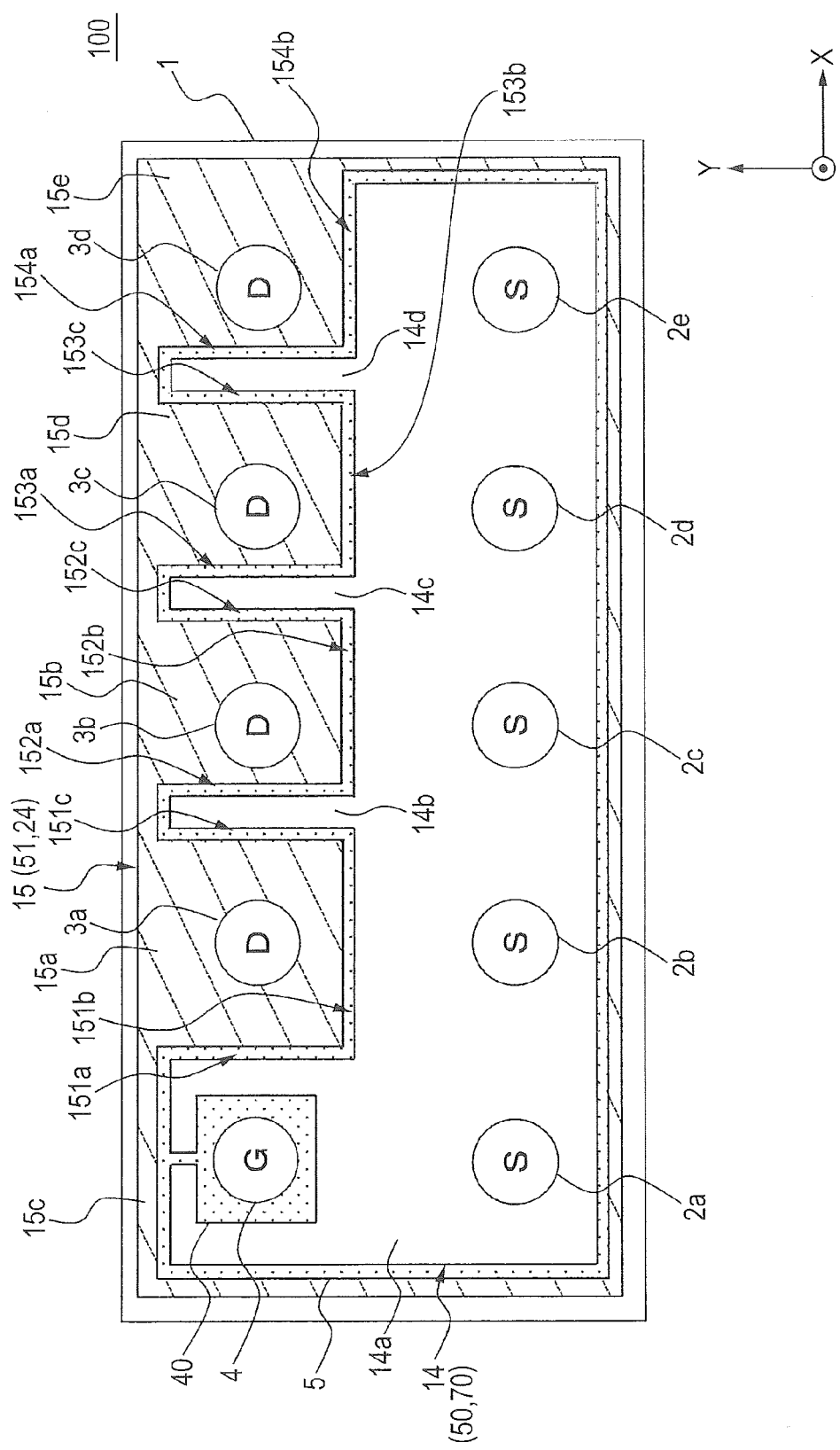
FIG. 38 is a plan view illustrating a planar configurational example of the semiconductor device according to the sixth embodiment.

FIG. 38 is a plan view illustrating other example of the semiconductor device 100 according to this embodiment. The semiconductor device 100 of FIG. 38 is an example having a pad layout of two rows×five columns and comprises five external source terminals 2*a* to 2*e*, four external drain terminals 3*a* to 3*d*, and one external gate terminal 4.

In FIG. 38, the external source terminals 2a to 2e are disposed collectively on one end over the surface of the silicon substrate 1 and the external drain terminals 3a to 3d are disposed collectively on the other side over the surface of the silicon substrate 1. That is, the external gate terminal 4, the external drain terminal 3a, the external drain terminal 3b, the external drain terminal 3c, and the external drain terminal 3d are disposed in this order in the first row, and the external source terminal 2a, the external source terminal 2b, the external source terminal 2c, the external source terminal 2d, and the external source terminal 2e are disposed in this order in the second row. The external drain terminal 3d and the external source terminal 2e are added to the example of FIG. 32.

In the example of FIG. 38, the drain electrode 14 comprises an L-shape source electrode portion 14a that extends while meandering from the periphery of the external gate terminal 4, to the periphery of the external source terminal 2a, the periphery of the external source terminal 2b, the periphery of the external source terminal 2c, the periphery of the external source terminal 2d, and the periphery of the external source terminal 2e, a rectangular source electrode portion 14b between the external drain terminal 3a and the external drain terminal 3b, a rectangular source electrode portion 14c between the external drain terminal 3b and the external drain terminal 3c, and a rectangular source electrode portion 14d between the external drain terminal 3c and the external drain terminal 3d. The source electrode portions 14a to 14d are formed integrally and connected electrically.

Further, the drain electrode 15 comprises a substantially square drain electrode portion 15a at the periphery of the external drain terminal 3a, a substantially square drain electrode portion 15b at the periphery of the external drain terminal 3b, a substantially square drain electrode portion 15d at the periphery of the external drain terminal 3c, a substantially square drain electrode portion 15e at the periphery of the external drain terminal 3d, and an EQR electrode 15c.

The drain electrode portion 15a and the drain electrode portion 15b are isolated by way of the source electrode portion 14b, the drain electrode portion 15b and the drain electrode portion 15d are isolated by way of the source electrode portion 14c, and the drain electrode portion 15d and the drain electrode portion 15e are isolated by way of the source electrode portion 14d. The drain electrode portion 15a and the drain electrode portions 15a, 15d, and 15e are formed integrally and connected electrically by way of the EQR electrode 15c.

In the example of FIG. 38, since the external source terminals and the external drain terminals are disposed collectively, they provide a less effect of reducing the on-resistance compared with the configuration of FIG. 37. However, in FIG. 38, each of the drain electrode portions 15a, 15b, and 15d is opposed to the source electrode 14 at least along three sides (151a to 151c, 152a to 152c, 153a to 153c) in the same manner as in the first or second embodiment. Further, the drain electrode 15 and the source electrode 14 are opposed along 11 sides (151a to 151c, 152a to 152c, 153a to 153c, 154a, and 154b) which are more than those of the first or third embodiment. Accordingly, the boundary region between the source electrode and the drain electrode is widened and the back surface resistance can be decreased further. Further the area ratio between the source region and the drain region is 5:4 and the on-resistance can be reduced further the configuration of compared with FIG. 37.

Figure 39:
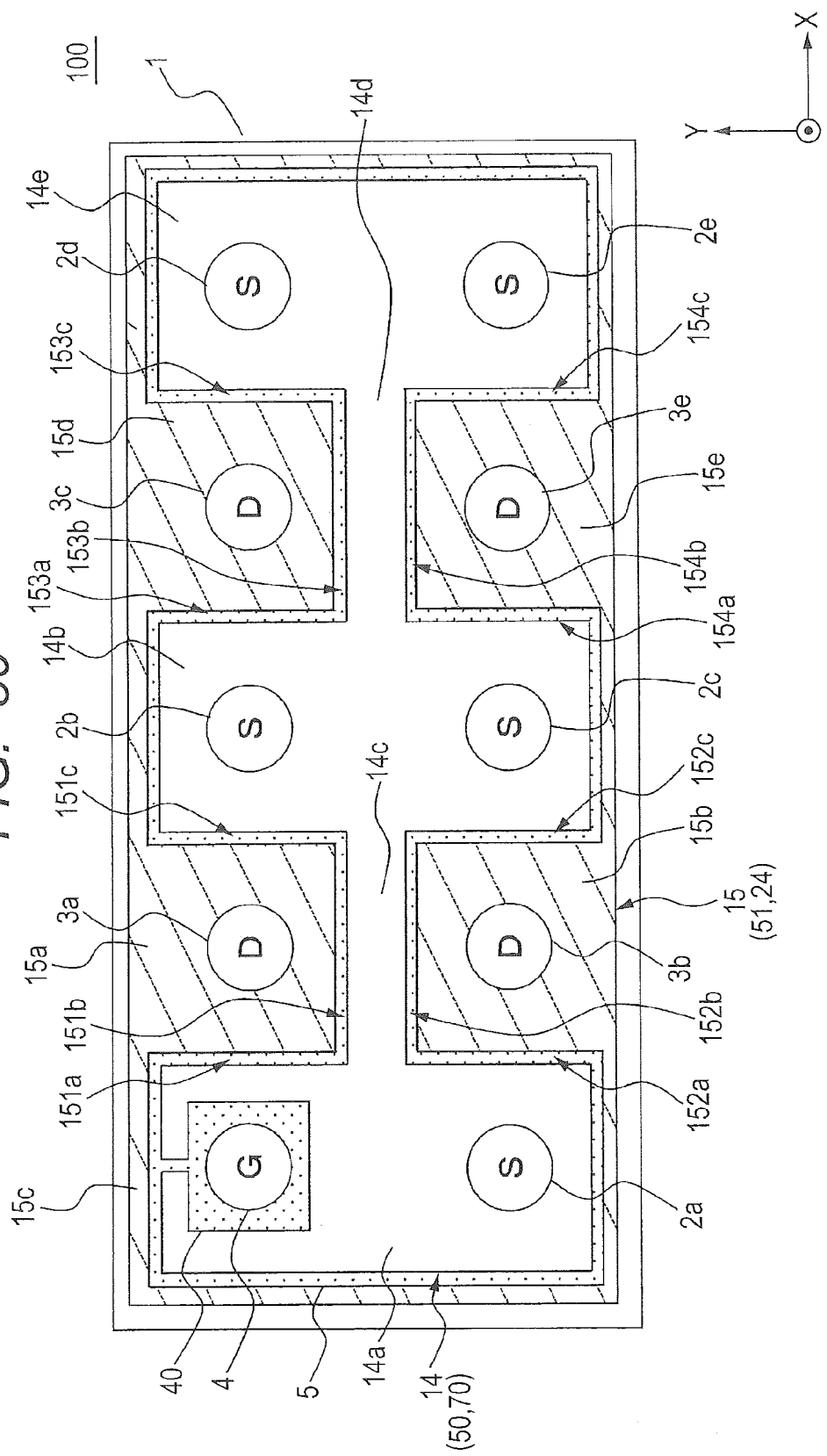
FIG. 39 is a plan view illustrating a planar configurational example of the semiconductor device according to the sixth embodiment.

FIG. 39 is a plan view illustrating other example of the semiconductor device 100 according to this embodiment. The semiconductor device 100 of FIG. 39 is an example having a 2 row×5 column pad layout and comprises five external source terminals 2a to 2e, four external drain terminal 3a to 3d, and one external gate terminal 4.

In FIG. 39, a column of the external source terminals and a column of the external drain terminals are disposed alternately such that the drain terminal and the source terminal are adjacent each other. That is, the external gate terminal 4, the external drain terminal 3a, the external source terminal 2b, the external drain terminal 3c, and the external source terminal 2d are disposed in this order in the first row, and the external source terminal 2a, an external drain terminal 3b, the external source terminal 2c, the external drain terminal 3d, and the external source terminal 2e are disposed in this order in the second row. The external source terminals 2d and 2e are added to the example of FIG. 26.

In the example of FIG. 39, the source electrode 14 comprises a rectangular source electrode portion 14a that extends from the periphery of the external gate terminal 4 to the periphery of the external source terminal 2a, a rectangular source electrode portion 14b that extends from the periphery of the external source terminal 2b to the periphery of the external source terminal 2c, a rectangular source electrode portion 14c between the external drain terminal 3a and the external drain terminal 3b, a rectangular source electrode portion 14d between the external drain terminal 3c and the external drain terminal 3d, and a rectangular source electrode portion 14e that extends from the periphery of the external source terminal 2d to the periphery of the external source terminal 2e. The source electrode portions 14a to 14e are formed integrally and connected electrically.

Further, the drain electrode 15 comprises a substantially square drain electrode portion 15a at the periphery of the external drain terminal 3a, a substantially square drain electrode portion 15b at the periphery of the external drain terminal 3b, a substantially square drain electrode portion 15d at the periphery of the external drain terminal 3c, a substantially square drain terminal electrode portion 15e at the periphery of the external drain terminal 3d, and an EQR electrode 15c. The drain electrode portion 15a and the drain electrode portion 15b are isolated by way of the source electrode portion 14c, and the drain electrode portion 15d and the drain electrode portion 15e are isolated by way of the source electrode portion 14d. The drain electrode portions 15a, 15b, 15d, and 15e are formed integrally and connected electrically by way of the EQR electrode 15.

In FIG. 39, since the external source terminal is disposed adjacent to the external drain terminal in the same manner as in the first or third embodiment, the back surface resistance can be decreased. Further, in the same manner as in the first or third embodiment, the drain electrode portions 15a, 15b, 15d, and 15e are opposed to the source electrode 14 at least along three sides (151a to 151c, 152a to 152c, 153a to 152c, and 154a to 154c). Particularly, the drain electrode 15 and the source electrode 14 are opposed to each other along 12 sides (151a to 151c, 152a to 152c, 153a to 153c, and 154a to 154c) which are more than those of the first or third embodiment. Accordingly, the boundary between the source electrode and the drain electrode is widened and the back surface resistance can be decreased further. Further, the area ratio between the source region and the drain region is 5:4 and the on-resistance can be reduced further compared with the configuration of FIG. 37.

The invention made by the present inventors has been described specifically based on the preferred embodiments but it is apparent that the present invention is not restricted to the embodiments described above and can be modified variously within a range not departing the gist thereof.

For example, in the embodiments described above, the source (external source terminal, source electrode, active cell region or source cell region) and the drain (external drain terminal, drain electrode, drain contact region, or drain lead-out region) have been described. They may be reversed respectively for relation of the source and the drain. Further, the gate (external gate terminal, gate pad, or gate interconnect) may be formed at any position or the gate may be formed in plurality.

Further, in the semiconductor device according to the embodiments described above, the conduction type (p-type or n-type) may be reversed for the semiconductor substrate, the semiconductor layer, and the diffusion layer (diffusion region). For example, when one of the conduction type of the n-type and the p-type is defined as a first conduction type and the other conduction type is defined as a second conduction type, the first conduction type may be the p type and the second conduction type may be the n type and, on the contrary, the first conduction type may be the n type and the second conduction type may be the p type.

What is claimed is:

1. A semiconductor device comprising:
   an active cell region formed over a surface of a semiconductor substrate and including a vertical transistor;
   an external gate terminal formed over the surface of the semiconductor substrate and electrical connected to a gate of the vertical transistor;
   a drain electrode formed over the surface of the semiconductor substrate and leading out a drain of the vertical transistor from a back surface of the semiconductor substrate;
   a plurality of external drain terminals formed over the drain electrode and electrically connected to the drain electrode;
   a source electrode formed over the active cell region so as to be opposed to the drain electrode at least along three side at a periphery of the external drain terminal and connected to a source of the vertical transistor; and
   a plurality of external source terminals formed over the source electrode and electrically connected to the source electrode,
   wherein the external drain terminals, the external source terminals and the external gate terminal are disposed at least in a pad layout of two rows×three columns.

2. The semiconductor device according to claim 1, further comprising:
   a drain contact region formed over the surface of the semiconductor substrate and connected to the drain of the vertical transistor,
   wherein one of the external drain terminals is formed over the drain contact region.

3. The semiconductor device according to claim 2, wherein the active cell region and the drain contact region are opposed to each other at least along the three sides.

4. The semiconductor device according to claim 2, wherein the active cell region has an area larger than that of the drain contact region.

5. The semiconductor device according to claim 4, wherein an area ratio between the active cell region and the drain contact region is about 3:2.

6. The semiconductor device according to claim 1, wherein the source electrode has an area larger than the drain electrode.

7. The semiconductor device according to claim 6, wherein an area ratio between the source electrode and the drain electrode is about 3:2.

8. The semiconductor device according to claim 1, wherein the external drain terminals and the external source terminals are arranged adjacent to each other.

9. The semiconductor device according to claim 8, wherein one of the external drain terminals is disposed between a couple of the external source terminals.

10. The semiconductor device according to claim 1, wherein a column including one of the external drain terminals and a column including one of the external source terminals are arranged alternately.

11. The semiconductor device according to claim 1, wherein the drain electrode in which a plurality of the external drain terminals are formed is separated by the source electrode at the periphery of the external drain terminal.

12. The semiconductor device according to claim 1, wherein the external gate terminal, the external drain terminal, and the external source terminal are arranged in this order in a first row over the surface of the semiconductor substrate, and
   wherein the external source terminal, the external drain terminal, and the external source terminal are arranged in this order in a second row over the surface of the semiconductor substrate.

13. The semiconductor device according to claim 1, further comprising:
   a gate interconnect which is formed at least along the three sides in a region between the drain electrode and the source electrode and connected to the gate of the vertical transistor.

14. The semiconductor device according to claim 1, further comprising:
   an equi-potential ring electrode which is formed so as to surround an outer periphery of the semiconductor substrate and connected to the drain electrode.

15. A semiconductor device comprising:
   an active cell region formed over a surface of a semiconductor substrate and including a vertical transistor;
   an external gate terminal formed over the surface of the semiconductor substrate and electrically connected to a gate of the vertical transistor;
   a drain electrode formed over the surface of the semiconductor substrate and leading out a drain of the vertical transistor from a back surface of the semiconductor substrate;
   a plurality of external drain terminals formed over the drain electrode and electrically connected to the drain electrode;
   a source electrode formed over the active cell region so as to be opposed to the drain electrode at least along three sides at a periphery of the external drain terminal and connected to a source of the vertical transistor;
   a plurality of external source terminals formed over the source electrode and electrically connected to the source electrode; and
   an equi-potential ring electrode which is formed so as to surround an outer periphery of the semiconductor substrate and connected to the drain electrode.

* * * * *